(12) United States Patent
Mori et al.

(10) Patent No.: US 6,316,738 B1
(45) Date of Patent: Nov. 13, 2001

(54) PRINTED WIRING BOARD AND MANUFACTURING METHOD THEREOF

(75) Inventors: Yoji Mori; Yoichiro Kawamura, both of Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 08/894,342

(22) PCT Filed: Dec. 19, 1996

(86) PCT No.: PCT/JP96/03718

§ 371 Date: Aug. 26, 1997

§ 102(e) Date: Aug. 26, 1997

(87) PCT Pub. No.: WO97/25839

PCT Pub. Date: Jul. 17, 1997

(30) Foreign Application Priority Data

Jan. 11, 1996 (JP) .......................................... 8-21965
Jan. 30, 1996 (JP) .......................................... 8-37155
Mar. 4, 1996 (JP) .......................................... 8-75297

(51) Int. Cl.$^7$ .................................................... H01R 9/09
(52) U.S. Cl. ............................ 174/261; 174/255; 361/777; 361/808
(58) Field of Search .................................. 174/255, 258, 174/260, 261, 262, 266; 361/748, 767, 777, 808

(56) References Cited

U.S. PATENT DOCUMENTS

| 4,361,634 | * | 11/1982 | Miller .............................. 430/5 |
| 4,954,878 | * | 9/1990 | Fox et al. ......................... 257/675 |
| 5,110,654 | | 5/1992 | Yokokawa . |
| 5,539,156 | * | 7/1996 | Chobot et al. ..................... 174/266 |
| 5,557,502 | * | 9/1996 | Banerjee et al. ................... 361/712 |
| 5,590,030 | * | 12/1996 | Kametani et al. ............... 174/255 X |
| 5,666,722 | * | 9/1997 | Tamm et al. ......................... 29/847 |

FOREIGN PATENT DOCUMENTS

| 0 457 583 | 11/1991 | (EP) . |
| 0 605 399 | 7/1994 | (EP) . |
| 2 468 279 | 4/1981 | (FR) . |
| 64 000 795 | 1/1989 | (JP) . |
| 01 037 073 | 2/1989 | (JP) . |
| 03 142 896 | 6/1991 | (JP) . |
| 04 192 495 | 7/1992 | (JP) . |
| 4-55555 | 9/1992 | (JP) . |
| 5-18476 | 3/1993 | (JP) . |
| 6-224477 | * | 8/1994 | (JP) . |
| 06 302 964 | 10/1994 | (JP) . |
| 7-34505 | 4/1995 | (JP) . |
| 07 202 433 | 8/1995 | (JP) . |

OTHER PUBLICATIONS

Haddad, Multilayer Laminated Circuit Construction, IBM Technical Disclosure Bulletin, vol. 7, No. 2 pp 154–155, Jul. 1964.*

"Formation of Surface Laminar Circuit on Printed Circuit Board with Plated through Holes" IBM Technical Disclosure Bulletin, vol. 36, No. 10, Oct. 1993 (1993–10), p. 511 XP000412466, IBM Corp., New York, US.

\* cited by examiner

Primary Examiner—Albert W. Paladini
(74) Attorney, Agent, or Firm—Oliff & Berridge, PLC

(57) ABSTRACT

A printed wiring board in which an opening existing around a pad which is a photovia land is arranged so that it is not overlapped with the pad, the area of an opening existing around a pad and that of another opening are equalized, the quantity of resin which is filled in each opening or is equalized throughout a printed wiring board and the quantity of resin overflowing from each opening or when resin is filled in each opening or is uniformed is provided. According to such a printed wiring board, a reliable printed wiring board wherein secure connection is enabled without causing disconnection can be realized when a circuit pattern provided on an interlayer insulating board formed on the printed wiring board and a conductor pad are connected by arranging an opening existing around a conductor pad so that it is not overlapped with the conductor pad and substantially equalizing the quantity of resin which is filled in an opening around a conductor pad and that of resin which is filled in another opening.

24 Claims, 23 Drawing Sheets

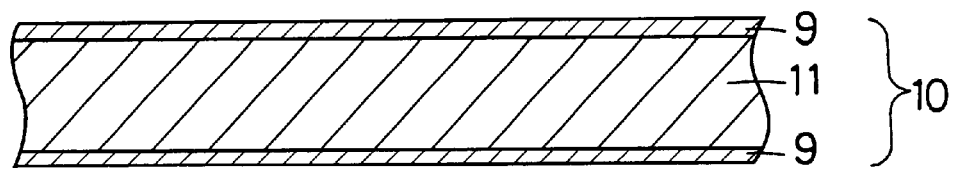
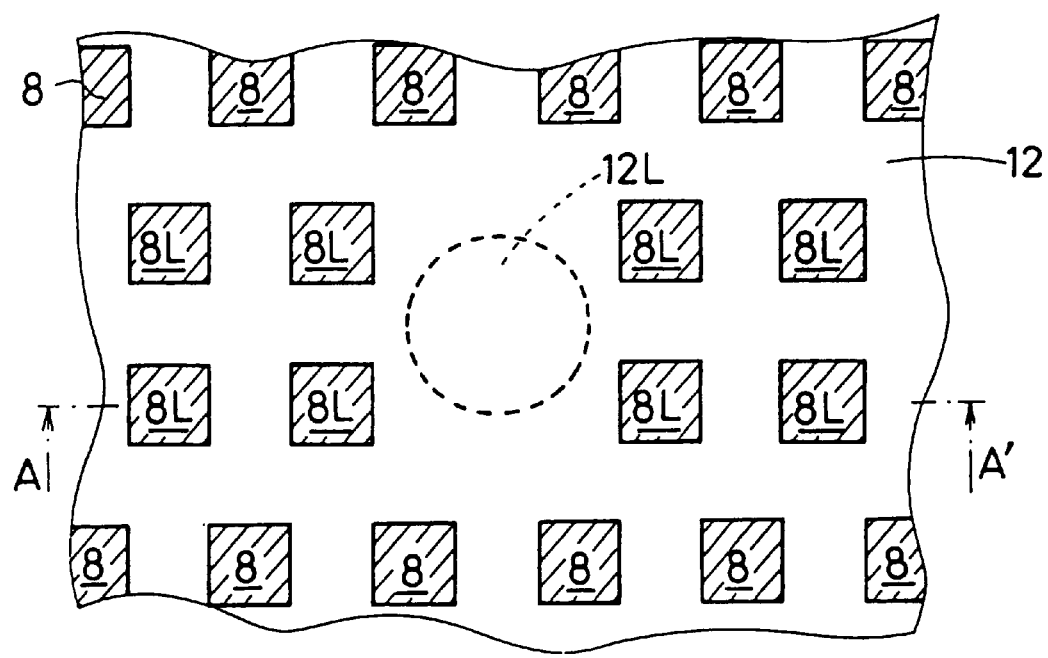

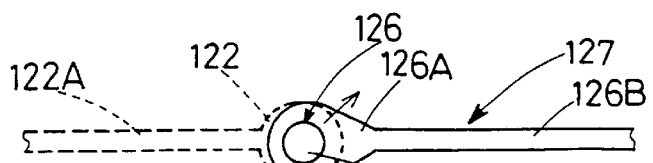
FIG. 26 (A)
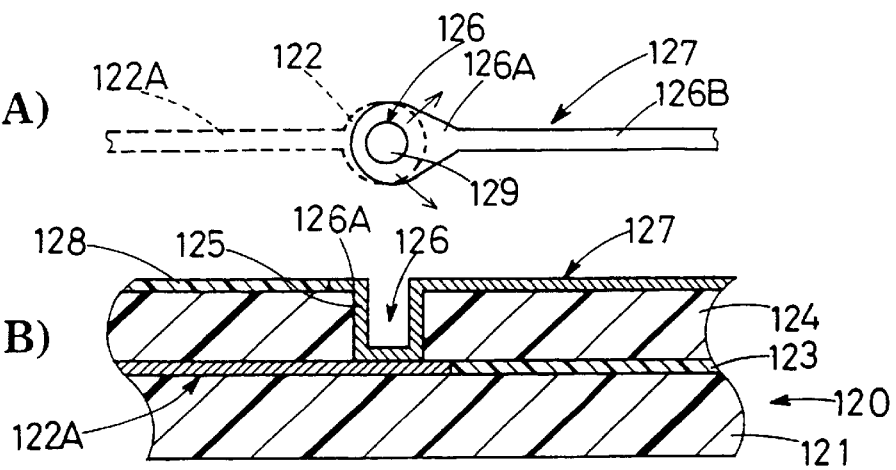
FIG. 26 (B)
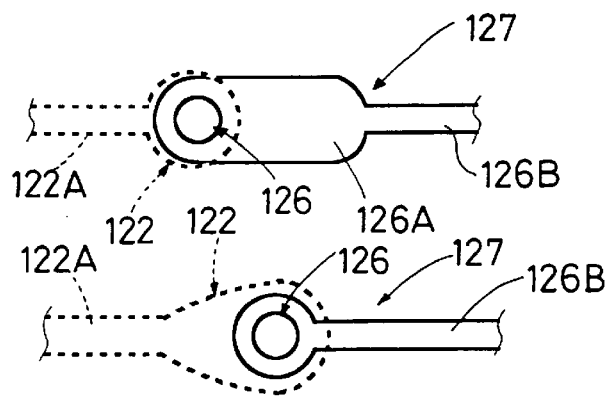
FIG. 26 (C)
FIG. 26 (D)
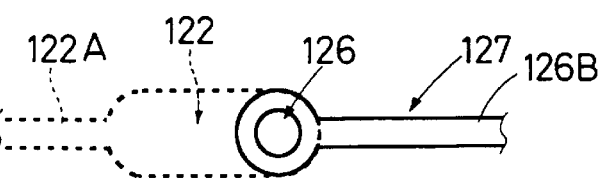
FIG. 26 (E)

FIG. 39 (A)     PRIOR ART
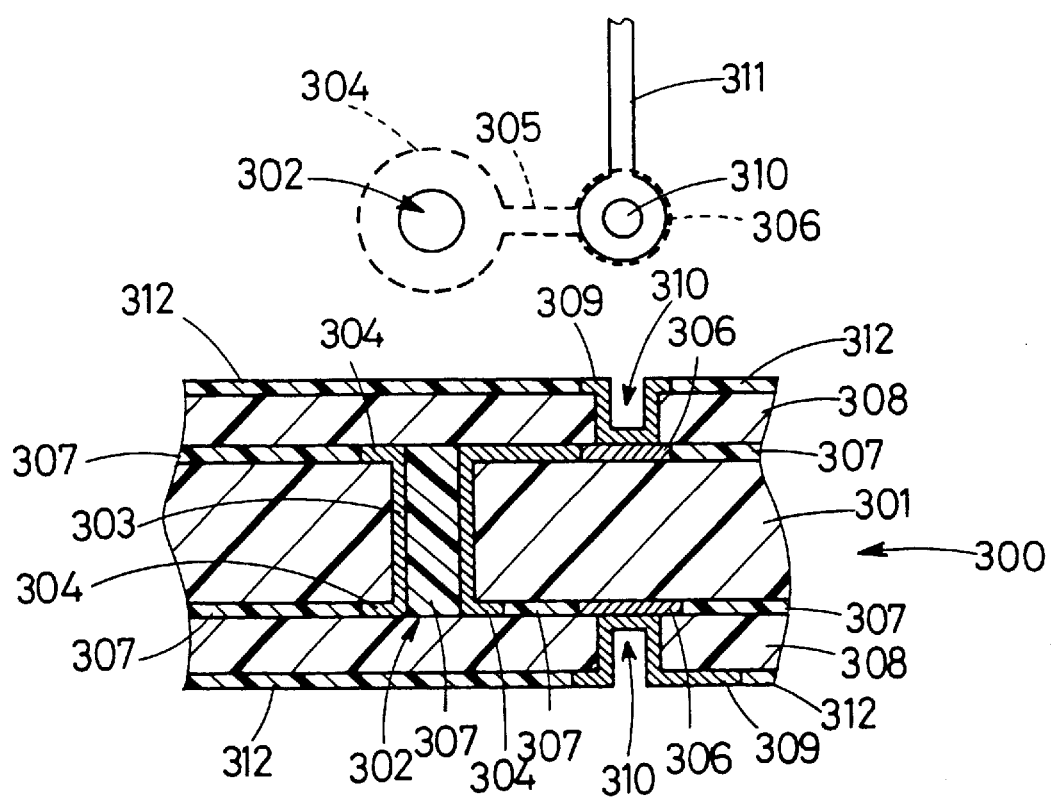
FIG. 39 (B)     PRIOR ART

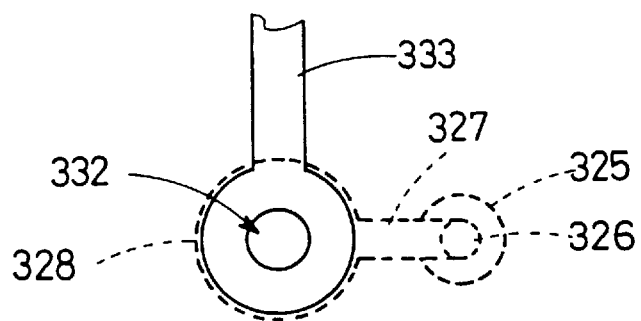
FIG. 40 (A) PRIOR ART
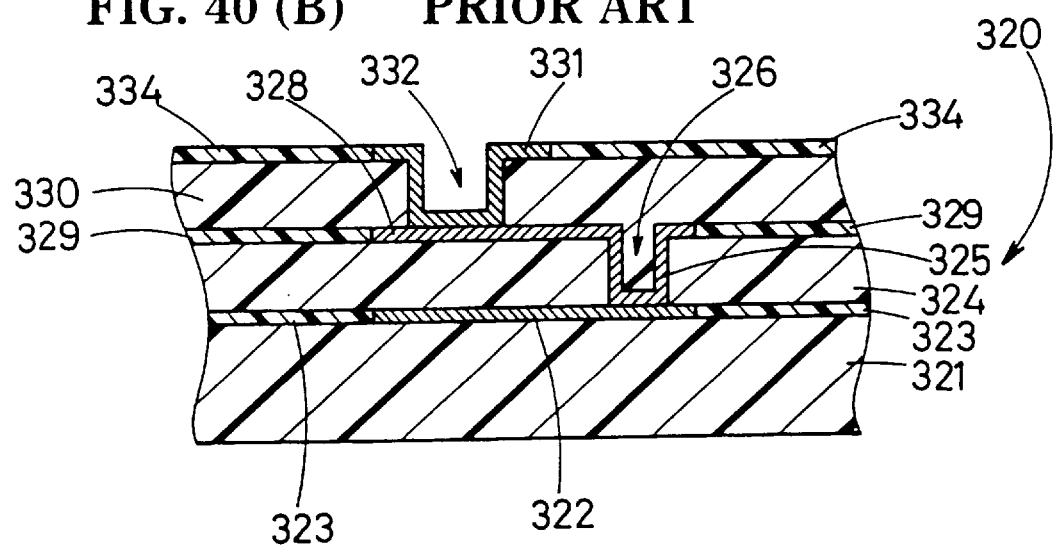
FIG. 40 (B) PRIOR ART

PRINTED WIRING BOARD AND MANUFACTURING METHOD THEREOF

BACKGROUND OF THE INVENTION

1. Field of the Invention

The present invention relates to a printed wiring board wherein a conductor pad with larger area than the area of an opening such as a photovia land and a through hole land is provided between plural openings where no conductor exists in a conductive pattern which is formed in a mesh on a single side or double sides of a base material and each opening is filled with a filling resin layer, particularly relates to a reliable printed wiring board wherein a circuit pattern provided on the upper face of an interlayer insulating layer formed on the printed wiring board and a conductor pad can be securely connected without causing disconnection by substantially equalizing the quantity of resin with which each opening is filled throughout the printed wiring board.

The present invention also relates to a printed wiring board wherein a via hole opposite to a conductor pad or a land is provided by forming a photosensitive interlayer insulating layer on a base material on which a predetermined circuit pattern including a metallic area with large area such as a power plane and a ground plane is formed and developing the interlayer insulating layer after it is exposed via a mask film, particularly relates to a printed wiring board wherein light dispersed by a metallic area which is a power plane or a ground plane is prevented from being incident to an interlayer insulating layer which exists under the mask area of a mask film when a via hole is formed opposite to a conductor pad or a land by exposing the interlayer insulating layer via a mask film, as a result, the metallic area is securely exposed and simultaneously, a via hole can be formed and a manufacturing method thereof.

Further, the present invention relates to a multilayer printed wiring board wherein a connection pad formed on a core material and a pattern on an interlayer insulating layer provided on the core material are connected via a via hole and a connection pad formed on an interlayer insulating layer and a pattern on another interlayer insulating layer are connected via a via hole, particularly relates to a reliable multilayer printed wiring board wherein when a photosensitive interlayer insulating layer is exposed with a mask film stuck on it and developed by devising the shape of a connection pad formed on a core material or on an interlayer insulating layer so as to form a via hole, the via hole and the connection pad can be stably connected even if misregistration occurs between the connection pad and the mask film.

2. Description of Related Art (1) Heretofore, for a multilayer printed wiring board for example, a copper-clad laminate 200 on which a copper layer 202 is clad on a single side (or double sides) of an electrical insulating core material 201 is used for a base material as shown in FIG. 28. A conductor circuit is formed in such a copper-clad laminate 200 by laminating a photosensitive dry film where the pattern of the conductor circuit is printed on the surface of the copper layer 202 and performing etching processing after exposure and development and FIG. 29 shows such a copper-clad laminate 200 where the conductor circuit 203 is formed from the copper layer 202.

When the conductor circuit 203 is formed in the copper-clad laminate 200, an exposed area (an opening) 204 in which the core material 201 is exposed between the conductor circuits 203 is simultaneously formed as shown in FIG. 29. A resin layer 205 is formed in such an exposed area 204 as shown in FIG. 30 by applying and hardening electrical insulating filling resin and after the filled resin layer 205 is hardened, the respective surfaces of the conductor circuit 203 and the filled resin layer 205 are smoothed by polishing so as to prevent the failure of exposure and development of a conductor circuit 207 shown in FIG. 33 formed on the conductor circuit 203.

However, as shown in FIG. 31, when area required by a pad 203L to which the upper conductor circuit 207 shown in FIG. 33 is connected cannot be secured by the conductor circuit 203 in a mesh if a pattern formed by the conductor circuits 203 formed in the copper-clad laminate 200 is in a mesh (often in the case of a power pattern and a ground pattern), the area of the opening of the exposed area 204L around the pad 203L is reduced so as to secure the above area required by the pad 203L and therefore, the area of the opening of the exposed area 204L around the pad 203L is smaller than that of another exposed area 204.

As a result, the quantity of resin which can fill the exposed area 204L around the pad 203L is smaller than that of resin which can fill another exposed area 204 and when the exposed areas 204 and 204L are filled with resin, the quantity of filled resin overflowing from the exposed area 204L around the pad 203L is more than that overflowing from another exposed area 204 and even if the respective surfaces of the conductor circuit 203 and the filled resin layer 205 are polished so that they are smooth after the filled resin is hardened to be the filled resin layer 205, the filled resin 205L is left on the pad 203L as shown in FIG. 32 which is a sectional view viewed along a line B—B' in FIG. 31.

As shown in FIG. 33, an electrical insulating adhesion layer 206 is laminated on the conductor circuit 203 in a state in which the filled resin 205L is left on the pad 203L and when the conductor circuit 207 formed on the conductor circuit 203 is connected to the pad 203L which is a part of the conductor circuit 203 via a via hole P formed in the adhesion layer 206, there is a problem that the failure of conduction is caused between the conductor circuit 203 and the conductor circuit 207 because the electrical insulating filled resin 205L exists between the pad 203L and the conductor circuit 207.

The mesh pattern formed by the conductor circuits 203 may be formed on an adhesive layer for electroless plating which also functions as the interlayer insulating material of a built-up type multilayer printed wiring board. In this case, in the mesh pattern the area of the opening of the exposed area 204L around the pad 203L is reduced. A plating resist is provided to this opening 204L, the reduction of the area causes the reduction of contact area with the adhesive layer for electroless plating and also causes the peeling of the plating resist and the interlayer insulating material formed on it.

(2) Heretofore, for a printed wiring board provided with a via hole, a variety of printed wiring boards are proposed. Referring to FIGS. 34 and 35, a method of manufacturing this type of printed wiring board will be described below. FIG. 34 is a sectional view showing a base material and FIG. 35 is a plan showing the base material.

To manufacture a printed wiring board 220 shown in FIG. 38, first, a base material 221 shown in FIGS. 34 and 35 is produced. The base material 221 is produced by performing predetermined etching after a metallic area 222 with large area such as a power plane and a ground plane, a connecting pad 223 with normal area and copper foil which is to be a predetermined circuit pattern 224 on a copper-clad laminate formed by laminating copper foil on a single side or double sides are coated with an etching resist.

Afterward, an interlayer insulating layer 225 shown in FIG. 36 is formed by applying photosensitive resin on the base material 221 together with the metallic area 222, the connecting pad 223 and the circuit pattern 224. Further, after a mask film 227 is exposed in a state in which it is stuck on the interlayer insulating layer 225 with a predetermined mask area 228 shown in FIG. 37 formed in the mask film 227 corresponding to the metallic area 222 and the connecting pad 223, a via hole 226 is formed corresponding to the metallic area 222 and the connecting pad 223. Afterward, a continuous circuit pattern 229 including the inside of each via hole 226 opposite to each metallic area 222 and each connecting pad 223 is formed on the interlayer insulating layer 225 by electroless plating and a printed wiring board 220 is produced.

However, if the printed wiring board 220 is produced according to the above procedure, the metallic area 222 is not completely exposed inside the via hole 226 formed in the metallic area 222 and the circuit pattern 229 formed inside the via hole and the metallic area 222 may be not connected. Referring to FIGS. 36 to 38, such a mechanism will be described below. FIG. 36 is a sectional view schematically showing a state in which the interlayer insulating layer 225 is formed on the base material 221, FIG. 37 is a sectional view showing a state in which the interlayer insulating layer 225 is exposed with the mask film 227 corresponding to the metallic area 222 and FIG. 38 is a sectional view of the printed wiring board 220 showing a state in which the via hole 226 is formed close to the metallic area 222 and the connecting pad 223.

As shown in FIG. 36, if the interlayer insulating layer 225 is formed by applying photosensitive resin on the base material 221, the photosensitive resin is relatively uniformed and has the thickness of L1 on the metallic area 222 because the metallic area 222 has large area and in the meantime, as the photosensitive resin is filled between the connecting pad 223 and the circuit pattern 224 or between the circuit patterns in the vicinity of the connecting pad 223 and the circuit pattern 224, the interlayer insulating layer 225 formed on the connecting pad 223 and the circuit pattern 224 has the thickness of L2 which is thinner than the thickness L1. Therefore, though the interlayer insulating layer 225 is formed on the metallic area 222 as shown in FIG. 36 so that it is thick (thickness L1), it is formed on the connecting pad 223 and each circuit pattern 224 so that it is thin (thickness L2).

If the via hole 226 is formed in the interlayer insulating layer 225 opposite to the metallic area 222 and the connecting pad 223 on the above base material 221, exposure is performed by radiating light from the upper side of the mask film 227 with the mask area 228 of the mask film 227 shown in FIG. 37 corresponding to each metallic area 222 and each connecting pad 223, however, as the thickness of the interlayer insulating layer 225 is different between on the metallic area 222 and on the connecting pad 223, the state of exposure of the interlayer insulating layer 225 on the metallic area 222 and that of exposure of the interlayer insulating layer on the connecting pad 223 inevitably differ. That is, as the interlayer insulating layer 225 on the connecting pad 223 is formed thinly, light is fully blocked off by the mask area 228, the interlayer insulating layer is not hardened and therefore, the connecting pad 223 is completely exposed in the via hole 226 formed in development. In the meantime, as the interlayer insulating layer 225 on the metallic area 222 is formed thickly, the resolution of exposure is short and therefore, the metallic area 222 is not completely exposed in the via hole 226 formed in development.

If the mask area 228 of the mask film 227 is arranged corresponding to the metallic area 222 and the interlayer insulating layer 225 is exposed to form the via hole 226 in the interlayer insulating layer 225, light is radiated from the upper side of the mask film 227 as shown in FIG. 37. Hereby, the interlayer insulating layer 225 on which light is radiated through the transparent part of the mask film 227 is hardened and in the meantime, as light is not radiated on the interlayer insulating layer 225 in a part in which light is blocked off by the mask area 228 of the mask film 227, the interlayer insulating layer is not hardened and is held unhardened.

However, as the metallic area 222 constitutes a power pattern and a ground pattern and has large area, light transmitted in the mask film 227 is dispersed on the metallic area 222 via the interlayer insulating layer 225 as shown in FIG. 37. Particularly, light transmitted in the mask film 227 and the interlayer insulating layer 225 in the vicinity of the mask area 228 is also dispersed on the metallic area 222, the dispersed light is also incident to the interlayer insulating layer 225 under the mask area 228 and as a result, the interlayer insulating layer 225 under the mask area 228 which should not be hardened properly is hardened. In such a case, even if development is performed after the above exposure, the hardened film of the interlayer insulating layer 225 is left on the metallic area 222. Therefore, as shown in FIG. 38, the hardened interlayer insulating layer 225 is left in the via hole 226 formed opposite to the metallic area 222 and the surface of the connecting pad is not completely exposed in the via hole 226. Hereby, even if the circuit pattern 229 is formed inside the via hole 226 and on the interlayer insulating layer 225 by electroless plating, there is a problem that such a circuit pattern 229 is not connected to the metallic area 222.

(3) Further, recently the miniaturization or speed-up of electronic equipment is promoted by the development of an electronic industry and densification by a fine pattern is required for a printed wiring board and a variety of wiring boards on which a large scale integrated circuit (LSI) is mounted. To achieve such densification, a multilayer printed wiring board called a built-up wiring board is most suitable.

Under such a situation, heretofore, the multilayer connecting structure of a multilayer printed wiring board is realized by connecting a connecting pad and a pattern via a via hole in order. Referring to FIG. 39, connection structure for connecting a connecting pad formed on the core material of a conventional multilayer printed wiring board and a pattern on an interlayer insulating layer provided on the core material via a via hole will be described below. FIGS. 39 show connection structure for connecting a connecting pad formed on the core material of a conventional multilayer printed wiring board and a pattern on an interlayer insulating layer via a via hole, FIG. 39 (A) is a plan showing a multilayer printed wiring board and FIG. 39 (B) is a sectional view showing the multilayer printed wiring board.

As shown in FIGS. 39 (A) and (B), a multilayer printed wiring board 300 is provided with a base material 301 which is a core material and a through hole 302 is formed in this base material 301. A conductor layer 303 is formed on the inner wall of the through hole 302 by through hole plating and a circular through hole land 304 connected to the conductor layer 303 is provided on the upper and lower sides of the base material 301. The through hole land 304 is connected to a circular connecting pad 306 on the upper surface of the base material 301 via a connecting pattern 305. A connecting pad 306 is also formed in a position separated from the through hole land 304 on the lower surface of the base material 301. Resin 307 is filled inside the through hole 302 or between the through hole land 304, the connecting pattern 305, the connecting pad 306 or other circuit pattern on the double sides of the base material 301.

An interlayer insulating layer 308 is provided on the upper surface of the base material 301, a via hole 310 inside which a conductor layer 309 is formed is provided in a position of the interlayer insulating layer 308 opposite to the connecting pad 306 and a circuit pattern 311 connected to the conductor layer 309 is formed. Hereby, the connecting pad 306 is connected to the circuit pattern 311 via the conductor layer 309 of the via hole 310. Similarly, an interlayer insulating layer 308 is formed on the lower surface of the base material 301, a via hole 310 provided with a conductor layer 309 inside is formed in a position of the interlayer insulating layer 308 opposite to the connecting pad 306, and the connecting pad 306 and the conductor layer 309 are connected each other. A plating resist layer 312 required when the conductor layer 309 and the circuit pattern 311 are formed by electroless plating is formed around the conductor layer 309 of the via hole 310 and the circuit pattern 311.

Next, referring to FIG. 40, connection structure for connecting a connecting pad formed on the interlayer insulating layer and a pattern on another interlayer insulating layer via a via hole will be described below. FIGS. 40 show connection structure for connecting a connecting pad formed on an interlayer insulating layer in a conventional multilayer printed wiring board and a pattern on another interlayer insulating layer via a via hole, FIG. 40 (A) is a plan showing a printed wiring board and FIG. 40 (B) is a sectional view showing the printed wiring board.

As shown in FIGS. 40 (A) and (B), a printed wiring board 320 is provided with a base material 321 which is a core material, a connecting pad 322 is formed on the upper surface of this base material 321 and a filled resin layer 323 is provided around the connecting pad 322. An interlayer insulating layer 324 is formed on the upper surface of the connecting pad 322 and the filled resin layer 323, a via hole 326 inside which a conductor layer 325 is formed is provided in a position of the interlayer insulating layer 324 opposite to the connecting pad 322 and a circuit pattern 327 connected to the conductor layer 325 is formed. A connecting pad 328 is formed at the end of the circuit pattern 327 as shown at the left end in FIGS. 40 (A) and (B). Hereby, the connecting pad 322 on the base material 321 is connected to the connecting pad 328 on the interlayer insulating layer 324 via the conductor layer 325 of the via hole 326 and the circuit pattern 327. A plating resist layer 329 required when the conductor layer 325, the circuit pattern 327 and the connecting pad 328 are formed by electroless plating is formed around the conductor layer 325 of the via hole 326, the circuit pattern 327 and the connecting pad 328.

A further other interlayer insulating layer 330 is provided on the upper surface of the interlayer insulating layer 324, a via hole 332 inside which a conductor layer 331 is formed is provided in a position of this interlayer insulating layer 330 opposite to the connecting pad 328 and a circuit pattern 333 connected to the conductor layer 331 is formed. Hereby, the connecting pad 328 on the interlayer insulating layer 324 is connected to the circuit pattern 333 via the conductor layer 331 of the via hole 332. A plating resist layer 334 required when the conductor layer 331 and the circuit pattern 333 are formed by electroless plating is formed around the conductor layer 331 of the via hole 332 and the circuit pattern 333.

A method of forming the via hole 310 in the interlayer insulating layer 308 and connecting the connecting pad 306 on the base material 301 and the circuit pattern 311 on the interlayer insulating layer 308 via the conductor layer 309 in manufacturing the above printed wiring board 300 is as follows: However, to simplify description, only the upper constitution in the printed wiring board 300 will be described below.

That is, after the through hole 302, the conductor layer 303, the through hole land 304, the connecting pattern 305 and the connecting pad 306 are formed on the base material 301 by applying drilling, electroless plating, predetermined etching and filling resin to a double-sided copper-clad laminate, photosensitive resin is applied to the upper surface of the base material 301 and is dried so as to form the interlayer insulating layer 308, and the interlayer insulating layer 308 is exposed with the mask film not shown provided with a light blocking pattern corresponding to the via hole 310 and the circuit pattern 311 stuck on the interlayer insulating layer 308. After exposure, the mask film is peeled from the interlayer insulating layer 308 and development is performed. Hereby, the via hole 310 is formed. Further, plating catalytic nucleus is applied to the interlayer insulating layer 308, and the conductor layer 309 and the circuit pattern 311 are formed by electroless plating after the plating resist layer 312 is formed. Hereby, the connecting pad 306 is connected to the circuit pattern 311 via the conductor layer 309 and the printed wiring board 300 is manufactured.

If the via hole 332 is formed in the interlayer insulating layer 330 (the upper interlayer insulating layer) and the connecting pad 328 on the interlayer insulating layer 324 (the lower interlayer insulating layer) and the circuit pattern 333 on the interlayer insulating layer 330 are connected via the conductor layer 331 in the printed wiring board 320, basically the similar method to the above-mentioned is also used.

It depends upon whether the light blocking pattern of a mask film corresponding to the via holes 310 and 332 and the circuit patterns 311 and 333 can be set to a correct position of a portion in which a via hole is to be formed and a portion in which a circuit pattern is to be formed in the interlayer insulating layers 308 and 330 or not whether the via holes 310 and 332 are securely formed and the connecting pads 306 and 328 are reliably connected to the circuit patterns 311 and 333 via the conductor layers 309 and 331 or not.

However, as the shape of the connecting pads 306 and 328 are circular as that of the via holes 310 and 332 though allowable misregistration to some extent is set between the periphery of the connecting pads 306 and 328 and the periphery of the via holes 310 and 332 in the conventional printed wiring boards 300 and 320, the range of allowable misregistration in all directions is equal. Therefore, if a mask film is positioned exceeding the range of allowable misregistration in any direction on the interlayer insulating layers 308 and 330, the via holes 310 and 332 are not formed in a position in which they should be formed in the interlayer insulating layers 308 and 330 properly and as a result, the connecting pads 306 and 328 and the conductor layers 309 and 331 are not completely connected respectively and sufficient reliability of connection cannot be held or they may be disconnected.

Generally, the diameter of the connecting pads 306 and 328 is 200 $\mu$m, while that of the via holes 310 and 332 is 100 $\mu$m and therefore, positioning tolerance between the connecting pads 306 and 328 and the via holes 310 and 332 is only ±50 μm and respective connection failure caused by this between the connecting pads 306 and 328 and the via holes 310 and 332 is considerably frequently caused.

As shown in FIG. 39, as the through hole land 304 and the connecting pad 306 are both circular and the through hole land 304 and the connecting pad 306 are connected via the connecting pattern 305, stress is always applied to the intersection of the through hole land 304 and the connecting pattern 305 and the intersection of the connecting pad 306 and the connecting pattern 305. Similarly, as shown in FIG. 40, as the conductor layer 325 of the via hole 326 and the connecting pad 328 are both circular and the conductor layer 325 and the connecting pad 328 are connected via the circuit pattern 327, stress is always applied to the intersection of the conductor layer 325 and the circuit pattern 327 and the intersection of the connecting pad 328 and the circuit pattern 327. Therefore, the interlayer insulating layers 308 and 330 which are respectively in contact with each intersection may be cracked in a heat cycle.

Further, in the conventional multilayer printed wiring boards 300 and 320, the connecting pads 306 and 328 are respectively connected to the conductor layers 309 and 331 only in either of the via hole 310 or 332 and therefore, if disconnection occurs in one of a large number of via holes which exist in the printed wiring boards 300 and 320, the printed wiring boards 300 and 320 themselves fail and there is a problem that yield is bad.

(4) The present invention is made to solve the above conventional problems and the first object is to provide a reliable printed wiring board wherein a circuit pattern provided on the upper surface of an interlayer insulating layer formed in a printed wiring board and a conductor pad can be securely connected without causing connection failure by arranging an opening existing around a conductor pad so that it is not overlapped with the conductor pad, by substantially equalizing the quantity of resin which fills an opening around a conductor pad and that of resin which fills another opening and by substantially equalizing the area of a plating resist formed in an opening around a conductor pad and that of a plating resist formed in another opening and to prevent peeling.

The second object of the present invention is to provide a printed wiring board which is a multilayer printed wiring board wherein a photosensitive interlayer insulating layer is formed on a base material on which a metallic area which functions as a power plane or a ground plane is formed, a conductor circuit is formed on the above interlayer insulating layer and the conductor circuit is connected to the above metallic area via a via hole formed in the interlayer insulating layer wherein a pad for connecting to the via hole is formed in the above metallic area, a blank portion is provided around the pad to separate the pad from the metallic area, the thickness of an interlayer insulating layer on the metallic area and a conductive pattern is uniformed and the resolution of exposure to the interlayer insulating layer on the metallic area is prevented from varying widely by electrically connecting the above pad to at least one point of the metallic area and a via hole securely exposing the metallic area can be formed by preventing light dispersed by the metallic area from being incident to an interlayer insulating layer existing under the mask area of a mask film where a pattern for forming a via hole is formed and its manufacturing method.

Further, the third object of the present invention is to provide a multilayer printed wiring board wherein even if misregistration is caused between a pad and a mask film when a via hole is formed by exposing and developing an interlayer insulating layer with a mask film stuck on the photosensitive interlayer insulating layer by devising the shape of a connecting pad formed on a base material or an interlayer insulating layer, the via hole and the pad can be stably connected reliably.

SUMMARY OF THE INVENTION (1) To achieve the above first object, a printed wiring board according to the present invention is characterized by comprising a conductive pattern formed in a mesh on the single side or double sides of a base material and provided with plural openings in which no conductor exists, a conductor pad provided between the openings of the conductive pattern and a filled resin layer for filling each opening in that an opening existing around a conductor pad is arranged so that it is not overlapped with the conductor pad.

A printed wiring board according to the present invention is also characterized by comprising a conductive pattern formed in a mesh on the single side or double sides of a base material on which an adhesive layer for electroless plating is formed and provided with plural openings in which no conductor exists, a conductor pad provided between the openings of the conductive pattern and a plating resist formed in each opening in that an opening existing around a conductor pad is arranged so that it is not overlapped with the conductor pad.

Further, a printed wiring board according to the present invention is characterized in that the above conductor pad is a photovia land.

In a printed wiring board according to the present invention provided with the above constitution, an opening existing around a conductor pad which is a photovia land is arranged so that it is not overlapped with the conductor pad, therefore as the area of an opening existing around a conductor pad and that of another opening are equal, the quantity of resin which fills each opening is equal in the overall printed wiring board, and in other words, the quantity of resin overflowing from each opening when each opening is filled with resin can be uniformed in any opening. Hereby, the thickness of a filled resin layer formed in each opening is substantially equal, the quantity of resin overflowing from each opening can be uniformed in the overall printed wiring board and when the respective surfaces of a conductive pattern and a conductor pad are polished so that they are smooth, resin overflowing from an opening around the conductor pad is not left on the conductor pad. As a result, a circuit pattern provided on an interlayer insulating layer formed in a printed wiring board and a conductor pad can be securely connected without causing connection failure.

To form a conductive pattern in a mesh on the surface of an insulator for electroless plating which also functions as interlayer insulating material, a plating resist is required to be formed in an opening, however, this plating resist is not connected to another plating resist. Therefore, as its area which is in contact with an adhesive for electroless plating is smaller, a plating resist is readily peeled. In a printed wiring board according to the present invention, a plating resist is prevented from being peeled by arranging an opening existing around a conductor pad so that it is not overlapped with the conductor pad and minimizing the reduction of the area of a plating resist constituting an opening.

(2) To achieve the above second object, a printed wiring board according to the present invention which is a multilayer printed wiring board wherein a photosensitive interlayer insulating layer is formed on a base material on which a metallic area which functions as a power plane or a ground plane is formed, a conductor circuit is formed on the above interlayer insulating layer and the conductor circuit is connected to the above metallic area via a via hole formed in the interlayer insulating layer is characterized in that a pad for connecting to the via hole is formed in the above metallic area, a blank portion is provided around the pad to separate it from the metallic area and the above pad is electrically connected to at least one point of the metallic area. Further, in such a printed wiring board, a filled resin layer or a plating resist layer is formed in the above blank portion.

In a printed wiring board according to the present invention provided with the above constitution, if an interlayer insulating layer is exposed by radiating light from outside a mask film with the mask film stuck on the interlayer insulating layer to form a via hole opposite to a metallic area, the interlayer insulating layer on which light is radiated via the mask film is hardened and in the meantime, the interlayer insulating layer corresponding to a part in which light is blocked off by the mask area of the mask film is held unhardened without being hardened because light is not radiated on it.

At this time, as a blank portion provided with a filled resin layer in which no conductor exists or a plating resist layer is formed outside the metallic area constituting a power pattern or a ground pattern which is coated with the mask area of the mask film with the mask film stuck on the interlayer insulating layer, light transmitted in the mask film and the interlayer insulating layer in the vicinity of the mask area is radiated on the blank portion and light is not dispersed in the vicinity of the mask area. Therefore, light is efficiently prevented from being incident to the interlayer insulating layer existing under the mask area and the interlayer insulating layer under the mask area is held unhardened without being hardened. Hereby, if development is performed after exposure, no hardened film of the interlayer insulating layer is left on the metallic area and a via hole in which the metallic area is securely exposed can be formed.

As in the above printed wiring board, a filled resin layer or a plating resist layer is formed between the blank portion and a circuit pattern so that the upper surface of the filled resin layer or the plating resist layer is substantially as high as that of the metallic area, a photosensitive interlayer insulating layer can be formed on the blank portion, the circuit pattern and the filled resin layer so that the thickness of the interlayer insulating layer is substantially uniform throughout the base material. Therefore, when a via hole opposite to a connecting pad is formed by exposing light to the interlayer insulating layer via the mask film, the resolution of exposure is prevented from varying widely and the interlayer insulating layer can be exposed under the same exposure condition. Hereby, a via hole inside which a metallic area is completely exposed can be formed. The metallic area is connected to at least one point of a portion connected to a via hole in the metallic area (a connecting pad). Therefore, even if the blank portion exists, no function of a power plane or a ground plane is damaged.

Further, a method of manufacturing a printed wiring board according to the present invention is characterized in that in a method of manufacturing a multilayer printed wiring board wherein a photosensitive interlayer insulating layer is formed on a base material on which a metallic area which functions as a power plane or a ground plane is formed, a mask film where a pattern for forming a via hole is formed is formed and a hole for the via hole is formed by exposure and development and further, a conductor circuit and a via hole are formed, when a pad connected to a via hole in the metallic area is formed, a blank portion is provided around the pad to separate the pad from the metallic area and the above pad is electrically connected to at least one point of the metallic area. According to this manufacturing method, the above printed wiring board can be manufactured and therefore, the similar action and effect to the above-mentioned can be obtained.

A method of manufacturing the above printed wiring board is also characterized in that a blank portion is provided around a pad by etching a metallic area to separate the pad from the metallic area so that the pad is electrically connected to at least one point of the metallic area when the pad for connecting to a via hole in the above metallic area is formed, the blank portion is filled with resin and the filled resin layer is polished so that the level of the respective upper surfaces of the pad and the filled resin layer is equal. According to such a manufacturing method, as the blank portion is filled with resin, the level of the upper surface of a conductor circuit is equal to that of the filled resin layer and even if an interlayer insulating layer is formed on it, the thickness can be uniformed, a problems of insufficient development and excessive development caused by difference in thickness can be solved and a satisfactory hole for a via hole can be formed.

Further, a method of manufacturing a printed wiring board according to the present invention is characterized in that after a plating resist layer corresponding to a blank portion around a pad is formed so that the pad and a metallic area are electrically connected at least one point when the pad for connecting to a via hole in the above metallic area is formed, the metallic area and the pad are formed by electroless plating and the blank portion is provided around the pad to separate the pad from the metallic area. According to this manufacturing method, as a plating resist exists in the blank portion, the level of the upper surface of a conductor circuit can be equal to that of the plating resist layer.

(3) Further, to achieve the above third object, a multilayer printed wiring board according to the present invention is constituted so that a through hole land is in the shape of a tear and a via hole is connected at the narrower portion of the tear-shaped land based upon a multilayer printed wiring board wherein its core material is provided with a through hole, an interlayer insulating layer is formed on the core material, a via hole is formed in the interlayer insulating layer and the via hole and the through hole are electrically connected. In this multilayer printed wiring board, a through hole land is in the shape of a tear, as a via hole is connected in the through hole land, the through hole land and a pad for connecting to the via hole are integrated and therefore, the area for connection of the bottom of the via hole can be enlarged. Hereby, when an interlayer insulating layer which is formed on a core material and on which the mask film is stuck is exposed with the light blocking pattern of the mask film corresponding to a part in which the via hole is to be formed to form the via hole, the range of allowable misregistration of the light blocking pattern of the mask film to a part in which the via hole is to be formed is greatly widened and even if the pad and the mask film are dislocated in the direction of the narrower side of the tear-shaped pad if misregistration is caused between a pad and the master film, the via hole and the pad can be stably connected reliably. The narrower side of the tear-shaped pad means Y side in FIG. 17 (A).

As a through hole land and a pad for connecting to a via hole are integrated as described above, there is no location at which stress is converged and an interlayer insulating layer can be also prevented from being cracked in a heat cycle.

A multilayer printed wiring board according to the present invention is constituted so that a land for a via hole provided in the above interlayer insulating layer is in the shape of a tear and the opening of the via hole is formed in a part in which the tear-shaped land is widened. In such a multilayer printed wiring board, a through hole land and a via hole land are both in the shape of a tear, as the opening of the via hole is formed in the enlarged part of such a land, an allowable range in which the opening of the via hole is formed on the pad is enlarged, compared with the case of the above printed wiring board, therefore the range of allowable misregistration of the light blocking pattern of the mask film to a part in which the via hole is to be formed is greatly widened and if misregistration is caused between the pad and the mask film, the via hole and the pad can be also stably connected reliably independent of the direction of misregistration, for example both on the narrower side and on the enlarged side of the tear shape. The enlarged side of the tear shape means X side in FIG. 17 (A).

Further, a multilayer printed wiring board according to the present invention is constituted so that a land for a via hole provided in the above interlayer insulating layer is substantially elliptic and the opening of the via hole is formed at one end of the ellipse in the direction of the longer axis. In such a multilayer printed wiring board, a through hole land is in the shape of a tear, a via hole land is elliptic, therefore an allowable range for forming the opening of a via hole is further enlarged, compared with the case of the above printed wiring board, the range of allowable misregistration of the light blocking pattern of a mask film to a part in which the via hole is to be formed is greatly widened and hereby, if misregistration is caused between a pad and the mask film, the via hole and the pad can be also stably connected reliably independent of the direction of misregistration, for example both on the narrower side and on the enlarged side of the tear shape.

A multilayer printed wiring board according to the present invention is also constituted so that a land for a via hole provided in the above interlayer insulating layer is in the shape of a tear, the opening of the via hole is formed in the enlarged part and the via hole is electrically connected to the tear-shaped pad formed on the interlayer insulating layer. In such a multilayer printed wiring board, a land for the via hole and the tear-shaped pad are electrically connected on the interlayer insulating layer in addition to the above constitution and as the pad formed on the interlayer insulating layer is also in the shape of a tear as described above, the area for connection of the bottom of the via hole connected to the pad can be enlarged. Hereby, when an interlayer insulating layer which is formed on a core material and on which a mask film is stuck is exposed with the light blocking pattern of the mask film corresponding to a part in which a via hole is to be formed to form the via hole, the range of allowable misregistration of the light blocking pattern of the mask film to a part in which the via hole is to be formed is greatly widened and if misregistration is caused between a pad and the mask film, the via hole and the pad can be also stably reliably independent of the direction of misregistration, for example both on the narrower side and on the enlarged side of the tear shape.

Further, a multilayer printed wiring board according to the present invention is constituted so that a pad is substantially elliptic, a via hole for connecting to the upper conductor circuit is connected to one end of the ellipse in the direction of the longer axis, the other part functions as a part of a land for a via hole for connecting to the lower conductor circuit and constitution for connecting to the lower conductor circuit is provided based upon a multilayer printed wiring board wherein an interlayer insulating layer is formed on a base material on which the lower conductor circuit is formed, an intermediate layer conductor circuit including a pad is formed on the interlayer insulating layer, an interlayer insulating layer is further formed on the intermediate layer conductor circuit, the upper conductor circuit is formed on the interlayer insulating layer, the above lower and upper conductor circuits are electrically connected to the above pad a via hole provided in the interlayer insulating layer.

In such a multilayer printed wiring board, a land for a via hole for connecting to the lower conductor circuit and a pad for a via hole for connecting to the upper conductor circuit are continuously integrated and form an ellipse in which the opposite sides of an ellipse or a rectangle draw an arc outside, therefore there is no location to which stress is converged and an interlayer insulating layer can be also prevented from being cracked in a heat cycle. As the above printed wiring board, the area for connection of the bottom of a via hole can be enlarged and when an interlayer insulating layer which is formed on a base material and on which a mask film is stuck is exposed with the light blocking pattern of the mask film corresponding to a part in which a via hole is to be formed to form the via hole, the range of allowable misregistration of the light blocking pattern of the mask film to a part in which the via hole is to be formed is greatly widened and if misregistration is caused between a pad and the mask film, the via hole and the pad can be also stably connected reliably even if misregistration is caused in the direction of the narrower side of the tear-shaped pad.

A multilayer printed wiring board is also constituted so that a land for a via hole for connecting to the above upper conductor circuit is substantially in the shape of a tear and the opening of the via hole is formed at the enlarged part of the tear-shaped land. In such a multilayer printed wiring board, a pad for an intermediate layer conductor circuit is elliptic, a land for a via hole for connecting to the upper conductor circuit is in the shape of a tear, further as the opening of the via hole is formed in the enlarged part of the land, an allowable range for forming the opening of the via hole on the pad is further enlarged, compared with the case of the above printed wiring board, therefore the range of allowable misregistration of the light blocking pattern of the mask film to a part in which the via hole is to be formed is greatly widened and if misregistration is caused between the pad and the mask film, the via hole and the pad can be also stably connected reliably independent of the direction of misregistration, for example both on the narrower side and on the enlarged side of the tear shape.

Further, a multilayer printed wiring board according to the present invention is constituted so that a land for a via hole for connecting to the above upper conductor circuit is substantially elliptic and the opening of the via hole is formed at one end of the ellipse in the direction of the longer axis. In such a multilayer printed wiring board, a pad for an intermediate layer conductor circuit is elliptic, a land for a via hole for connecting to the upper conductor circuit is elliptic, further as the opening of the via hole is formed at one end of the ellipse of the land in the direction of the longer axis, an allowable range for forming the opening of the via hole is enlarged, the range of allowable misregistration of the light blocking pattern of the mask film to a part in which the via hole is to be formed is greatly widened and hereby, if misregistration is caused between the pad and the mask film, the via hole and the pad can be also stably connected reliably independent of the direction of misregistration, for example both on the narrower side and on the enlarged side of the tear shape.

A multilayer printed wiring board according to the present invention is also constituted so that a land for a via hole for connecting to the above upper conductor circuit is in the shape of a tear, the opening of the via hole is formed at the enlarged part, and the land is electrically connected to a tear-shaped pad formed on an interlayer insulating layer. In such a multilayer printed wiring board, a pad for an intermediate layer conductor circuit is elliptic in addition to the above constitution, a land for a via hole for connecting to the upper conductor circuit is in the shape of a tear and as the opening of the via hole is formed in the enlarged part, the area for connection of the bottom of the via hole connected to the pad can be enlarged. Hereby, when an interlayer insulating layer which is formed on a base material and on which a mask film is stuck is exposed with the light blocking pattern of the mask film corresponding to a part in which a via hole is to be formed to form the via hole, the range of allowable misregistration of the light blocking pattern of the mask film to a part in which the via hole is to be formed is greatly widened and if misregistration is caused between a pad and the mask film, the via hole and the pad can be also stably connected reliably even if misregistration is caused in the direction of the narrower side of the tear-shaped pad.

Further, a multilayer printed wiring board according to the present invention is constituted so that a pad and a land are in the shape of a tear and they are connected each other on the narrower side of the tear shape based upon a multilayer printed wiring board wherein an interlayer insulating layer is formed on a core material on which the lower conductor circuit is formed, an intermediate layer conductor circuit is formed on the interlayer insulating layer, an interlayer insulating layer is further formed on the intermediate layer conductor circuit, the upper conductor circuit is formed on the interlayer insulating layer, a land for a via hole for connecting to the lower conductor circuit and a pad for connecting to the upper conductor circuit are provided to the above intermediate layer conductor circuit and the above land and the pad are electrically connected. In such a multilayer printed wiring board, as a pad connected to the upper conductor circuit formed on the intermediate layer conductor circuit and a land for a via hole for connecting to the lower conductor circuit are both in the shape of a tear and each pad and the land are connected each other on the narrower side, the area for connection of the bottom of the via hole connected to a pad can be enlarged. Hereby, when an interlayer insulating layer which is formed on a base material and on which a mask film is stuck is exposed with the light blocking pattern of the mask film corresponding to a part in which a via hole is to be formed to form the via hole, the range of allowable misregistration of the light blocking pattern of the mask film to a part in which the via hole is to be formed is greatly widened and if misregistration is caused between a pad and the mask film, the via hole and the pad can be also stably connected reliably even if misregistration is caused in the direction of the narrower side of the tear- shaped pad. Stress is hardly converged to a connection in which the pad and the land are connected each other and hereby, an interlayer insulating layer can be also prevented from being cracked in a heat cycle.

A multilayer printed wiring board according to the present invention is also constituted so that a land for a via hole is in the shape of a tear and the opening of the via hole is formed in the enlarged part based upon a multilayer printed wiring board wherein an interlayer insulating layer is formed on a base material on which the lower conductor circuit is formed, the upper conductor circuit is formed on the interlayer insulating layer and the above lower and upper conductor circuits are electrically connected via a via hole provided in an interlayer insulating layer. In such a multilayer printed wiring board, when an interlayer insulating layer which is formed on a base material and on which a mask film is stuck is exposed with the light blocking pattern of the mask film corresponding to a part in which the via hole is to be formed to form the via hole because a land for a via hole is in the shape of a tear and the opening of the via hole is formed on the enlarged part of the tear shape, the range of allowable misregistration of the light blocking pattern of the mask film to a part in which the via hole is to be formed is greatly widened and if the misregistration of the mask film is caused, the opening of the via hole can be also formed in the enlarged part of the tear-shaped land independent of the direction of misregistration. Stress is hardly converged to a connection between the land and the upper conductor circuit and hereby, an interlayer insulating layer can be also prevented from being cracked in a heat cycle.

Further, a multilayer printed wiring board according to the present invention is constituted so that plural via holes are collected based upon the above multilayer printed wiring board. In such a multilayer printed wiring board, as plural via holes share a land and are collected, secure connection is enabled via the residual via holes even if some via holes are disconnected and the probability of disconnection can be greatly reduced. A plating resist can be prevented from being left after development in the intersection of a circuit pattern and a pad by forming the pad and a land in the shape of a tear as described above. Further, as the area of the pad and the land can be increased, the strength of sticking can be enhanced by the increase of a stuck area. In addition, these effects can be realized without increasing dead space between wiring patterns and are useful in manufacturing a high density wiring board.

BRIEF DESCRIPTION OF THE DRAWINGS

FIGS. 1 to 11 are explanatory drawings showing a printed wiring board equivalent to a first embodiment, FIG. 1 is a sectional view showing a copper-clad laminate;

FIG. 2 shows the pattern of a conductor circuit;

FIG. 3 are sectional views showing the copper-clad laminate on which a conductor circuit is formed;

FIG. 4 is the sectional view of the copper-clad laminate showing a state in which an opening is filled with resin;

FIG. 5 is an explanatory drawing showing a state in which a first resin layer and a first adhesive layer are formed on the conductor circuit;

FIG. 6 is an explanatory drawing showing a state in which a via hole is formed in the first resin layer and the first adhesive layer;

FIG. 7 is an explanatory drawing showing a state in which a plating resist is formed on the first adhesive layer;

FIG. 8 is an explanatory drawing showing a state in which a conductor circuit is formed in the via hole;

FIG. 9 is an enlarged explanatory drawing schematically showing a state in which the conductor circuit and the first adhesive layer are adherent;

FIG. 10 is an explanatory drawing showing a state in which a second resin layer and a second adhesive layer are formed on the plating resist and the conductor circuit in the via hole; and FIG. 11 is a sectional view showing a multilayer printed wiring board.

FIG. 13 is a plan showing the printed wiring board;

FIG. 14 is an enlarged partial sectional view schematically showing a state in which an interlayer insulating layer on a metallic area is exposed;

FIG. 15 are explanatory drawings showing the variation of a blank portion; and

FIG. 16 are process drawings showing a process of manufacturing the printed wiring board.

Further, FIGS. 17 to 27 are explanatory drawings showing a printed wiring board equivalent to a third embodiment, FIG. 17 show connection structure in which a connecting pad formed on a core material for which the multilayer printed wiring board equivalent to the first embodiment is used and a pattern on an interlayer insulating layer are connected via a via hole, FIG. 17 (A) is a plan showing the multilayer printed wiring board;

FIG. 17 (B) is a sectional view showing the multilayer printed wiring board;

FIG. 17 (C) is a sectional view showing the multilayer printed wiring board with a different separation between the through a hole and the via hole;

FIG. 17 (D) is a plan view showing the multilayer printed circuit board with a different separation between the through hole and the via hole.

FIG. 18 is a plan showing the multilayer printed wiring board equivalent to the second embodiment;

FIG. 19 is a plan showing a multilayer printed wiring board equivalent to a third embodiment;

FIG. 20 is a plan showing a multilayer printed wiring board, equivalent to a fourth embodiment;

FIG. 21 show connection structure in which a connecting pad formed on an interlayer insulating layer and a pattern on another interlayer insulating layer are connected via a via hole in a multilayer printed wiring board equivalent to a fifth embodiment, FIG. 21 (A) is a plan showing the multilayer printed wiring board;

FIG. 21 (B) is a sectional view showing the multilayer printed wiring board;

FIG. 22 is a plan showing a multilayer printed wiring board equivalent to a sixth embodiment;

FIG. 23 is a plan showing a multilayer printed wiring board equivalent to a seventh embodiment;

FIG. 24 is a plan showing a multilayer printed wiring board equivalent to an eighth embodiment;

FIG. 25 show connection structure in which a connecting pad formed on an interlayer insulating layer and a pattern on another interlayer insulating layer are connected via a via hole in a multilayer printed wiring board equivalent to a ninth embodiment, FIG. 25 (A) is a plan showing the multilayer printed wiring board;

FIG. 25 (B) is a sectional view showing the multilayer printed wiring board;

FIG. 26 show connection structure in which a connecting pad on a base material and a pattern on an interlayer insulating layer are connected via a via hole in a multilayer printed wiring board equivalent to a tenth embodiment, FIG. 26 (A) is a plan showing the multilayer printed wiring board;

FIG. 26 (B) is a sectional view showing the multilayer printed wiring board;

FIG. 26 C–E depict variations in the shape pf the via hole as a function of misregistration FIG. 27 show connection structure in which a connecting pad formed on an interlayer insulating layer and a pattern on another interlayer insulating layer are connected via a via hole in a multilayer printed wiring board equivalent to an eleventh embodiment, FIG. 27 (A) is a plan showing the multilayer printed wiring board;

FIG. 27 (B) is a sectional view showing the multilayer printed wiring board; and FIGS. 27 (C) and 27 (D) are plans showing the multilayer printed wiring board provided with different connection structures.

FIGS. 28 to 40 are explanatory drawings for explaining prior art,

FIG. 28 is a sectional view showing a copper-clad laminate in a conventional multilayer printed wiring board;

FIG. 29 is a sectional view showing the copper-clad laminate on which a conductor circuit is formed in the conventional multilayer printed wiring board;

FIG. 30 is a sectional view of the copper-clad laminate showing a state in which an exposed area is filled with resin in the conventional multilayer printed wiring board;

FIG. 31 shows the pattern of a conductor circuit in the conventional multilayer printed wiring board;

FIG. 32 is a sectional view of the copper-clad laminate showing a state of filled resin left on a pad in the conventional multilayer printed wiring board;

FIG. 33 is a sectional view of the multilayer printed wiring board showing a state in which a conductor circuit is connected via the left filled resin in the conventional multilayer printed wiring board;

FIG. 34 is a sectional view showing a conventional base material;

FIG. 35 is a plan showing the conventional base material;

FIG. 36 is a sectional view schematically showing a state in which an interlayer insulating layer is formed on the conventional base material;

FIG. 37 is a sectional view showing a state in which as heretofore, the interlayer insulating layer is exposed through a mask film;

FIG. 38 is a sectional view of a printed wiring board showing a state in which as heretofore, a via hole is formed in a metallic area and a connecting pad;

FIG. 39 show connection structure in which a connecting pad formed on a core material and a pattern on the interlayer insulating layer are connected via the via hole in the conventional multilayer printed wiring board, FIG. 39 (A) is a plan showing the multilayer printed wiring board;

FIG. 39 (B) is a sectional view showing the multilayer printed wiring board;

FIG. 40 show connection structure in which a connecting pad formed on an interlayer insulating layer and a pattern on another interlayer insulating layer are connected via a via hole in the conventional multilayer printed wiring board, FIG. 40 (A) is a plan showing the printed wiring board; and FIG. 40 (B) is a sectional view showing the printed wiring board.

DETAILED DESCRIPTION OF THE PREFERRED EMBODIMENTS

Figure 3:
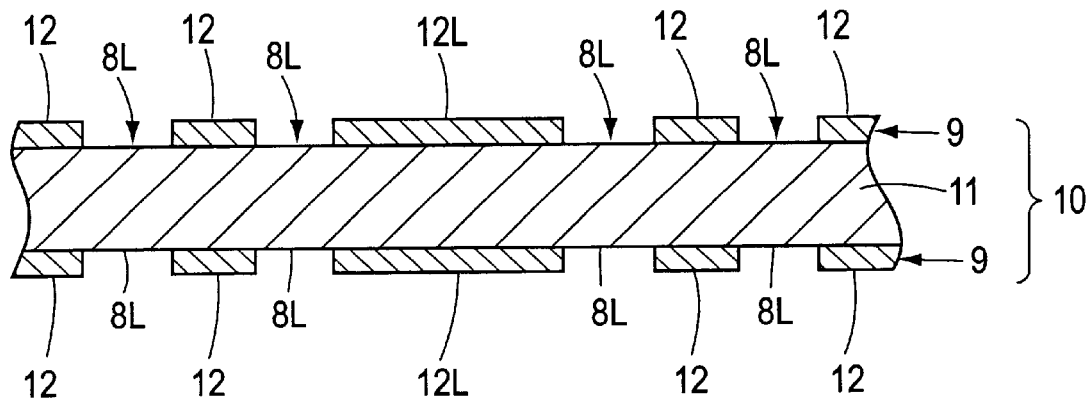
Figure 3:
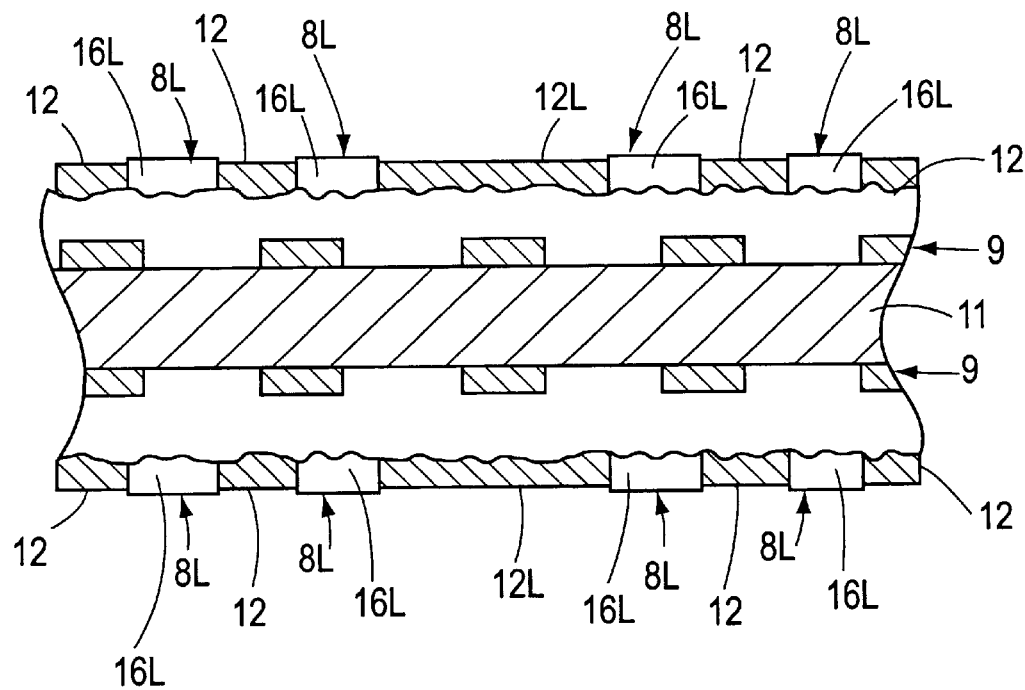

Embodiments in which the present invention is embodied will be described below referring to drawings.

(First Embodiment)

A printed wiring board equivalent to a first embodiment according to the present invention will be described below referring to FIGS. 1 to 11. FIGS. 1 to 11 show the manufacturing process of a multilayer printed wiring board 1 according to the present invention. In FIGS. 6 to 10, the lower part of a core material 11 is omitted, however, it is similar to the upper part of the core material 11 shown in the drawings. First, as shown in FIG. 1, a copper-clad laminate 10 in which a copper layer 9 which is a conductor layer is formed on the core material 11 which is a base material is prepared.

Next, the copper-clad laminate 10 in which a conductor circuit 12 is formed out of the copper layer 9 is obtained by laminating a photosensitive dry film where the pattern of the conductor circuit 12 which is a first conductor circuit is printed on the double sides of the copper-clad laminate 10 and etching after exposure and development. FIG. 2 shows the copper-clad laminate 10 in which the conductor circuit 12 is formed. FIG. 3 (A) is a sectional view of the copper-clad laminate 10 viewed along a line A—A' in FIG. 2. FIGS. 4 to 11 are also sectional views of the copper-clad laminate 10 viewed along the line A—A' in FIG. 2.

Referring to the copper-clad laminate 10 in which the conductor circuit 12 is formed and which is shown in FIGS. 2 and 3, basically, the pattern of the conductor circuit 12 is in a mesh, in an opening 8 where the copper-clad laminate 10 is exposed between the conductor circuits 12, no conductor exists and the openings are arranged in the shape of a grid. However, to secure the area required for a pad 12L (provided with larger area than the openings 8 and 8L) to which a conductor circuit 17A shown in FIG. 8, a second conductor circuit is connected on the conductor circuit 12, which is the surface of the copper layer 9, the opening 8L which is a part of the openings 8 arranged in the shape of a grid is shifted right and left in the drawings so that the area of the opening 8L is not overlapped with that of the pad 12L. However, as the area of each opening 8 or 8L is set to a fixed value, any space surrounded by the core material 11 and the copper layer 9 of the opening 8 or 8L has the same volume.

Figure 4:
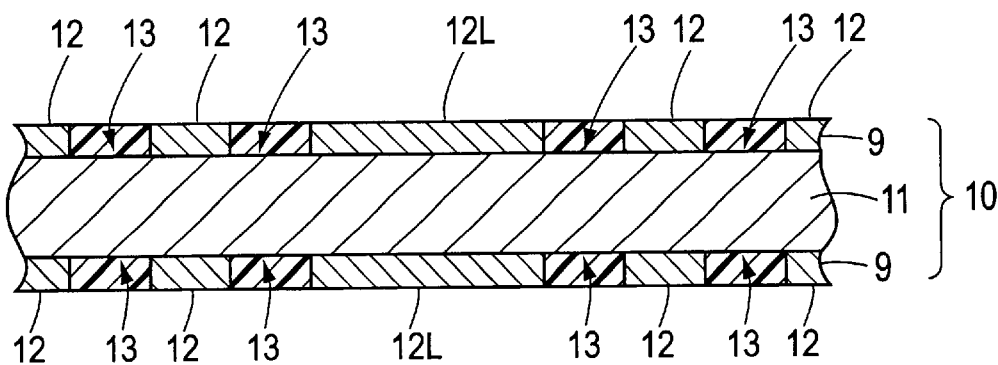

Next, FIG. 4 shows a state in which each opening 8 or 8L existing between the conductor circuits 12 is filled with resin 13 by applying and hardening electrical insulating resin 13 on the copper-clad laminate 10 shown in FIG. 3. As the quantity of the resin 13 with which each opening 8 or 8L can be filled is naturally the same in relation to any opening 8 or 8L because the space of such an opening 8 or 8L has the same volume, the quantity of the filled resin 13 overflowing from the opening 8 or 8L when resin 13 is filled is uniform in relation to any opening 8 or 8L. Such resin 13 forms a filled resin layer in each opening 8 or 8L and the thickness of the filled resin layer is equalized in relation to each opening 8 or 8L. The core material 11 is prevented from being warped by including an inorganic particle in filling resin 13 to reduce hardening and contraction. As a left solvent is vaporized in heating and causes delamination if solvent resin is used for filling resin 13, solventless resin is used.

Further, before such filling resin 13 is applied, filled resin 13 is prevented from being delaminated by oxidizing-reducing the copper-clad laminate 10 shown in FIG. 3 and roughing the surface of the core material 11 and the conductor circuit 12. After the filled resin 13 is solidified, the respective surfaces of the conductor circuit 12 and the filled resin 13 are polished so that they are smooth so as to prevent the development of via holes B1 and B2 described later and shown in FIG. 6 and the conductor circuit 17A shown in FIG. 8 from failing.

Particularly, as the state of the resin 13 solidified on the conductor circuit 12 is even in the conductor circuit 12 throughout the copper-clad laminate 10 even if resin 13 overflowing from the opening 8 or 8L overflows and is solidified on the conductor circuit 12 because the quantity of resin 13 overflowing from any opening 8 or 8L is uniform, the respective surfaces of the conductor circuit 12 and the resin 13 filled in the opening 8 or 8L can be polished so that the resin 13 overflowing from the opening 8 or 8L is not left on the conductor circuit 12 and the respective surfaces are smooth.

Further, as shown in FIG. 3 (B), a plating resist 16L for electroless plating is formed in the opening 8L so as to form conductor circuits in a mesh by electroless plating.

To secure the area required for the pad 12L to which the second conductor circuit 12 is connected, the opening 8L which is a part of the openings 8 arranged in the shape of a grid is shifted right and left in the drawings so that the area of the opening 8L is not overlapped with that of the pad 12L. In this point, this case is similar to the above case. Therefore, as the area of the opening 8L is not required to be reduced because of the existence of the pad 12L and therefore, the area of the plating resist 16L required for forming the opening 8L is not reduced, even an isolated plating resist 16L is hardly delaminated.

Figure 5:
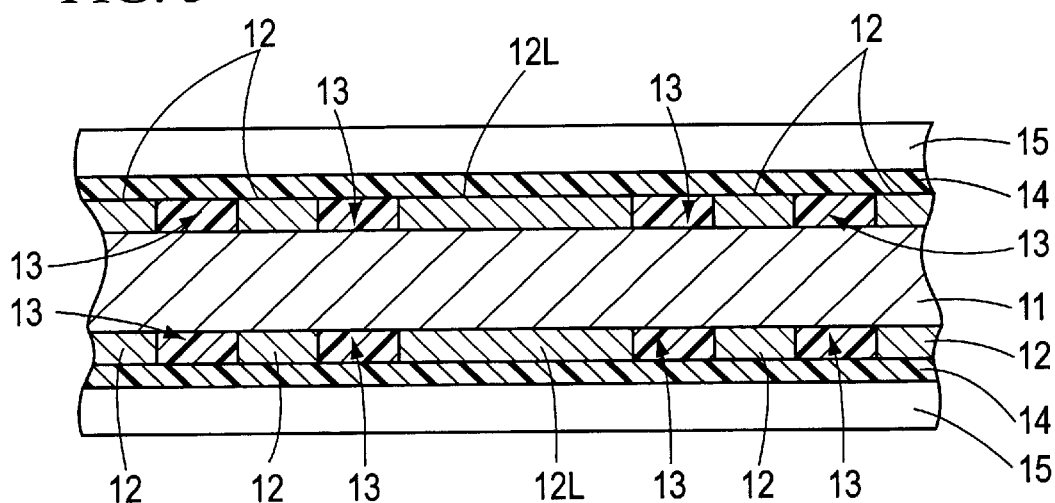

Next, as shown in FIG. 5, a first resin layer 14 consisting of resin provided with refractoriness and heat resistance to acid or an oxidizing agent is formed on the surfaces of the conductor circuit 12 and the filled resin 13 which are at the same level by polishing and similarly, a first adhesive layer 15 consisting of resin provided with refractoriness and heat resistance to acid or an oxidizing agent is formed. A resin particle not shown provided with solubility and heat resistance to acid or an oxidizing agent is dispersed in the first adhesive layer 15 so as to facilitate roughing the surface of the first adhesive layer 15 which is described later and shown in FIG. 6.

For the first resin layer 14 and the first adhesive layer 15, photosensitive thermosetting resin and a complex of photosensitive thermosetting resin and thermoplastic resin are used so as to facilitate forming via holes B1 and B2 which are described later and shown in FIG. 6. As tenacity can be enhanced when such a complex is used, the peel strength of a conductor circuit 17A and the via holes B1 and B2 which are formed in the first adhesive layer 15 and shown in FIG. 6 can be enhanced and can be prevented from being cracked because of a thermal shock. In any case, the first resin layer 14 and the first adhesive layer 15 are provided with electrical insulating property and function as an interlayer insulating layer together with the filled resin 13 shown in FIG. 4. The first resin layer 14 may be used in place of the filled resin 13 shown in FIG. 4.

Figure 6:
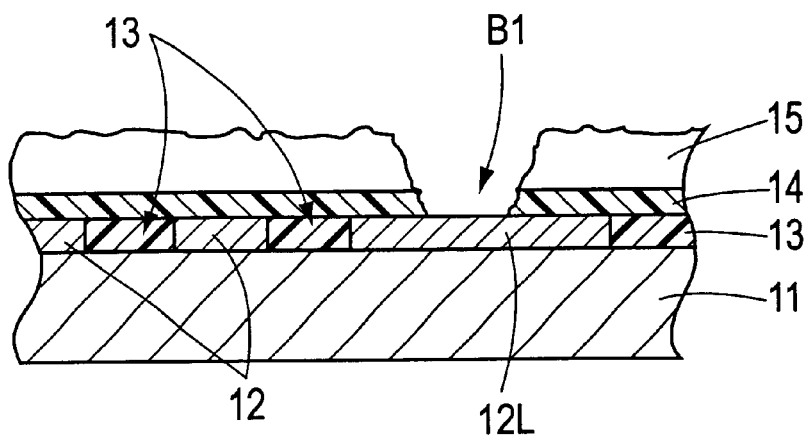

Next, as shown in FIG. 6, a photomask film not shown where a via opening in which a via hole B1 is to be formed is printed is laminated on the surface of the first adhesive layer 15 and the via opening with excellent precision in a dimension which is equivalent to the via hole B1 can be obtained by heating (postbaking) after exposure and development. From such a via opening equivalent to the via hole B1, the pad 12L which is a part of the conductor circuit 12 formed on the core material 11 is exposed. After heat treatment, the surface of the first adhesive layer 15 is roughed by removing a resin particle dispersed in the first adhesive layer 15 by acid or an oxidizing agent so as to form an anchor in the shape of an octopus trap shown in FIG. 9 and prevent delamination described later of the plating resist 16 shown in FIG. 7 and the conductor circuit 17A shown in FIG. 8.

Figure 7:
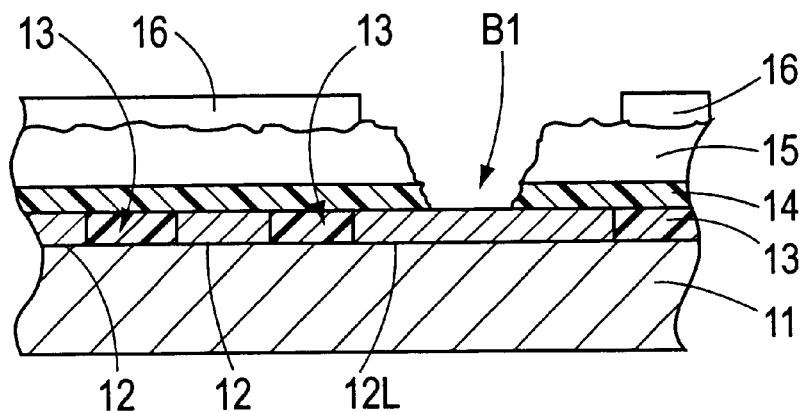

Next, as shown in FIG. 7, after a catalytic nucleus is applied to the pad 12L exposed inside the via opening equivalent to the via hole B1 and in it and the surface of the first adhesive layer 15 the surface of which is roughed, a liquid photosensitive resist is applied and dried. A catalytic nucleus is applied so as to precipitate metal in electroless plating which is described later and shown in FIGS. 8 and 9 and the liquid photosensitive resist is dried so as to solidify such a catalytic nucleus. After the liquid photosensitive resist is dried, a plating resist 16 is formed on the surface of the first adhesive layer 15 by exposure and development.

Figure 8:
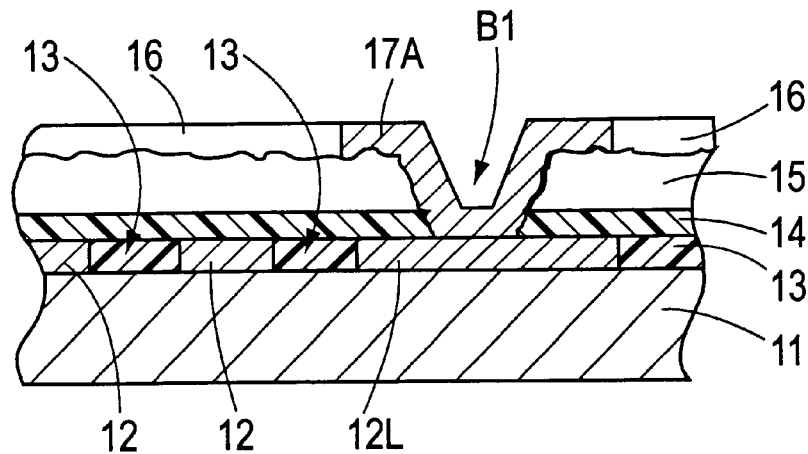
Figure 9:
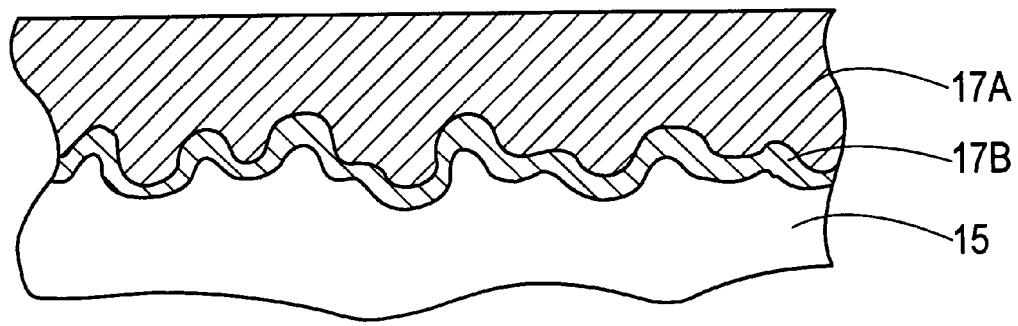

Next, as shown in FIG. 8, after the plating resist 16 is formed on the surface of the first adhesive layer 15, a plated thin film 17B shown in FIG. 9 is formed in a part in which the plating resist 16 is not formed by activation by acidic solution and primary plating by electroless plating solution. Afterward, the oxide film of the plated thin film 17B is removed by the activation of acidic solution and the pattern of the conductor circuit 17A is formed on the plated thin film 17B shown in FIG. 9 by secondary plating using electroless plating solution. Such a conductor circuit 17A is located on the conductor circuit 12 formed on the core material 11. That is, the conductor circuit 17A where the via hole B1 is formed in the via opening in the first adhesive layer 15 can be obtained. Such a via hole B1, in details the conductor circuit 17A provided with the via hole B1 is connected to the conductor circuit 12 formed on the core material 11 via the pad 12L.

FIG. 9 shows a state in which the plated thin film 17B by primary plating and the conductor circuit 17A by secondary plating are formed. To secure adhesion between the plated thin film 17B and the conductor circuit 17A formed on it, the roughed face of the first adhesive layer 15 is traced. Therefore, an anchor is formed on the surface of the plated thin film 17B as that of the first adhesive layer 15. For primary plating, two or more types of metallic ions are used and to enhance peel strength, the plated thin film 17B is constituted by an alloy. Further, the conductor circuit 17A is equivalent to electrical wiring and as the conductor circuit is required to be thick, compared with the plated thin film 17B, high electrical conductivity and a fast precipitating rate are required and therefore, one type of metallic ion is used for secondary plating.

Figure 10:
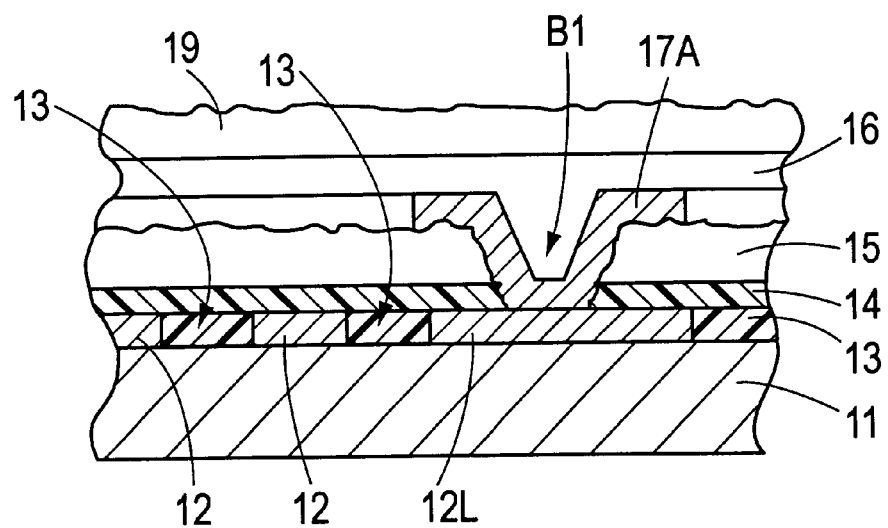

Next, as shown in FIG. 10, a second resin layer 18 consisting of the same resin as the first resin layer 14 and a second adhesive layer 19 consisting of the same resin as the first adhesive layer 15 are formed on the surface of the plating resist 16 and the conductor circuit 17A as also shown in FIG. 5 and the surface of the second adhesive layer 19 is roughed by removing a resin particle dispersed in the second adhesive layer 19 by acid or an oxidizing agent so as to form an anchor in the shape of an octopus trap. As the second resin layer 18 and the second adhesive layer 19 are provided with electrical insulating property, both function as an interlayer insulating layer.

Figure 11:
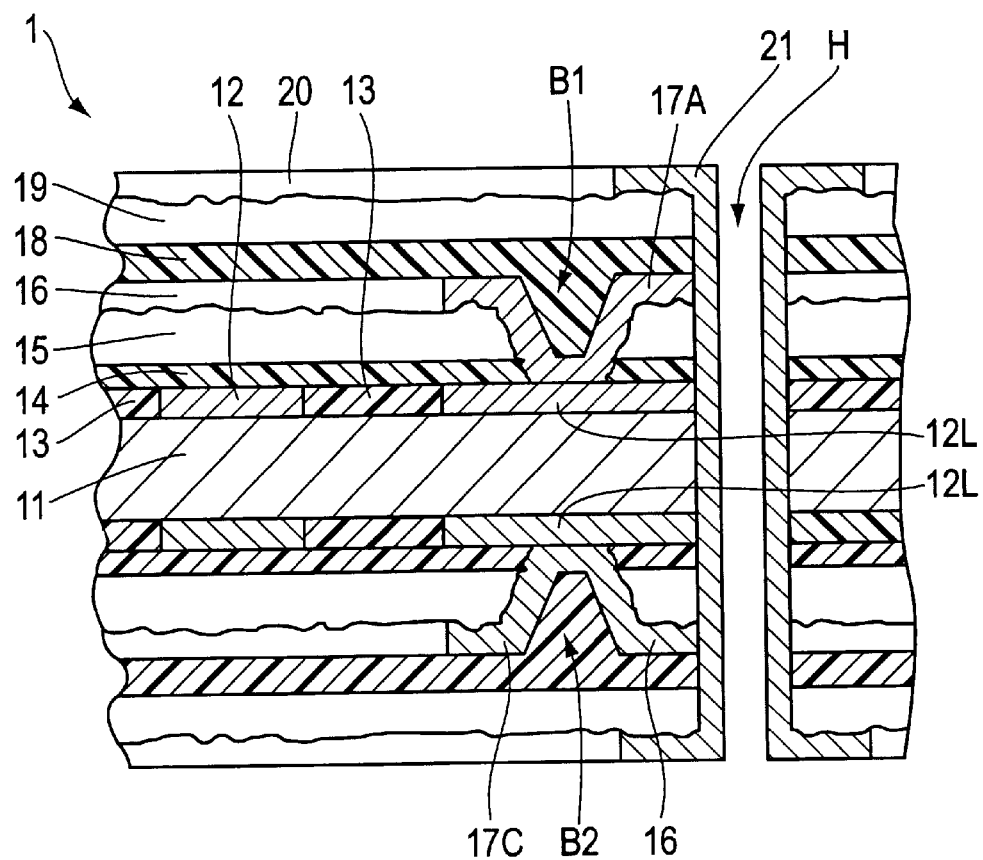

Next, as shown in FIG. 11, a hole simultaneously through the pad 12L which is a part of the conductor circuit 12 on the core material 11 and the conductor circuit 17A provided with the via hole B1 is drilled, a plating resist 20 is formed after a catalytic nucleus is applied as also shown in FIG. 7 and a multilayer printed wiring board 1 is completed by forming a through hole H provided with a hole conductor layer 21 in the vicinity of the upper and lower openings and inside the hole by secondary plating as also shown in FIG. 8.

(Embodiment)

The embodiment of the multilayer printed wiring board 1 manufactured by a fully additive process will be described below referring to FIGS. 1 to 11 which show its concrete manufacturing process.

(1) A glass epoxy copper-cad laminate is used for the copper-clad laminate 10 shown in FIG. 1.

(2) Cupric chloride etchant is used for etching shown in FIGS. 2 and 3.

The copper pattern of the conductor circuit 12 may be formed by laminating a photoresist film, exposing and developing so that the pattern is in a mesh, providing an isolated plating resist layer opposite to an opening and applying electroless plating after an adhesive layer equivalent to the first adhesive layer 15 and the second adhesive layer 19 provided with a roughed surface is formed on a base material 10 on which no copper is clad such as a glass epoxy base material, a polyimide base material, a ceramic base material, a metallic base material, a base material on which a conductor circuit is formed.

(3) Solventless epoxy resin 100 weight, silica powder (1.6 $\mu$m) 170 weight and an imidazole hardening agent 6 weight are mixed in the filled resin 13 shown in FIG. 4. Applied filling resin 13 is hardened by holding it under the temperature of 150° C. for ten hours.

Polyimide resin may be used in place of solventless epoxy resin.

(4) The composition of resin constituting the first resin layer 14 shown in FIG. 5 is produced as follows: That is, a compound of 70 weight of acryl equivalent to 25% and cresol novolac epoxy resin (manufactured by Nihon Chemical, molecular weight: 2500) dissolved in diethylene glycol dimethyl ether (DMDG), polyether sulfonate (PES) of 30 weight, an imidazole hardening agent of 4 weight (manufactured by Shikoku Chemical, trade name: 2E4MZ-CN), caprolactone denatured tris (acroxyethyl) isocyanate which is a photosensitive monomer of 10 weight (manufactured by Toa Gosei, trade name: Aronix M325), benzophenone of 5 weight (manufactured by Kanto Chemical) as an initiator and Michler's ketone of 0.5 weight (manufactured by Kanto Chemical) as a sensitizing agent are mixed adding NMP, are adjusted using a disperser so that their viscosity is 1.2 Pa·s (23±10° C.) and are kneaded by a three- roll kneader.

The adhesive solution for forming the first adhesive layer 15 shown in FIG. 5 is produced as follows: That is, a compound of 70 weight of acryl equivalent to 25% and cresol novolac epoxy resin (manufactured by Nihon Chemical, molecular weight: 2500) dissolved in diethylene glycol dimethyl ether (DMDG), polyether sulfonate (PES) of 30 weight, an imidazole hardening agent of 4 weight (manufactured by Shikoku Chemical, trade name: 2E4MZ-CN), caprolactone denatured tris (acroxyethyl) isocyanate which is a photosensitive monomer of 10 weight (manufactured by Toa Gosei, trade name: Aronix M325), benzophenone of 5 weight (manufactured by Kanto Chemical) as an initiator and Michler's ketone of 0.5 weight (manufactured by Kanto Chemical) as a sensitizing agent are mixed, an epoxy resin particle of 35 weight with the mean particle diameter of 5.5 $\mu$m (manufactured by Toray Industries, trade name: Trepal) and the epoxy resin particle of 5 weight with the mean particle diameter of 0.5 $\mu$m) are added to these mixture and mixed adding NMP, they are adjusted using a disperser so that their viscosity is 1.2 Pa·s (23±1° C.) and are kneaded by a three-roll kneader.

The composition of resin constituting the first resin layer 14 produced as described above is applied using a roll coater and dried (prebaked) at the temperature of 60° C. after leaving it for 20 minutes in a horizontal state. The adhesive solution of the first adhesive layer 15 produced as described above is also similarly applied using a roll coater and dried (prebaked) at the temperature of 60° C. after leaving it for 20 minutes in a horizontal state.

Epoxy resin is used for the above first resin layer 14 and the above first adhesive layer 15, however, in addition, thermosetting resin such as polyimide resin, bismaleimide-triazine resin and phenol resin and photosensitive resin of these, thermoplastic resin such as polyether sulfonate, a complex of thermoplastic resin and thermosetting resin and a complex of photosensitive resin and thermoplastic resin may be used. Epoxy acrylate generated by reacting epoxy resin with acrylic acid or methacrylic acid and a complex of epoxy acrylate and polyether sulfonate are desirable out of these. It is desirable that such epoxy acrylate is obtained by reacting 20 to 80% of all epoxy radicals with acrylic acid or methacrylic acid.

Further, It is desirable that a resin particle for the first adhesive layer 15 is selected out of (1) heat-resistant resin powder 10 $\mu$m or less in a mean particle diameter, (2) a condensed particle generated by condensing heat-resistant resin powder 2 $\mu$m or less in a mean particle diameter, (3) a mixture of heat-resistant resin powder 10 $\mu$m or less in a mean particle diameter and heat-resistant resin powder 2 $\mu$m or less in a mean particle diameter and (4) a psuedoparticle generated by depositing at least one of heat-resistant resin powder 2 $\mu$m or less in a mean particle diameter and/or inorganic powder on the surface of heat-resistant resin powder 2 to 10 $\mu$m in a mean particle diameter. It is because these can form a complicated anchor that these are used.

In this embodiment, epoxy resin is used for a resin particle for the first adhesive layer 15, however, amino resin such as melamine resin, urea resin and guanamine resin may be also used and these is soluble in chromic acid or phosphoric acid. The solubility of epoxy resin in acid or an oxidizing agent can be arbitrarily changed by changing the type of its oligomer, the type of a hardening agent and bridge density. For example, bisphenol A epoxy resin oligomer processed by an amino hardening agent is readily soluble in an oxidizing agent. However, attention is required to be paid to it that novolac epoxy resin oligomer processed by an imidazole hardening agent is hardly soluble in an oxidizing agent.

(5) In exposure shown in FIG. 6, after the base material is exposed using an ultra-high pressure mercury lamp 400 mj/cm², it is further exposed at approximately 3,000 mj/cm² using an ultra-high pressure mercury lamp. In development, triethylene glycol dimethyl ether (DMTG) is used. In heat treatment (postbaking), the base material is held at the temperature of 150° C. for five hours. The first resin layer 14 and the first adhesive layer 15 can be formed so that each is 50 $\mu$m thick by the above processing. In processing for roughing the surface, the base material is dipped in chromic acid of 70° C. for 20 minutes, epoxy resin which is a resin particle for the first adhesive layer 15 is dissolved in chromic acid and removed and the roughed surface where a large number of minute anchors are formed is formed.

In this embodiment, chromic acid is used for an oxidizing agent, however, it is desirable that for acid, organic acid such as phosphoric acid, hydrochloric acid, sulfuric acid, formic acid and acetic acid is used. It is because if surface roughing processing is performed, the conductor circuit 12A exposed from the via opening equivalent to the via holes B1 and B2 is hardly corroded. For the other oxidizing agent, permanganate (potassium permanganate) is desirable.

(6) The catalytic nucleus shown in FIG. 7 is beforehand processed in the solution of $PdCl_2.2H_2O$ 0.2 g/l, $SnCl_2,2H_2O$ 15 g/l or HCl 30 g/l. For liquid photosensitive resist, liquid photosensitive resist on the market is used and applied so that a layer is 30 $\mu$m thick. The plating resist 16 is formed so that the width is 50 $\mu$m.

For a catalytic nucleus, a noble metal ion and colloid are desirable, however, palladium chloride and palladium colloid may be used.

For liquid photosensitive resist, a composition consisting of epoxy acrylate generated by reacting epoxy resin with acrylic acid or metacrylic acid and an imidazole hardening agent and a composition consisting of epoxy acrylate, polyether sulfonate and an imidazole hardening agent may be used. It is desirable that the ratio of epoxy acrylate and polyether sulfonate is approximately 50 to 50 to 80 to 20, it is because if epoxy acrylate is too much, flexibility is reduced and if it is too small, the characteristics of photosensitivity, resistance to a base, resistance to acid and resistance to an oxidizing agent are deteriorated.

It is desirable that epoxy acrylate is generated by reacting 20 to 80% of all epoxy radicals with acrylic acid or metacrylic acid. It is because when the degree of acryloylation is too high, hydrophilic property by a hydroxyl group is high and hygroscopicity is enhanced, while when the degree of acryloylation is too low, resolution is deteriorated. Further, it is desirable that for epoxy resin which is basic resin, novolac epoxy resin is desirable. It is because bridge density is high, the absorption coefficient of the hardened can be adjusted to 0.1% or less and resistance to a base is excellent. For novolac epoxy resin, there are cresol novolac resin and phenol novolac resin.

(7) Activation shown in FIG. 8 is performed in sulfuric solution of 100 g/l. Primary plating is performed in electroless copper-nickel alloy plating bath provided with the following composition. The temperature of the plating bath is 60° C. and the time of dipping in the plating bath is one hour.

Metallic salt . . . $CuSO_4.5H_2O$ ; 6.0 mM (1.5 g/l)
. . . $NiSO_4.6H_2O$ ; 95.1 mM (25 g/l)
Complexing agent . . . $Na_3C_6H_5O_7$; 0.23 M (60 g/l)
Reducing agent . . . $NaPH_2O_2.H_2O$ ; 0.19 M (20 g/l)
pH modifier . . . NaOH; 0.75 M (pH=9.5)
Stabilizer . . . Nitrate; 0.2 mM (80 ppm)
Surface active agent; 0.05 g/l
The rate of precipitation is 1.7 $\mu$m/hour.

A copper-nickel-phosphorus plated thin film 17B approximately 1.7 $\mu$m thick is formed in a part in which the resist 16 is not formed by performing primary plating under the conditions described above. Afterward, the base material is lifted out of the plating bath and plating bath which adheres on-the surface is washed away by water.

Further, the oxide film of the copper-nickel-phosphorus plated thin film 17B is removed by activation using acid solution. Afterward, secondary plating is applied to the copper-nickel-phosphorus plated thin film 17B without substituting palladium. For plating bath for secondary plating, plating bath provided with the following composition is used. The temperature of plating bath is 50 to 70° C. and the time of dipping in plating is 90 to 360 minutes.

Metallic salt . . . $CuSO_4.5H_2O$; 8.6 mM

Complexing agent . . . TEA; 0.15 M

Reducing agent . . . HCHO; 0.02 M

Others . . . Stabilizer such as bipyridyl and potassium ferrocyanide a little bit The precipitation rate is 6-m/hour.

The conductor circuit 17A is formed on the plated thin film 17B by performing secondary plating under the above conditions. Afterward, the base material is lifted out of plating bath and plating bath which adheres on the surface is washed away by water.

For primary plating, at least two metallic ions of copper, nickel, cobalt and phosphorus are required to be used and it is because the strength of these alloys is high and peel strength can be enhanced. A copper ion, a nickel ion and a cobalt ion are procured by dissolving a copper compound, a nickel compound and a cobalt compound such as copper sulfate, nickel sulfate, cobalt sulfate, copper chloride, nickel chloride and cobalt chloride. It is desirable that electroless plating solution includes bipyridyl. It is because bipyridyl can prevent metallic oxide from being generated in plating bath and can prevent a nodule from being generated.

For a complexing agent, hydroxycarboxylic acid is used and it is because it forms a stable complex with a copper ion, a nickel ion and a cobalt ion under the condition of basicity. For hydroxycarboxylic acid, citric acid, malic acid, tartaric acid and others are desirable. It is desirable that the concentration of hydroxycarboxylic acid is 0.1 to 0.8 M. If the concentration is smaller than 0.1 M, a satisfactory complex cannot be formed and abnormal precipitation and the decomposition of liquid are caused. If the concentration exceeds 0.8, problems that the rate of precipitation is slow and hydrogen is often generated are caused.

To reduce a metallic ion to a metallic element, a reducing agent is used and it is desirable that at least one of aldehyde, hypophosphite (called phosphinate), hydrobonate and hydrazine is selected for a reducing agent. It is because these reducing agents are water soluble and excellent in reducing power. If hypophosphite is used, nickel can be precipitated.

For a pH modifier, at least one of sodium hydroxide, potassium hydroxide and calcium hydroxide is required to be selected and these are all a basic compound. It is because it forms a complex with a nickel ion and others under the condition of basicity that hydroxycarboxylic acid is used.

For secondary plating, the base material may be also dipped in the following electroless plating solution. That is, the electroless plating solution consisting of a copper ion, trialkanolamine, a reducing agent and a pH modifier is characterized in that the concentration of a copper ion is 0.005 to 0.015 mol/l, that of a pH modifier is 0.25 to 0.35 mol/l and that of a reducing agent is 0.01 to 0.04 mol/l. This plating bath is stable and a nodule is hardly generated. It is also desirable that the concentration of trialkanolamine is 0.1 to 0.8 M. It is because plating precipitating reaction fastest progresses in this range.

It is desirable that for the above trialkanolamine, at least one of triethanolamine, triisopanolamine, trimethanolamine and tripropanolamine is selected. It is because they are water soluble. It is desirable that for a reducing agent, at least one of aldehyde, hypophosphite, hydrobonate and hydrazine is selected. It is because they are water soluble and have reducing power under the condition of basicity. Further, it is desirable that for a pH modifier, at least one of sodium hydroxide, potassium hyrdoxide and calcium hydroxide is selected.

(8) As shown in FIG. 10, a second resin layer 18 consisting of the same material as that of the first resin layer 14 and a second adhesive layer 19 consisting of the same material as that of the first adhesive layer 15 are formed on the surface of the plating resist 16 and the conductor circuit 17A as described in (4) shown in FIG. 5. The surface of the second adhesive layer 19 is roughed by removing a resin particle dispersed in the second adhesive layer 19 and an anchor in the shape of an octopus trap is formed as described in (5) shown in FIG. 6.

(9) As shown in FIG. 11, after a catalytic nucleus is applied, a plating resist 20 is formed as described in (6) shown in FIG. 7, secondary plating is performed as described in (7) shown in FIG. 8, a through hole H provided with a hole conductor layer 21 is formed and the multilayer printed wiring board 1 is completed.

(Comparative Example)

A comparative example is basically similar to an embodiment, however, a multilayer printed wiring board 1 wherein for the conductor circuit 12 formed out of the copper layer 9 of the copper-clad laminate 10, the opening 8L which is a part of the openings 8 arranged in the shape of a grid is not shifted as in the first embodiment but the area of the opening 8 around the pad 12L is reduced as in the prior art to secure area required to the pad 12L connected to the conductor circuit 17A on the conductor circuit 12, therefore the pattern of the conductor circuit 12 is in a mesh and the openings are arranged in the shape of a grid, however, the space of the opening around the pad 12L is smaller than that in another multilayer printed wiring board is manufactured.

As a result of the continuity test of the conductor circuits 12 and 17A in the multilayer printed wiring board 1, there is no problem in conduction between the conductor circuits in the multilayer printed wiring board 1 equivalent to the first embodiment, however, conduction between the conductor circuits in the multilayer printed wiring board 1 in the comparative example cannot be verified.

When the pad 12L of the conductor circuit 12 in the multilayer printed wiring boards 1 in the first embodiment and in the comparative example is observed with an optical microscope, the filled resin 13 is left on the pad 12L of the conductor circuit 12 for connecting the conductor circuits 12 and 17A in the multilayer printed wiring board 1 in the comparative example. In the meantime, in the multilayer printed wiring board 1 equivalent to the first embodiment, no filled resin 13 cannot be verified on the pad 12L of the conductor circuit 12 for connecting the conductor circuits 12 and 17A which is equivalent to the same location as the above-described.

It is presumed because the multilayer printed wiring board 1 in the comparative example, as the filled resin 13 with an electrical insulating property is left on the pad 12L of the conductor circuit 12, it exists between the conductor circuits 12 and 17A, the area of a connection between the conductor circuits 12 and 17A is remarkably reduced and as a result, the connection between the conductor circuits 12 and 17A is disconnected and the conductor circuits 12 and 17A are electrically insulated.

As described in details above, as in the multilayer printed wiring board 1 equivalent to the first embodiment, the opening 8L existing around the pad 12L which is a photovia land is arranged so that it is not overlapped with the area of the pad 12L and therefore, the area of the opening 8L existing around the pad 12L and that of another opening 8 are equal, the quantity of resin 13 filled in each opening 8 or 8L is equal throughout the printed wiring board 1, in other words, the quantity of resin 13 overflowing from each opening 8 or 8L when each opening 8 or 8L is filled with resin 13 can be uniformed in relation to any opening 8.

Hereby, the thickness of a filled resin layer formed by filling each opening 8 with resin is substantially equal, a state in which the filled resin 13 overflowing from each opening 8 or 8L is overflowed on the conductor circuit 12 can be even throughout the printed wiring board 1 and when the respective surfaces of the conductor circuit 12 and the pad 12L are polished so that they are smooth, it is not caused that the filled resin 13 overflowing from the opening 8L around the pad 12L is left on the pad 12L. As a result, when the adhesive layer 15 is formed on the printed wiring board 1 and the conductor circuit 17A provided on the adhesive layer 15 and the pad 12L are connected, they can be securely connected without causing disconnection.

Particularly, the pattern of the conductor circuit 12 formed in the copper layer 9 stuck on the double sides of the core material 11 is in a mesh, therefore any opening 8 or 8L formed on the surface of the copper layer 9 is provided with fixed area and arranged in the shape of a grid, when area required for the pad 12L to which the conductor circuit 17A on the conductor circuit 12 is connected cannot be secured on the surface of the copper layer 9, that is, the conductor circuit 12 which is a pattern in a mesh, the area required for the pad 12L on the conductor circuit 12 can be secured by forming the conductor circuit 12 in the shape of the pattern in a mesh where a part of the openings 8 and 8L arranged in the shape of a grid is shifted without reducing the area of a part of the openings 8 and 8L to secure the required area on the pad 12L, the surface of the filled resin 13 filled in the openings 8 and 8L can be polished so that it is smooth, the conductor circuits 12 and 17A can be connected in the pad 12L in which the conductor circuits 12 and 17A are connected without the filled resin 13 existing between the conductor circuits 12 and 17A and the conductor circuits 12 and 17A can be prevented from being disconnected.

The present invention is not limited to the above first embodiment and a variety of changes are allowed as long as the effect is not deviated.

For example, the form of the openings 8 and 8L is square in the above first embodiment as shown in FIG. 2, however, if area required for the pad 12L is secured in the conductor circuit 12 and the area of each opening 8 or 8L is equal, the opening may be in any shape. Similarly, the form of each opening 8 or 8L is not required to be equal and as a result, the pattern of the conductor circuit 12 is not required to be in a mesh.

(Second Embodiment)

Figure 12A:
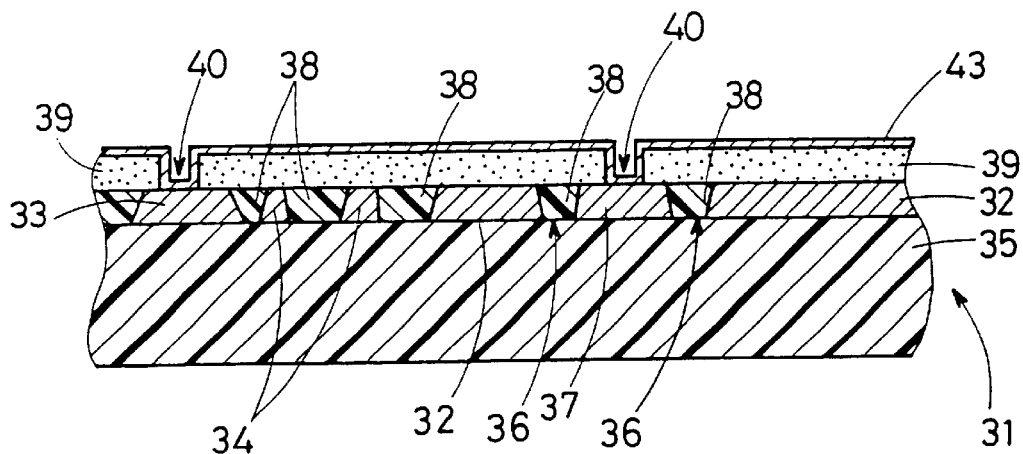
FIGS. 12 to 16 are explanatory drawings showing a printed wiring board equivalent to a second embodiment and its manufacturing method, FIG. 12 are sectional views showing the printed wiring board.
Figure 12B:
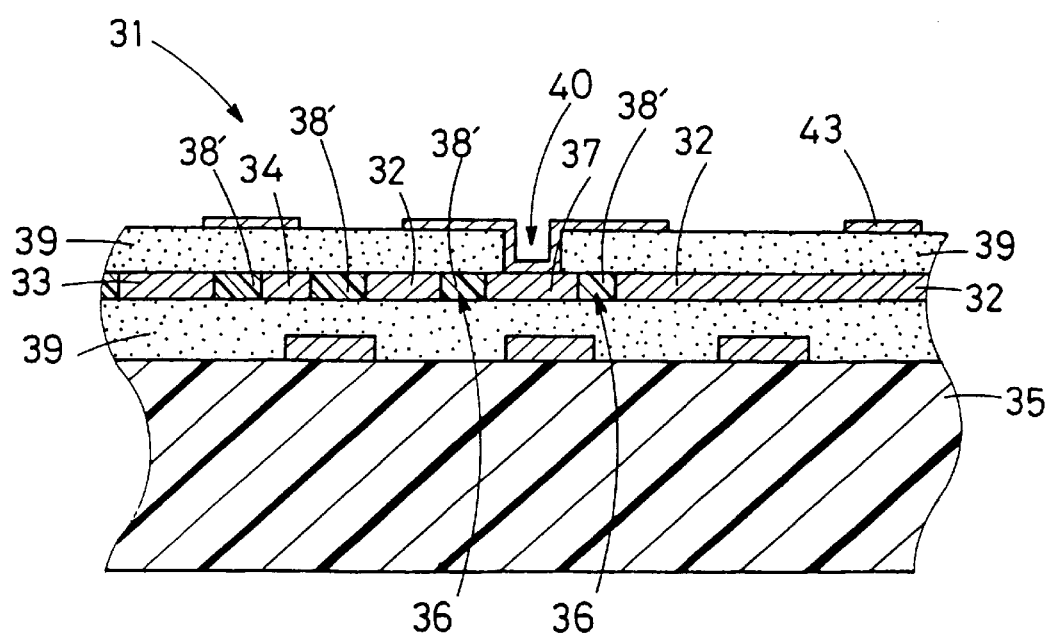

Next, a printed wiring board and its manufacturing method equivalent to a second embodiment will be described referring to FIGS. 12 to 16. First, the structure of the printed wiring board equivalent to the second embodiment will be described referring to FIGS. 12 (A), 12 (B) and 13. FIGS. 12 are sectional views showing the printed wiring board and FIG. 13 is a plan showing the printed wiring board.

Figure 13:
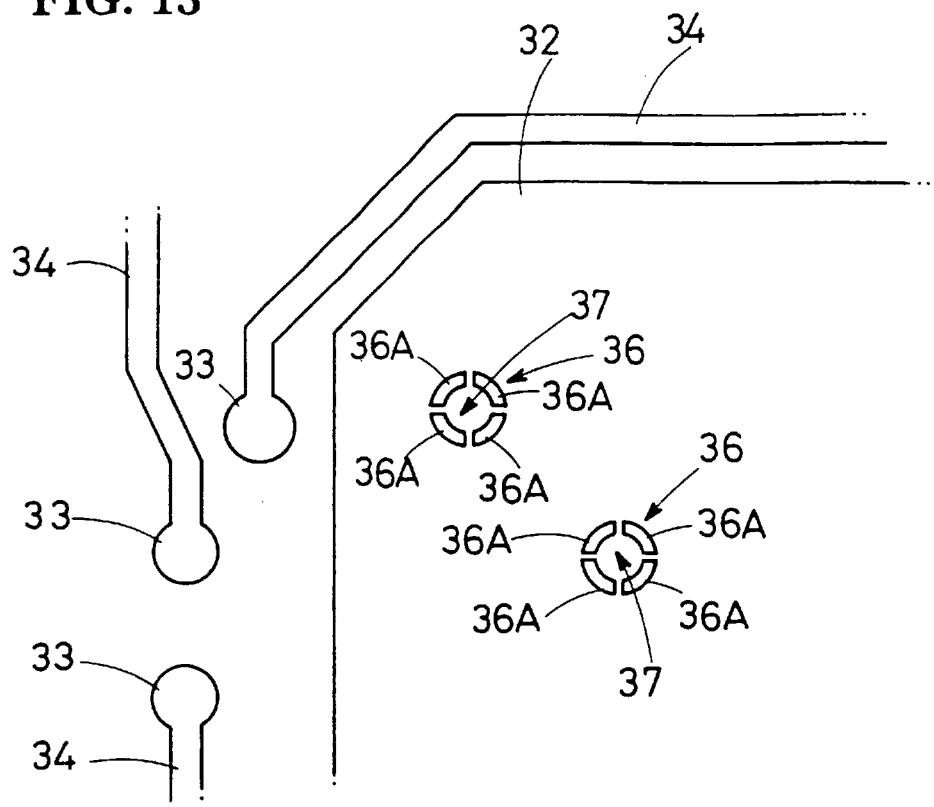

As shown in FIGS. 12 and 13, a printed wiring board 31 is constituted by a base material 35 on which a metallic area 32 with large area such as a power plane and a ground plane, a connecting pad 33 with normal area which is smaller than the area of the metallic area 32 and a predetermined circuit pattern are formed as a core. In this embodiment, a copper-clad clad laminate where copper foil is laminated on the single side or the double sides of the base material 35 is used and the metallic area 32, the connecting pad 33 and the circuit pattern 34 are formed on the single side or the double sides by applying predetermined etching to the copper-clad laminate.

For the base material 35, a base material wherein after an adhesive layer for electroless plating is formed on a glass epoxy base material, a polyimide base material, a ceramic base material or a metallic base material, the roughed surface is formed by roughing the adhesive layer, electroless plating is applied to the adhesive layer and a copper circuit pattern is formed may be also used.

As shown in FIG. 13, a blank portion 36 is formed in plural locations in the metallic area 32. Such a blank portion 36 is formed by etching simultaneously when the metallic area 32 is formed and is a part in which no conductor (copper foil) exists in the metallic area 32 and which exists outside a part coated with the mask area 42 of a mask film 41 when the mask film 41 is stuck on a postinterlayer insulating layer 39 which forms an interlayer insulating layer 39 as described later and the postinterlayer insulating layer 39 is exposed. When the interlayer insulating layer 39 is exposed via the mask film 41, light radiated through the mask film 41 to the interlayer insulating layer 39 in the vicinity of the mask area 42 is prevented from being dispersed via the blank portion 36 by forming the blank portion 36 as described above, hereby light is prevented from being incident to the interlayer insulating layer 39 existing under the mask area 42 and the processing for preventing the interlayer insulating layer 39 under the mask area 42 from being exposed can be securely executed. This point will be described later.

The form of the blank portion 36 will be described in details referring to FIG. 13. As shown in FIG. 13, the blank portion 36 is constituted by four arc-shaped window parts 36A into which a circular window with predetermined width is divided. A conductor 37 partitioned by the inner circle and separated from the metallic area 32 by the blank portion 36 is formed so that the area of the conductor is larger than that of the mask area 42 of the mask film 41 and the center of the conductor 37 is coated with the mask film via the mask area 42 with the mask film 41 stuck on the interlayer insulating layer 39. It is desirable that the diameter of the inner circle of the blank portion 36 is 125 to 350 $\mu$m, the diameter of the outer circle is 225 to 800 $\mu$m and an interval between the windows 36A is approximately 50 to 250 $\mu$m.

Figure 15:
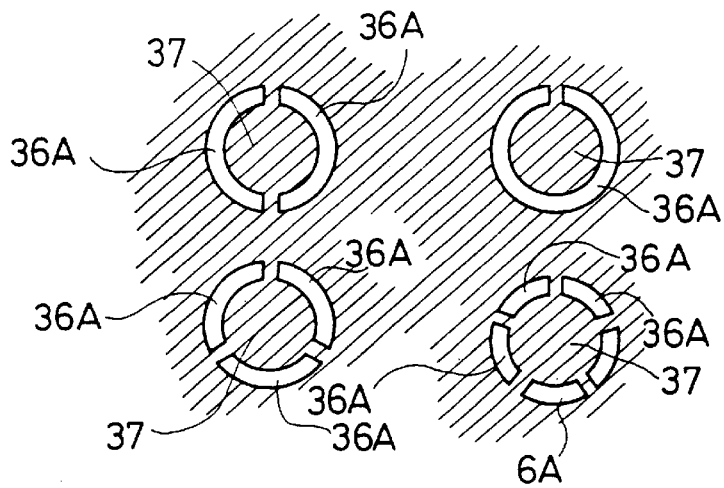
Figure 15:
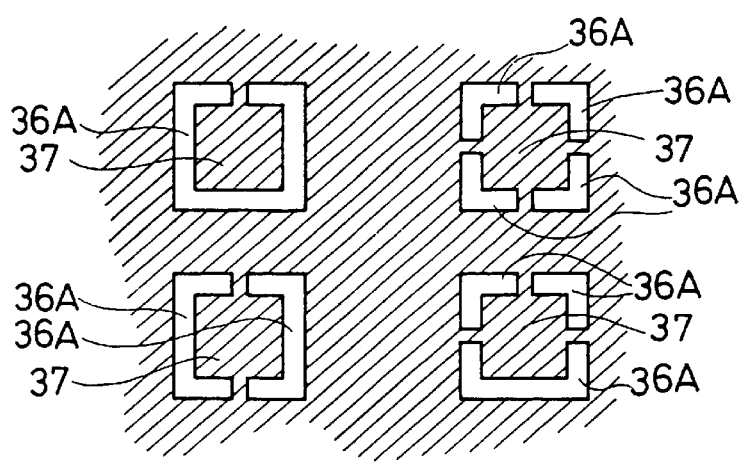
Figure 15:
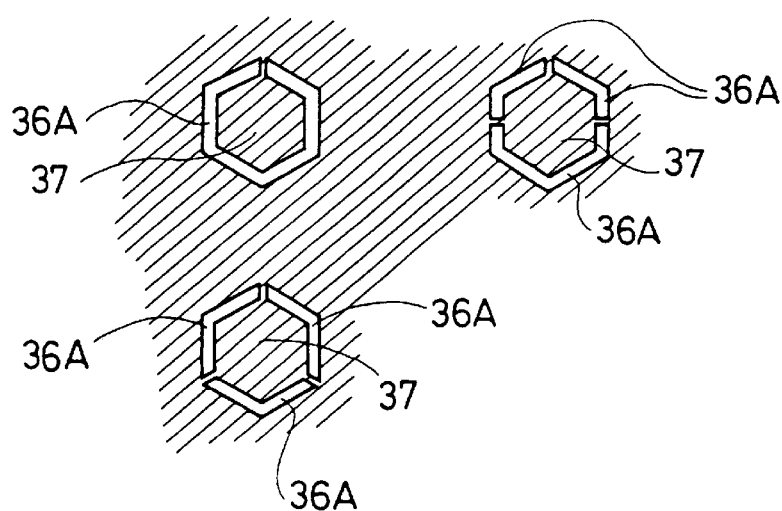

For the form of the blank portion 36, variations are further conceivable. The variations of the blank portion 36 will be described referring to FIG. 15. FIG. 15 is an explanatory drawing showing the variations of the blank portion 36.

For an example in which a blank portion is basically constituted by a circular window, as shown in FIG. 15, a blank portion which is constituted by two window parts 36A into which a circular window is divided around the conductor 37 (a blank portion 36 located in the upper left part in FIG. 15(A)), a blank portion which is constituted by one arc-shaped window part 36A around the conductor 37 (a blank portion 36 located in the upper right part in FIG. 15(A)), a blank portion which is constituted by three window parts 36A into which a circular window is divided around the conductor 37 (a blank portion 36 located in the lower left part in FIG. 15(A)) and a blank portion which is constituted by five window parts 36A into which a circular window is divided around the conductor 37 (a blank portion 36 in the lower right part in FIG. 15(A)) are conceivable.

For an example in which a blank portion is basically constituted by a square window, as shown in FIG. 15(B), a blank portion which is constituted by one square window part 36A around the square conductor 37 (a blank portion 36 located in the upper left part in FIG. 15(B)), a blank portion which is constituted by four window parts 36A into which a square window is divided around the square conductor 37 (a blank portion 36 located in the upper right part in FIG.

15(B)), a blank portion which is constituted by two window parts 36A into which a square window is divided around the square conductor 37 (a blank portion in the lower left part in FIG. 15(B)) and a blank portion which is constituted by three window parts 36A into which a square window is unevenly around the square conductor 37 (a blank portion 36 located in the lower right part in FIG. 15(B)) are conceivable.

Further, for an example in which a blank portion is basically constituted by a hexagonal window, as shown in FIG. 15(C), a blank portion which is constituted by one hexagonal window part 36A around the hexagonal conductor 37 (a blank portion located in the upper left part in FIG. 15(C)), a blank portion which is constituted by three window parts 36A into which a hexagonal window is unevenly divided around the hexagonal conductor 37 (a blank portion located in the upper right part in FIG. 15(C)) and a blank portion which is constituted by three window parts 36A into which a hexagonal window is divided around the hexagonal conductor 37 (a blank portion located in the lower left part in FIG. 15(C)) are conceivable.

In the base material 35, filling resin is filled in each blank portion 36, between the metallic area 32 and the circuit pattern 34, between the circuit patterns 34 and between the connecting pad 33 and the circuit pattern 34 and a filled resin layer 38 is formed. Such a filled resin layer 38 is formed so that the surface of the filled resin layer is equal in a level to each surface of the metallic area 32, the connecting pad 33 and the circuit pattern 34 and each surface of the filled resin layer 38, the metallic area 32, the connecting pad 33 and the circuit pattern 34 constitutes one surface. Hereby, the interlayer insulating layer 39 described later can be formed so that the thickness is uniform.

For the above filling resin, solventless resin is desirable and epoxy resin is suitable. It is because if heat treatment is performed when a solvent is left in the filled resin layer 38, the peeling of the filled resin layer 38 is caused that solventless resin is desirable. If an inorganic particle such as silica is added to filling resin, the hardening and contraction of the filled resin layer 38 can be reduced and the base material 35 can be prevented from being warped.

If the metallic 32, the connecting pad 33, the circuit pattern 34 and others are formed on an interlayer agent, a plating resist is respectively formed between the metallic area 32 and the circuit pattern 34 and between the connecting pad 33 and the circuit pattern 34.

The upper surface of the plating resist constitutes one surface together with the upper surface of the metallic are 32, the connecting pad 33 and the circuit pattern 34. Therefore, the interlayer insulating layer 39 can be formed so that the thickness is uniform. The surface of the plating resist may be polished by a hand stroke belt sander and others so that the upper surface of the plating resist constitutes one surface together with the upper surface of the metallic area 32, the connecting pad 33 and the circuit pattern 34.

As described above, an interlayer insulating layer 39 is applied and formed on each upper surface of the metallic area 32, the connecting pad 33, the circuit pattern 34 and the filled resin layer 36 or a plating resist layer 38' which constitute one surface. As the filled resin layer 38 or the plating resist layer 38' is formed between blank portions 36, between the metallic area 32 and the circuit pattern 34, between the circuit patterns 34 and between the connecting pad 33 and the circuit pattern 34 and each upper surface constitutes one surface as described above when such an interlayer insulating layer 39 is applied and formed, the interlayer insulating layer 39 can be uniformly applied and formed. The interlayer insulating layer 39 can be applied and formed using a variety of photosensitive resin and for example, for resin material for forming the interlayer insulating layer 39, an adhesive for electroless plating is suitable. For an adhesive for electroless plating, an adhesive generated by dispersing a heat-resistant resin particle soluble in acid or an oxidizing agent in heat-resistant resin refractory in acid or an oxidizing agent can be used. The adhesive for electroless plating is provided with the same composition as an adhesive described in Japanese published examined patent applications No. Hei 4-55555, No. Hei 5- Hei 18476 and No. Hei 7-34505.

For an adhesive for electroless plating, an adhesive generated by dispersing a heat-resistant resin particle soluble in acid or an oxidizing agent in heat-resistant resin refractory in acid or an oxidizing agent is suitable. It is because an anchor in the shape of an octopus trap can be formed on the surface by roughing and removing a heat-resistant resin particle soluble in acid or an oxidizing agent and the adhesion to a conductor circuit can be improved.

For heat-resistant resin refractory in acid or an oxidizing agent, photosensitive thermosetting resin and a complex of photosensitive thermosetting resin and thermoplastic resin are desirable. It is because a via hole can be readily formed by exposure and development by being photosensitive. The tenacity can be enhanced by compounding thermoplastic resin, the peel strength of a conductor circuit can be enhanced and a via hole can be prevented from being cracked in a heat cycle.

In the concrete, epoxy acrylate generated by reacting epoxy resin with acrylic acid or metacrylic acid and a complex of epoxy acrylate and polyether sulfonate are desirable.

It is desirable that epoxy acrylate is generated by reacting 20 to 80% of all epoxy radicals with acrylic acid or metacrylic acid.

Further, it is desirable that the above heat-resistant resin particle is selected out of (1) heat-resistant resin powder the mean particle diameter of which is 10 $\mu$m or less, (2) a condensed particle into which heat-resistant resin powder the mean particle diameter of which is 2 $\mu$m or less is condensed, (3) a mixture of heat-resistant resin powder the mean particle diameter of which is 10 $\mu$m or less and heat-resistant resin powder the means particle diameter of which is 2 $\mu$m or less and (4) a psuedoparticle generated by depositing at least one of heat-resistant resin powder the mean particle diameter of which is 2 $\mu$m or less and/or inorganic powder on the surface of heat-resistant resin powder the mean particle diameter of which is 2 to 10 $\mu$m. It is because these can form a complicated anchor.

For a heat-resistant resin particle, epoxy resin and amino resin such as melamine resin, urea resin and guanamine resin are desirable.

The solubility of epoxy resin in acid or an oxidizing agent can be arbitrarily changed by changing the type of its oligomer, the type of a hardening agent and bridge density.

For example, bisphenol A epoxy resin oligomer processed by an amino hardening agent is readily soluble in an oxidizing agent. However, attention is required to be paid to it that novolac epoxy resin oligomer processed by an imidazole hardening agent is hardly soluble in an oxidizing agent.

In this second embodiment, phosphoric acid, hydrochloric acid and sulfuric acid or organic acid such as formic acid and acetic acid are used, however, particularly, organic acid is desirable. It is because if surface roughing processing is performed, a metallic conductor layer exposed from a via hole is hardly corroded.

For an oxidizing agent, chromic acid and permanganate (potassium permanganate) are desirable.

Particularly, it is desirable that if amino resin is dissolved and removed, roughing alternately by acid or an oxidizing agent is desirable.

In this second embodiment, plural interlayer insulating layers may be also provided. If plural interlayer insulating layers are provided, there are the following types:

1) two-layer structure consisting of interlayer insulating layers provided between the upper and lower conductor circuits in which an adhesive for electroless plating generated by dispersing a heat-resistant resin particle soluble in acid or an oxidizing agent in heat-resistant resin refractory in acid or an oxidizing agent is provided on the side of the upper conductor circuit and heat-resistant resin refractory in acid or an oxidizing agent is provided on the side of the lower conductor circuit.

According to this constitution, even if roughing is excessive in roughing an adhesive layer for electroless plating, a short circuit between layers can be prevented from being caused.

2) three-layer structure consisting of interlayer insulating layers provided between the upper and lower conductor circuits in which filling resin material is filled between the interlayer insulating layer and the lower conductor circuit, the respective surfaces of the lower conductor circuit and this filled rein material are equalized in a level, a heat-resistant resin layer refractory in acid or an oxidizing agent is formed on it, further an adhesive for electroless plating generated by dispersing a heat-resistant resin particle soluble in acid or an oxidizing agent in heat- resistant resin refractory in acid or an oxidizing agent is formed on it.

Further, in the above interlayer insulating layer 39, a via hole 40 is formed opposite to the conductor 37 surrounded by each window part 36A of a blank portion 36 and the connecting pad 33. Such a via hole 40 is formed by performing predetermined development after light is radiated from over a mask film 41 by a light source for exposure with the mask film 41 stuck on the interlayer insulating layer 39 so that the mask area 42 of the mask film 41 is opposite to the conductor 37 and the connecting pad 33. As development is performed by a well-known method, detailed description is omitted.

Figure 14:
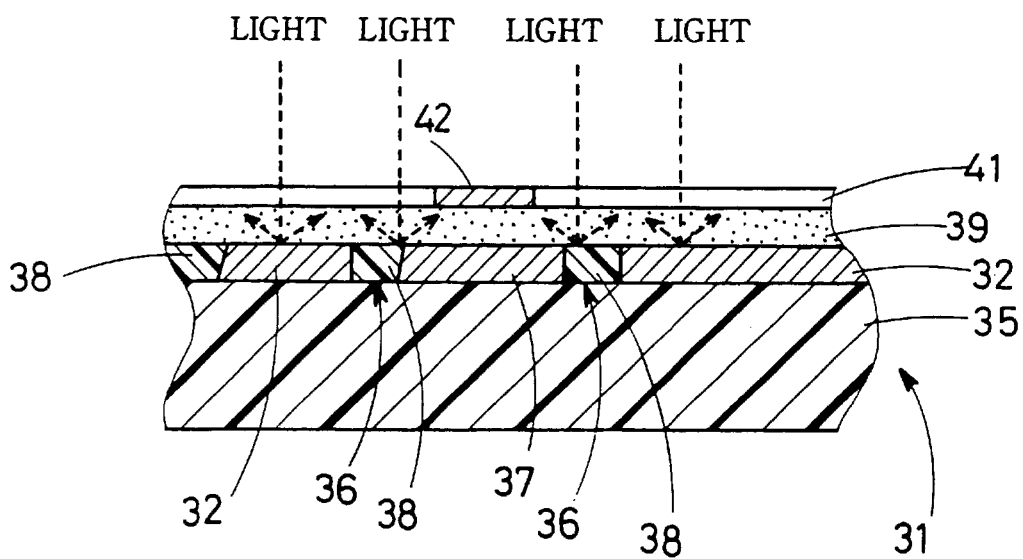

The action of the blank portion 36 when the interlayer insulating layer 39 is exposed will be described referring to FIG. 14. FIG. 14 is an enlarged partial sectional view schematically showing a state in which the interlayer insulating layer 39 on the metallic area is exposed.

To expose the interlayer insulating layer 39, first, the mask film 41 is stuck on the interlayer insulating layer 39 so that the mask area 42 of the mask film 41 is opposite to the conductor 37 surrounded by each window part 36A of the blank portion 36 formed in the metallic area 32. In this state, as shown in FIG. 14, light is radiated from over the mask film 41 and the interlayer insulating layer 39 is exposed. In such exposure, as the mask film 41 is formed so that it is transparent except the black mask area 42, radiated light is blocked by the mask area 42, is transmitted through the mask film 41 in a part except the mask area 42 and reaches the interlayer insulating layer 39. Hereby, a part of the interlayer insulating layer 39 coated with the mask area 42 is not hardened and is held unhardened and in the meantime, the other part of the interlayer insulating layer 39 which is not coated with the mask area 42 is hardened by light.

At this time, as the interlayer insulating layer 39 is uniformly applied and formed on the surface of the metallic area 32 and the filled resin layer 38, the interlayer insulating layer 39 can be exposed at satisfactory exposure resolution on the boundary of the mask film 41 and the mask area 42. A blank portion 36 consisting of each window part 36A where no conductor exists is formed around the conductor 37 opposite to the mask area 42 and as a filling resin layer 38 is filled in each window part 36A or a plating resist layer 38' is formed, a great deal of light radiated closely outside the mask area 42 of light radiated as described above is absorbed in the filled resin layer 38 and is not scattered and light scattered on the metallic area 32 outside the blank portion 36 is hardly incident to the interlayer insulating layer 39 existing under the mask area 42. Hereby, the interlayer insulating layer 39 can be exposed on the boundary of the mask area 42 at satisfactory resolution as described above and the interlayer insulating layer 39 existing the mask area 42 can be efficiently prevented from being hardened by scattered light scattered from the metallic area 32. As a result, the interlayer insulating layer 39 which exists on the conductor 37 in a unhardened state can be completely removed by developing the printed wiring board 31 after exposure as described above and a via hole 40 in which the conductor 37 is completely exposed can be formed without leaving the interlayer insulating layer 39 on the conductor 37.

Further, a circuit pattern 43 is continuously formed on the interlayer insulating layer 39 and inside each via hole 40. After processing for roughing the base material 35 after the via hole 40 is formed and processing for applying a plating catalyst nucleus are performed, the circuit pattern 43 is provided by dipping in electroless plating bath and forming a plating film. For electroless plating, a well-known method is used and therefore, the detailed description is omitted.

Figure 16:
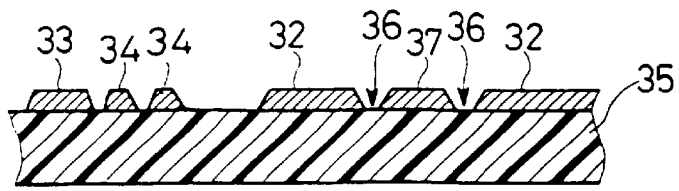
Figure 16:
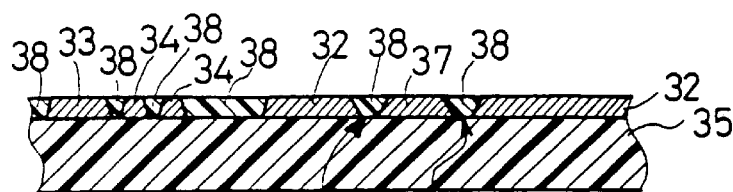
Figure 16:
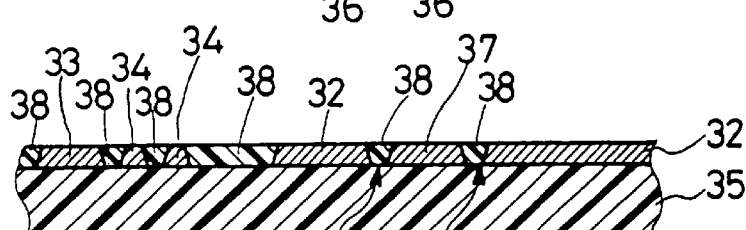
Figure 16:
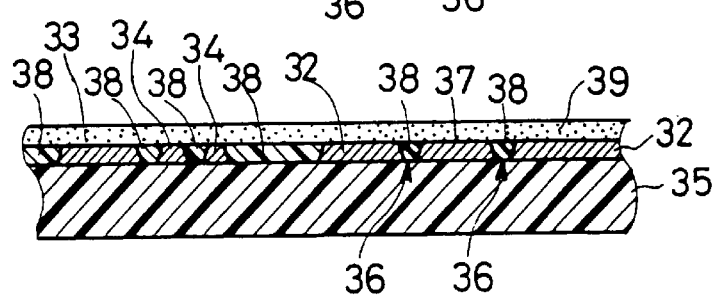
Figure 16:
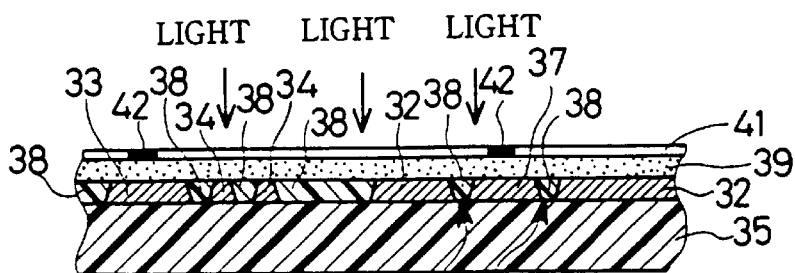
Figure 16:
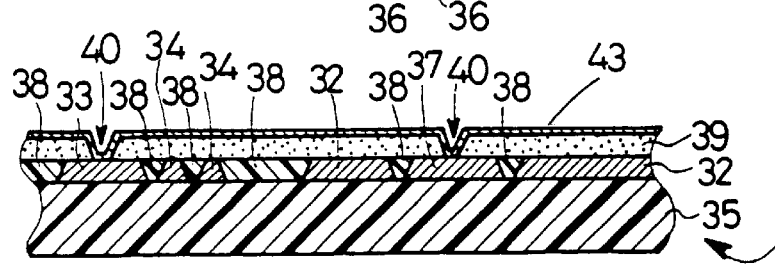

Next, a method of manufacturing the printed wiring board 31 constituted as described above will be described referring to FIG. 16. FIG. 16 is a process drawing showing a manufacturing process of the printed wiring board 31. As shown in FIG. 16 (A), first, a base material on which a metallic area 32 with large area such as a power pattern and a ground pattern, plural blank portions 36 formed in the metallic area 32 consisting of four arc-shaped window parts 36A (in the center of each window part 36A, a conductor 37 exists) in which no conductor exists, a connecting pad 33 and a circuit pattern 34 are formed is manufactured by applying predetermined etching to a copper-clad laminate.

Next, filling resin is applied on the surface of the base material 35 and a filled resin layer 38 formed by filling resin in the window parts of each blank portion 36, between the metallic area 32 and the circuit pattern 34, between the circuit patterns 34 and between the connecting pad 33 and the circuit pattern 34 is formed as shown in FIG. 16 (B). Further, as in this state, the irregularities of the filled resin exist on the surface of the base material 35, the surface of the base material 35 is polished by a well-known method for polishing. Hereby, the filled resin layer 38, the metallic area 32, the connecting pad 33 and the circuit pattern 34 constitute one surface as shown in FIG. 16 (C).

Next, an interlayer insulating layer 39 is applied and formed by applying photosensitive resin on the respective surfaces of the metallic area 32, the connecting pad 33, the circuit pattern 34 and the filled resin layer 38 which are polished so that they are at the same level in the above process as shown in FIG. 16 (D). At this time, as the respective surfaces of the filled resin layer 38, the metallic area 32, the connecting pad 33 and the circuit pattern 34 are at the same level, the interlayer insulating layer 39 can be applied and formed so that the thickness is uniform.

Further, a mask film 41 is stuck on the interlayer insulating layer 39 so that the mask area 42 of the mask film 41 is opposite to the conductor 37 and the connecting pad 33 in the metallic area 32. Afterward, light from a light source is radiated from over the mask film 41 to expose the interlayer insulating layer 39 as shown in FIG. 16 (E). At this time, as described above, as the interlayer insulating layer 39 is applied and formed so that the thickness is uniform on the metallic area 32 and the filled resin layer 38, the interlayer insulating layer 39 can be exposed on the boundary of the mask area 42 of the mask film 41 at satisfactory exposure resolution. The blank portion 36 in which no conductor exists consisting of each window part 36A is formed around the conductor 37 opposite to the mask area 42 and as the filled resin layer 38 is formed in each window part 36A, a great deal of light radiated as described above closely outside the mask area 42 is absorbed in the filled resin layer 38 and is not scattered, and light scattered on the metallic area 32 outside the blank portion 36 is hardly incident to the interlayer insulating layer 39 existing under the mask area 42. Hereby, as the interlayer insulating layer 39 can be exposed on the boundary of the mask area 42 at satisfactory resolution as described above, the interlayer insulating layer 39 existing under the mask area 42 can be efficiently prevented from being hardened by scattered light scattered from the metallic area 32.

As a result, the interlayer insulating layer 39 coated with the mask area 42 on the conductor 37 is held completely unhardened and the interlayer insulating layer 39 except the part coated with the mask area 42 is completely hardened by light by performing exposure as described above.

The interlayer insulating layer 39 which is in an unhardened state on the conductor 37 can be completely removed by developing the printed wiring board 31 after exposure as described above and a via hole 40 from which the conductor 37 is completely exposed can be formed without leaving no interlayer insulating layer 39 on the conductor 37. Afterward, the continuous circuit pattern 43 is formed on the interlayer insulating layer 39 and inside the via hole 40 by electroless plating described above. Hereby, the printed wiring board 31 is manufactured as shown in FIG. 16 (F). However, the interlayer insulating layer 39 hardened by exposure is left on the base material as it is.

As described above in details, in the printed wiring board 31 equivalent to the second embodiment, as the interlayer insulating layer 39 is applied and formed on the metallic area 32, the filled resin layer 38 and the plating resist layer 38' so that the thickness is uniform if light is radiated from over the mask area 42 with the mask film 41 stuck on the interlayer insulating layer 39 to form the via hole 40 opposite to the metallic area 32 and the interlayer insulating layer 39 is exposed, the interlayer insulating layer 39 can be exposed on the boundary of the mask area 42 of the mask film 41 at satisfactory exposure resolution.

The blank portion 36 in which no conductor exists consisting of each window part 36A is formed around the conductor 37 which is opposite to the mask area 42 and functions as a connecting pad and as the filled resin layer 38 or the plating resist layer 38' is formed in each window part 36A, a great deal of light radiated as described above closely outside the mask area 42 is absorbed in the filled resin layer 38 and is not scattered, and light scattered on the metallic area 32 outside the blank portion 36 is hardly incident to the interlayer insulating layer 39 existing under the mask area 42. Hereby, as the interlayer insulating layer 39 can be exposed on the boundary of the mask area 42 at satisfactory resolution as described above, the interlayer insulating layer 39 existing under the mask area 42 can be efficiently prevented from being hardened by scattered light scattered from the metallic area 32. As a result, the interlayer insulating layer 39 which exists in an unhardened state on the conductor 37 can be completely removed by developing the printed wiring board 31 after exposure as described above and a via hole 40 from which the conductor 37 is completely exposed can be formed without leaving the interlayer insulating layer 39 on the conductor 37.

Further, the blank portion 36 is provided around the conductor 37 which functions as the connecting pad and as the filled resin 38 is filled in this blank portion 36 or the plating resist layer 38' is formed in this blank portion 36, the blank portion is excellent in the adhesion between the blank portion and the interlayer insulating layer formed on it, compared with a case that the blank portion 36 is not formed.

If the interlayer insulating layer is formed on the metallic area as it is, the interlayer insulating layer is readily peeled because resin and metal are not in concord. In addition, as the via hole is connected to the metallic area, the metallic area and the interlayer insulating layer are readily peeled the vicinity of the via hole if stress is applied there in a heat cycle.

In this second embodiment, as the filled resin 38 and the plating resist layer 38' are formed in the blank portion 36 around the conductor 37 which functions as the connecting pad to which the via hole is connected in the metallic area and resin and the interlayer insulating layer are in concord, compared with the case of metal and the interlayer insulating layer, the interlayer insulating layer can be prevented from being peeled.

The present invention is not limited to the above second embodiment and it need scarcely be said that a variety of improvements and variations are allowed as long as the effect of the present invention is not deviated. For example, in the printed wiring board 31 in the above embodiment, a metallic area 32 and others are formed on the single side of a base material 35, however, multilayer structure may be further formed on the double sides of a base material 35.

(Third Embodiment)

Next, a multilayer printed wiring board equivalent to a third embodiment according to the present invention will be described referring to FIGS. 17 to 27. First, the printed wiring board equivalent to the first embodiment in which the multilayer printed wiring board equivalent to the third embodiment is further embodied will be described below referring to FIG. 17.

(First Embodiment)

Figure 17:
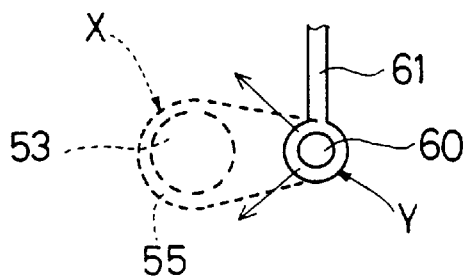
Figure 17:
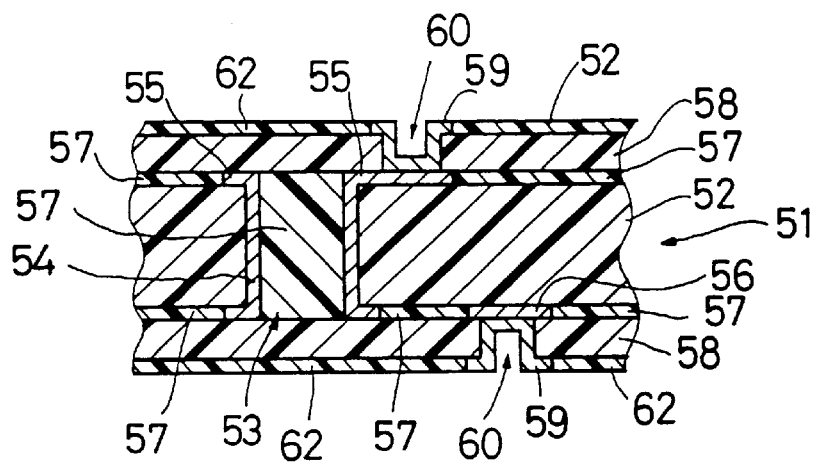
Figure 17:
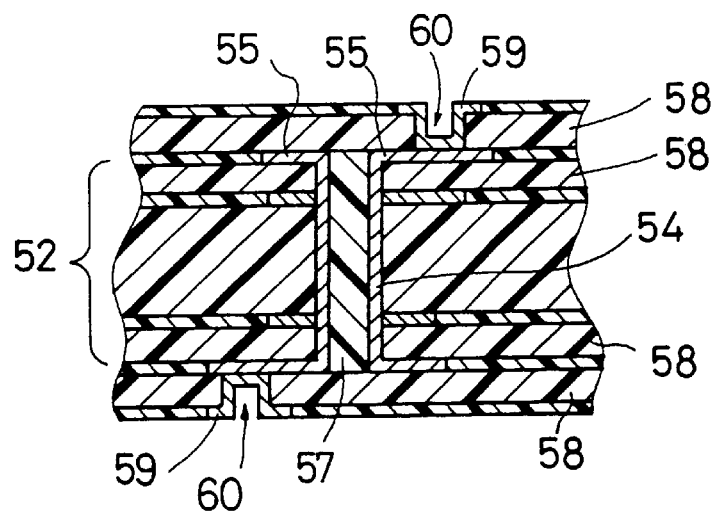
Figure 17:
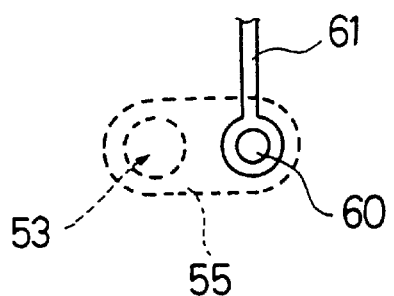

FIGS. 17 show connection structure in which a connecting pad formed on a core material and a pattern on an interlayer insulating layer are connected via a via hole in the multilayer printed wiring board equivalent to the first embodiment, FIGS. 17 (A) and (D) are plan views showing the multilayer printed wiring board and FIGS. 17 (B) and (C) are sectional views showing the multilayer printed wiring board.

As shown in FIGS. 17 (A), (B), (C) and (D), a multilayer printed wiring board 51 is provided with a base material 52 which is a core material and a through hole 53 is formed on this base material. A conductor layer 54 is formed on the inner wall of the through hole 53 by plating the through hole and a circular through hole land 55 connected to the conductor layer 54 is provided on the upper and lower double sides of the base material 52. The through hole land 55 is in the shape of a tear or an ellipse on the upper surface of the base material 52 and hereby, one end of the through hole land 55 (the right end in FIGS. 17 (A) and (B)) functions as a connecting pad for connecting to a via hole 60 described later. A connecting pad 56 is formed in a position separated from the through hole land 55 in the lower part of the base material 52. Filling resin 57 is filled inside the through hole 53, between the through hole land 55 and the connecting pad 56, between the through hole land 55 and the other circuit pattern and between the connecting pad 56 and the other circuit pattern.

An interlayer insulating layer 58 is provided on the base material 52, a via hole 60 inside which a conductor layer 59 is formed is provided in a position corresponding to the narrower part of the through hole land 55 in the interlayer insulating layer 58 and a circuit pattern 61 connected to the conductor layer 59 is formed. Hereby, the narrower part of the through hole land 55 is connected to the circuit pattern 61 via the conductor layer 59 of the via hole 60. Similarly, an interlayer insulating layer 58 is formed on the lower surface of the base material 52, a via hole 60 provided with a conductor layer 59 inside is formed in a position opposite to the connecting pad 56 in the interlayer insulating layer 58 and the connecting pad 56 and the conductor layer 59 are connected. A plating resist layer 62 required when the conductor layer 59 and the circuit pattern 61 are formed by electroless plating is formed around the conductor layer 59 of the via hole 60 and the circuit pattern 61.

When the above printed wiring board 51 is manufactured, a method of forming the via hole 60 in the interlayer insulating layer 58 and connecting the narrower part (equivalent to the connecting pad) of the through hole land 55 on the base material 52 and the circuit pattern 61 on the interlayer insulating layer 58 via he conductor layer 59 is as follows: However, to simplify description, only the constitution on the upper side of the printed wiring board 51 will be described.

That is, after a through hole 53, a conductor layer 54, a through hole land 55 in the shape of a tear, a connecting pad 56 (a pad on the lower surface of the base material 52) are formed on the base material 52 by applying drilling, electroless plating, predetermined etching and filling resin to a double-sided copper-clad laminate, photosensitive resin is applied and dried on the base material 52 to form an interlayer insulating layer 58 and the interlayer insulating layer 58 is exposed with a mask film not shown provided with a light blocking pattern opposite to a via hole 60 and a circuit pattern 61 stuck on the interlayer insulating layer 58. After exposure, the mask film is peeled from the interlayer insulating layer 58 to perform development. Hereby, the via hole 60 is formed. Further, a plating catalytic nucleus is applied on the interlayer insulating layer 58 and after a plating resist layer 62 is formed, a conductor layer 59 and a circuit pattern 61 are formed by electroless plating. Hereby, the right end of the through hole land 55 is connected to the circuit pattern 61 via the conductor layer 59 and a printed wiring board 51 is manufactured.

At this time, for interlayer insulating material for forming the above interlayer insulating layer 58, thermosetting resin such as epoxy resin, polyimide resin, bismaleimidetriazine resin and phenol resin, photosensitive resin of these, thermoplastic resin such as polyether sulfonate, a complex of thermoplastic resin and thermosetting resin and a complex of photosensitive resin and thermoplastic resin may be used. Roughing by applying an oxidizing agent, acid and alkali to the surface of these may be performed. The adhesion between a conductor circuit formed on the surface of the interlayer insulating layer and the interlayer insulating layer can be improved by roughing.

For interlayer insulating material, an adhesive for electroless plating is desirable. For the adhesive for electroless plating, an adhesive for electroless plating generated by dispersing a heat-resistant resin particle soluble in acid or an oxidizing agent in heat-resistant resin refractory in acid or an oxidizing agent is the most suitable. It is because an anchor in the shape of an octopus trap can be formed on the surface by roughing and removing a heat-resistant resin particle soluble in acid or an oxidizing agent and the adhesion between the conductor circuit and the interlayer insulating layer can be improved.

For heat-resistant resin refractory in acid or an oxidizing agent, photosensitive thermosetting resin and a complex of photosensitive thermosetting resin and thermoplastic resin are desirable. It is because a via hole can be readily formed by exposure and development by photosensitization. Tenacity can be enhanced by compounding thermoplastic resin, the peel strength of a conductor circuit can be enhanced and a via hole can be prevented from being cracked in a heat cycle.

In the concrete, epoxy acrylate generated by reacting epoxy resin with acrylic acid or metacrylic acid and a complex of epoxy acrylate and polyether sulfonate are desirable.

Epoxy acrylate generated by reacting 20 to 80% of all epoxy radicals with acrylic acid or metacrylic acid is desirable.

Further, it is desirable that the above heat-resistant resin particle is selected out of (1) heat-resistant resin powder the mean particle diameter of which is 10 $\mu$m or less, (2) a condensed particle into which heat-resistant resin powder the mean particle diameter of which is 2 $\mu$m or less is condensed, (3) a mixture of heat-resistant resin powder the mean particle diameter of which is 10 $\mu$m or less and heat-resistant resin powder the means particle diameter of which is 2 $\mu$m or less and (4) a psuedoparticle generated by depositing at least one of heat-resistant resin powder the mean particle diameter of which is 2 $\mu$m or less and/or inorganic powder on the surface of heat-resistant resin powder the mean particle diameter of which is 2 to 10 $\mu$m. It is because these can form a complicated anchor.

For a heat-resistant resin particle, epoxy resin and amino resin such as melamine resin, urea resin and guanamine resin are desirable.

The solubility of epoxy resin in acid or an oxidizing agent can be arbitrarily changed by changing the type of its oligomer, the type of a hardening agent and bridge density.

For example, bisphenol A epoxy resin oligomer processed by an amino hardening agent is readily soluble in an oxidizing agent. However, novolac epoxy resin oligomer processed by an imidazole hardening agent is hardly soluble in an oxidizing agent.

In this third embodiment, phosphoric acid, hydrochloric acid and sulfuric acid or organic acid such as formic acid and acetic acid are used, however, particularly, organic acid is desirable. It is because if surface roughing processing is performed, a metallic conductor layer exposed from a via hole is hardly corroded.

For an oxidizing agent, chromic acid and permanganate (potassium permanganate) are desirable.

In this third embodiment, plural interlayer insulating layers may be also provided. If plural interlayer insulating layers are provided, there are the following types:

1) two-layer structure consisting of interlayer insulating layers provided between the upper and lower conductor circuits in which an adhesive for electroless plating generated by dispersing a heat-resistant resin particle soluble in acid or an oxidizing agent in heat-resistant resin refractory in acid or an oxidizing agent is provided on the side of the upper conductor circuit and heat-resistant resin refractory in acid or an oxidizing agent is provided on the side of the lower conductor circuit.

According to this constitution, even if roughing is excessive in roughing an adhesive layer for electroless plating, a short circuit between layers can be prevented from being caused.

2) three-layer structure consisting of interlayer insulating layers provided between the upper and lower conductor circuits in which filling resin material is filled between the interlayer insulating layer and the lower conductor circuit, the respective surfaces of the lower conductor circuit and this filled rein material are equalized in a level, a heat-resistant resin layer refractory in acid or an oxidizing agent is formed on it, further an adhesive for electroless plating generated by dispersing a heat-resistant resin particle soluble in acid or an oxidizing agent in heat- resistant resin refractory in acid or an oxidizing agent is formed on it.

In the multilayer printed wiring board 51 equivalent to the first embodiment constituted as described above, the through hole land 55 is in the shape of a tear, as the via hole 60 is connected to the through hole land 55, the through hole land 55 and a pad for connecting the via hole 60 are integrated and therefore, connection area for connecting the bottom of the via hole 60 to the right end of the through hole land 55 can be enlarged. Hereby, when the mask film is stuck on the interlayer insulating layer 58 on the base material 52 and the interlayer insulating layer is exposed with the light blocking pattern of the mask film opposite to a part in which the via hole is to be formed so as to form the via hole 60, the range of allowable misregistration of the light blocking pattern of the mask film to a part in which the via hole is to be formed can be greatly widened and the via hole 60 and the right end (equivalent to a pad) of the through hole land 55 can be stably connected reliably even if misregistration is caused in the direction shown by an arrow in FIG. 17 (A) between the right end of the through hole land 55 and the mask film.

As described above, as the through hole land 55 and a pad for connecting the via hole 60 are integrated, no location to which stress is collectively applied exists and the interlayer insulating layer 58 can be securely prevented from being cracked even in a heat cycle. It is noted that the base material 52 may be formed of a multilayer printed wiring board.

(Second Embodiment)

Figure 18:
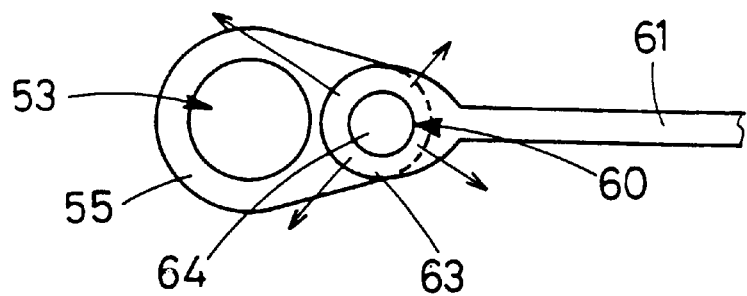

Next, a multilayer printed wiring board equivalent to a second embodiment will be described referring to FIG. 18. FIG. 18 is a plan showing the multilayer printed wiring board equivalent to the second embodiment. The multilayer printed wiring board 51 equivalent to the second embodiment is basically provided with the same constitution as that of the multilayer printed wiring board equivalent to the above first embodiment and therefore, only the characteristic constitution of a via hole 60 connected to the above through hole land 55 in the shape of a tear will be described below.

As shown in FIG. 18, a via hole 60 is formed in an interlayer insulating layer 58 opposite to the narrower part of a through hole land 55 in the shape of a tear formed around a through hole 53 on the surface of a base material 52 and a via hole land 63 in the shape of a tear is provided around the via hole 60. The opening 64 of the via hole 60 is formed in the enlarged part of the via hole land 63.

In the multilayer printed wiring board 51 equivalent to the second embodiment formed as described above, the through hole land 55 and the via hole land 63 are both in the shape of a tear and further, as the opening 64 of the via hole 60 is formed in the enlarged part of the land 63, an allowable range for forming the opening 64 of the via hole 60 at the right end of the through hole land 55 is further widened, compared with the allowable range of the multilayer printed wiring board 51 equivalent to the above first embodiment. Therefore, the range of allowable misregistration of the light blocking pattern of a mask film to a part in which the via hole is to be formed can be greatly widened and even if misregistration is caused between the through hole land 55 and the mask film, the via hole 60 and the through hole land 55 can be stably connected reliably independent of the direction of misregistration as shown by arrows in FIG. 18

(Third Embodiment)

Figure 19:
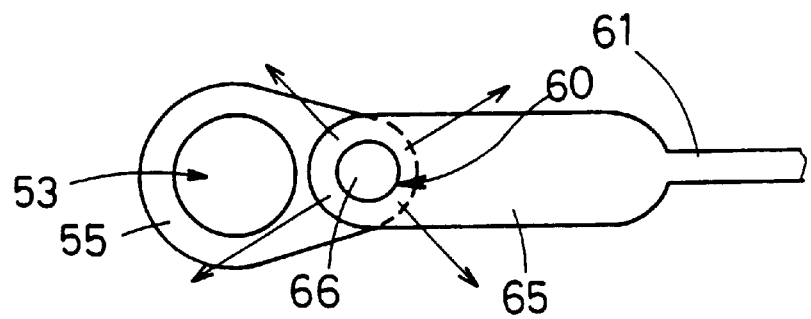

Next, a multilayer printed wiring board equivalent to a third embodiment will be described referring to FIG. 19. FIG. 19 is a plan showing the multilayer printed wiring board equivalent to the third embodiment. The multilayer printed wiring board equivalent to the third embodiment is basically provided with the same constitution as that of the multilayer printed wiring board 51 equivalent to the above first embodiment and therefore, only the characteristic constitution of a via hole 60 connected to the above through hole land 55 in the shape of a tear will be described below.

As shown in FIG. 19, a via hole 60 is formed in an interlayer insulating layer 58 opposite to the narrower part of a through hole land 55 in the shape of a tear formed around a through hole 53 on the surface of a base material 52 and a substantially elliptic via hole land 65 is provided around the via hole 60. The opening 66 of the via hole 60 is formed at one end (the left end in FIG. 19) in the direction of the longer axis of the elliptic via hole land 65.

In the above multilayer printed wiring board 51 equivalent to the third embodiment, the through hole land 55 is in the shape of a tear, the via hole land 65 around the via hole 60 is elliptic, therefore, as in the above second embodiment, an allowable range for forming the opening 66 of the via hole 60 is further widened and the range of allowable misregistration of the light blocking pattern of a mask film to a part in which the via hole is to be formed can be greatly widened. Hereby, even if misregistration is caused between the through hole land 55 and the mask film, the via hole 60 and the through hole land 55 can be stably connected reliably independent of the direction of misregistration as shown by arrows in FIG. 19.

(Fourth Embodiment)

Figure 20:
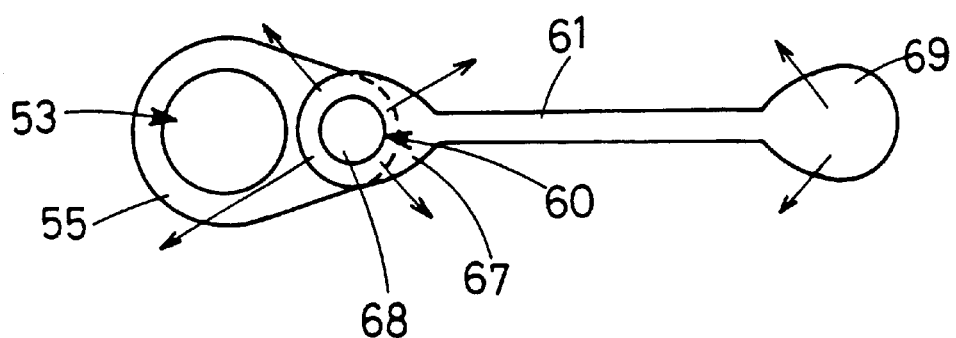

Next, a multilayer printed wiring board equivalent to a fourth embodiment will be described referring to FIG. 20. FIG. 20 is a plan showing the multilayer printed wiring board equivalent to the fourth embodiment. The multilayer printed wiring board equivalent to the fourth embodiment is basically provided with the same constitution as that of the multilayer printed wiring board 51 equivalent to the above first embodiment and therefore, only the characteristic constitution of a via hole 60 connected to the above through hole land 55 in the shape of a tear will be described below.

As shown in FIG. 20, a via hole 60 is formed in an interlayer insulating layer 58 opposite to the narrower part of a through hole land 55 in the shape of a tear formed around a through hole 53 on the surface of a base material 52 and a via hole land 67 in the shape of a tear is provided around the via hole 60. The opening 68 of the via hole 60 is formed in a widened part of the via hole land 67. This constitution is the same as that in the second embodiment. A connecting pad 69 in the shape of a tear as the via hole land 67 is electrically connected to the via hole land 67 via a circuit pattern 61 on the interlayer insulating layer 58. A via hole formed in another interlayer insulating layer not shown further formed on the interlayer insulating layer 58 is connected to the connecting pad 69.

In the multilayer printed wiring board 51 equivalent to the fourth embodiment, the via hole land 67 and the connecting pad 69 in the shape of a tear are electrically connected on the interlayer insulating layer 58 in addition to the same constitution as that of the above multilayer printed wiring board 51 equivalent to the second embodiment and as described above, the connecting pad 69 formed on the interlayer insulating layer 58 is also in the shape of a tear. Therefore, the connection area of the bottom of the via hole (provided in an interlayer insulating layer formed further on the surface of the interlayer insulating layer 58) connected to the connecting pad 69 can be widened in addition to the effect which can be obtained according to the multilayer printed wiring board 51 equivalent to the second embodiment. Hereby, when an interlayer insulating layer formed further on the surface of the interlayer insulating layer 58 on the base material 52 is exposed with a mask film stuck on the above interlayer insulating layer to form a via hole, the range of allowable misregistration of the light blocking pattern of the mask film to a part in which the via hole is to be formed can be greatly widened and even if misregistration is caused between the connecting pad 69 and the mask film in the directions shown by arrows in FIG. 20, the via hole and the connecting pad 69 can be stably connected reliably.

(Fifth Embodiment)

Figure 21A:
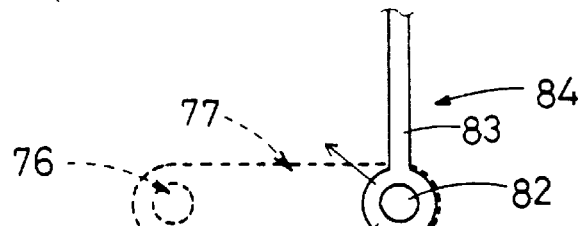
Figure 21B:
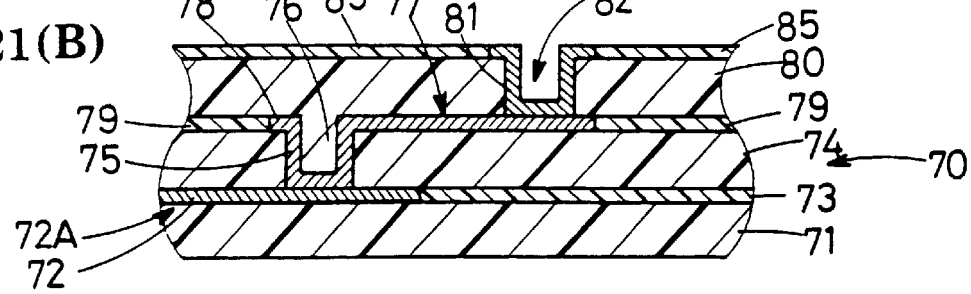

Next, a multilayer printed wiring board equivalent to a fifth embodiment will be described referring to FIG. 21. This multilayer printed wiring board is provided with connection structure in which a connecting pad formed on an interlayer insulating layer and a pattern on another interlayer insulating layer are connected via a via hole. FIG. 21 show connection structure in which a connecting pad formed on an interlayer insulating layer and a pattern on another interlayer insulating layer are connected via a via hole in the multilayer printed wiring board equivalent to the fifth embodiment, FIG. 21 (A) is a plan showing the multilayer printed wiring board and FIG. 21 (B) is a sectional view showing the multilayer printed wiring board.

As shown in FIGS. 21 (A) and (B), in a printed wiring board 70, a connecting pad 72 constituting a part of a lower conductor circuit 72A is formed on a base material 71 and a filled resin layer 73 is provided around the connecting pad 72. An interlayer insulating layer 74 is formed on the connecting pad 72 and the filled resin layer 73 and a substantially elliptic connecting pad 77 including a via hole 76 inside which a conductor layer 75 is formed and which is located in a position opposite to the connecting pad 72 in the interlayer insulating layer 74 is formed.

The elliptic connecting pad 77 constitutes a part of an intermediate conductor circuit, a via hole 82 constituting a part of an upper conductor circuit 84 formed on an interlayer insulating layer 80 described later is connected to one end thereof in the direction of the longer axis of the ellipse and the other end in the direction of the longer axis of the ellipse constitutes a part of a via hole land 78 of the via hole 76. Hereby, the connecting pad 72 on the base material 71 is connected to the connecting pad 77 via the conductor layer 75 of the via hole 76. The ellipse of the connecting pad 77 is formed in the shape which looks as if the opposite sides of a rectangle draw an arc outward as shown in FIG. 21 (A) and further, it need scarcely be said that the connecting pad may be in the shape which looks as if the opposite sides of an ellipse draw an arc outward.

A plating resist layer 79 required when the conductor layer 75 and the connecting pad 77 are formed by electroless plating is formed around the connecting pad 77 including the conductor layer 75 of the via hole 76.

Furthermore other interlayer insulating layer 80 is provided on the interlayer insulating layer 74, a via hole 82 inside which a conductor layer 81 is formed is provided in a position opposite to one end (the right end in FIGS. 21 (A) and (B)) of the connecting pad 77 in the interlayer insulating layer 80 and the upper conductor circuit 84 including a circuit pattern 83 connected to the conductor layer 81 is formed on the interlayer insulating layer. Hereby, the connecting pad 77 on the interlayer insulating layer 74 is connected to the circuit pattern 83 via the conductor layer 81 of the via hole 82. A plating resist layer 85 required when the conductor layer 81 and the circuit pattern 83 are formed by electroless plating is formed around the conductor layer 81 of the via hole 82 and the circuit pattern 83.

As a method of manufacturing the multilayer printed wiring board 70 equivalent to the fifth embodiment is basically the same as that of the multilayer printed wiring board equivalent to the first embodiment, the description is omitted.

The multilayer printed wiring board 70 equivalent to the fifth embodiment constituted as described above is provided with the connecting pad 77 in which the via hole land 78 of the via hole 76 connected to the connecting pad 72 of the lower conductor circuit 72A and a pad of the via hole 82 for the upper conductor circuit 84 are integrated and the connecting pad 77 is in the shape of an ellipse which looks as if the opposite sides of an ellipse or a rectangle draw an arc outward. Therefore, no location to which stress is collectively applied exists in the connecting pad 77 and hereby, the interlayer insulating layers 74 and 80 can be securely prevented from being cracked even in a heat cycle. The connection area at the bottom of the via hole 82 opposite to the connecting pad 77 can be widened as in the above first embodiment and hereby, when the interlayer insulating layer 80 on the base material 71 is exposed with the light blocking pattern of a mask film stuck on the interlayer insulating layer 80 opposite to a part in which a via hole is to be formed to form the via hole 82, the range of allowable misregistration of the light blocking pattern of the mask film to the part in which the via hole is to be formed is greatly widened and even if misregistration is caused between the connecting pad 77 and the mask film in the directions shown by arrows in FIG. 21 (A), the via hole 82 and the connecting pad 77 can be stably connected reliably. The base material may be formed of a multilayer printed wiring board.

(Sixth Embodiment)

Figure 22:
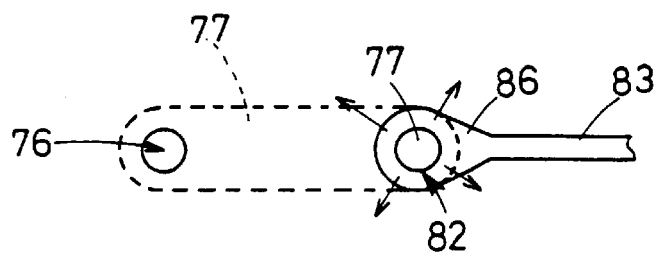

Next, a multilayer printed wiring board equivalent to a sixth embodiment will be described referring to FIG. 22. FIG. 22 is a plan showing the multilayer printed wiring board equivalent to the sixth embodiment. The multilayer printed wiring board equivalent to the sixth embodiment is basically provided with the same constitution as that of the multilayer printed wiring board 70 equivalent to the above fifth embodiment and therefore, only the characteristic constitution of a via hole 82 connected to the above elliptic connecting pad 77 will be described below.

As shown in FIG. 22, a via hole 82 is formed in an interlayer insulating layer 80 opposite to an arc-shaped part at the right end of the elliptic connecting pad 77 on an interlayer insulating layer 74 and a via hole land 86 in the shape of a tear is provided around the via hole 82. The opening 87 of the via hole 82 is formed in the widened part of the via hole land 86.

In the multilayer printed wiring board 70 equivalent to the sixth embodiment formed as described above, the right end of the connecting pad 77 is formed in the shape of an arc, the via hole land 86 is in the shape of a tear and further, as the opening 87 of the via hole 82 is formed in the widened part of the above land 86, an allowable range for forming the opening 87 of the via hole 82 at the right end of the connecting pad 77 is further widened, compared with that in the multilayer printed wiring board 70 equivalent to the above fifth embodiment. Therefore, the range of allowable misregistration of the light blocking pattern of a mask film to a part in which the via hole is to be formed can be greatly widened and even if misregistration is caused between the right end of the connecting pad 77 and the mask film, the via hole 82 and the connecting pad 77 can be stably connected reliably independent of the directions of misregistration shown by arrows in FIG. 22.

(Seventh Embodiment)

Figure 23:
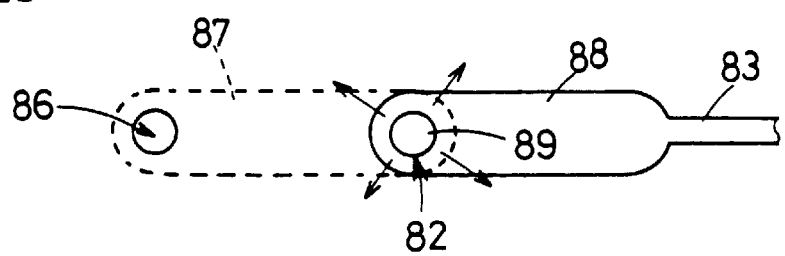

Next, a multilayer printed wiring board equivalent to a seventh embodiment will be described referring to FIG. 23. FIG. 23 is a plan showing the multilayer printed wiring board equivalent to the seventh embodiment. The multilayer printed wiring board equivalent to the seventh embodiment is basically provided with the same constitution as that of the multilayer printed wiring board 70 equivalent to the above fifth embodiment and therefore, only the characteristic constitution of a via hole 82 connected to the above elliptic connecting pad 77 will be described below.

As shown in FIG. 23, a via hole 82 is formed in an interlayer insulating layer 80 opposite to an arc-shaped part at the right end of an elliptic connecting pad 77 on an interlayer insulating layer 74 and an elliptic via hole land 88 is provided around the via hole 82. The opening 89 of the via hole 82 is formed at one end (the left end in FIG. 23) of the via hole land 88 in the direction of the longer axis of an ellipse.

In the multilayer printed wiring board 70 equivalent to the seventh embodiment formed as described above, the right end of the elliptic connecting pad 77 and the left end of the elliptic via hole land 88 are both formed in the shape of an arc and further, as the opening 89 of the via hole 82 is formed in the widened part of the above land 88, an allowable range for forming the opening 89 of the via hole 82 over the right end of the connecting pad 77 is further widened, compared with that of the multilayer printed wiring board 70 equivalent to the above fifth embodiment. Therefore, the range of allowable misregistration of the light blocking pattern of a mask film to a part in which the via hole is to be formed can be greatly widened and even if misregistration is caused between the right end of the connecting pad 77 and the mask film, the via hole 82 and the connecting pad 77 can be stably connected reliably independent of the directions of misregistration shown by arrows in FIG. 23.

(Eighth Embodiment)

Figure 24:
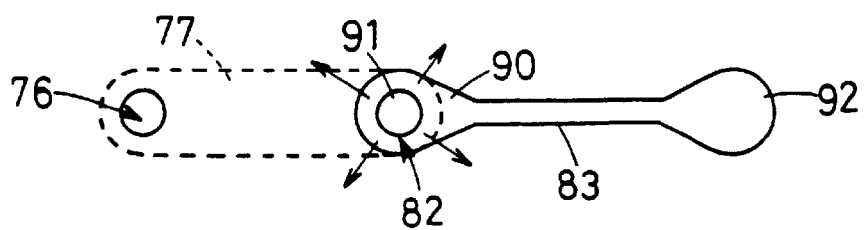

Next, a multilayer printed wiring board equivalent to an eighth embodiment will be described referring to FIG. 24. FIG. 24 is a plan showing the multilayer printed wiring board equivalent to the eighth embodiment. The multilayer printed wiring board equivalent to the eighth embodiment is basically provided with the same constitution as that of the multilayer printed wiring board 70 equivalent to the above fifth embodiment and therefore, only the characteristic constitution of a via hole 82 connected to the above elliptic connecting pad 77 will be described below.

As shown in FIG. 24, a via hole 82 is formed in an interlayer insulating layer 80 opposite to an arc-shaped part at the right end of an elliptic connecting pad 77 on an interlayer insulating layer 74 and a via hole land 90 in the shape of a tear is provided around the via hole 82. The opening 91 of the via hole 82 is formed in the widened part of the via hole land 90. This constitution is the same as that in the sixth embodiment. A connecting pad 92 in the shape of a tear as the via hole land 90 is electrically connected to the via hole land 90 via a circuit pattern 83 on the interlayer insulating layer 80. A via hole formed in another interlayer insulating layer not shown further formed on the interlayer insulating layer 80 is connected to the connecting pad 92.

In the multilayer printed wiring board 70 equivalent to the eighth embodiment formed as described above, the via hole land 82 and the connecting pad 92 in the shape of a tear are electrically connected on the interlayer insulating layer 80 in addition to the same constitution as the multilayer printed wiring board 70 equivalent to the above sixth embodiment and the connecting pad 92 formed on the interlayer insulating layer 80 as described above is also formed in the shape of a tear. Therefore, the connection area of the bottom of a via hole (provided in an interlayer insulating layer formed further on the interlayer insulating layer 80) connected to the connecting pad 92 can be widened in addition to the effect obtained by the multilayer printed wiring board 70 equivalent to the sixth embodiment. Hereby, when a mask film is stuck on an interlayer insulating layer further formed on the interlayer insulating layer 80 and the interlayer insulating layer is exposed with the light blocking pattern of the mask film opposite to a part in which the a via hole is to be formed to form the via hole, the range of allowable misregistration of the light blocking pattern of the mask film to a part in which the via hole is to be formed can be greatly widened and even if misregistration is caused in the directions shown by arrows in FIG. 24 between the connecting pad 92 and the mask film, the via hole and the connecting pad 92 can be stably connected reliably.

(Ninth Embodiment)

Figure 25:
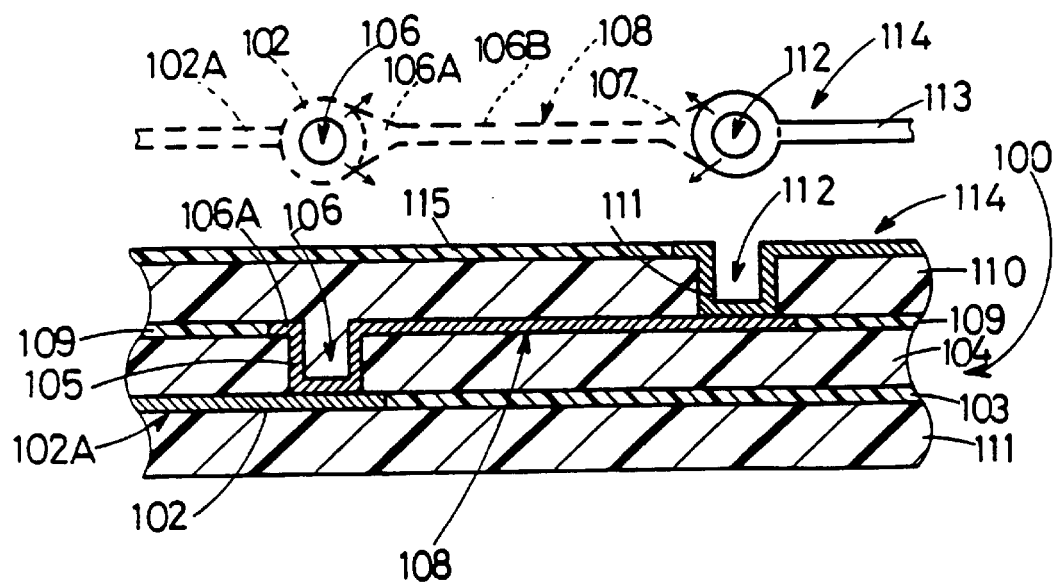

Next, a multilayer printed wiring board equivalent to a ninth embodiment will be described referring to FIG. 25. This multilayer printed wiring board is provided with connection structure in which a connecting pad formed on an interlayer insulating layer and a pattern on another interlayer insulating layer are connected via a via hole as the multilayer printed wiring board 70 equivalent to the above fifth embodiment. FIGS. 25 show connection structure in which a connecting pad formed on an interlayer insulating layer and a pattern on another interlayer insulating layer are connected via a via hole in a multilayer printed wiring board equivalent to a ninth embodiment, FIG. 25 (A) is a plan showing the multilayer printed wiring board and FIG. 25 (B) is a sectional view showing the multilayer printed wiring board.

As shown in FIGS. 25 (A) and (B), a printed wiring board 100 is provided with a base material 101, a circular connecting pad 102 constituting a part of a lower conductor circuit 102A is formed on this base material 101 and a filled resin layer 103 is provided around the connecting pad 102. An interlayer insulating layer 104 is formed on the connecting pad 102 and the filled resin layer 103 and an intermediate conductor circuit 108 including a via hole 106 inside which a conductor layer 105 is formed in a position opposite to the connecting pad 102 in the interlayer insulating layer 104 and provided with a via hole land 106A in the shape of a tear around the via hole 106 and a connecting pad 107 in the shape of a tear connected to the narrower part of the via hole land 106A via a circuit pattern 106B is provided. The connecting pad 107 is connected to the circuit pattern 106B on the side of the narrower part in the shape of a tear as the via hole land 106A.

The connecting pad 107 in the shape of a tear constitutes a part of the intermediate conductor circuit 108 and a via hole 112 constituting a part of an upper conductor circuit 114 formed on an interlayer insulating layer 110 described later is connected to the connecting pad 107.

A plating resist layer 109 required when the via hole land 106A including the conductor layer 105, the circuit pattern 106B and the connecting pad 107 are formed by electroless plating is formed around the via hole land 106A, the circuit pattern 106B and the connecting pad 107.

Further the other interlayer insulating layer 110 is provided on the interlayer insulating layer 104, a via hole 112 inside which a conductor layer 111 is formed in a position opposite to the connecting pad 107 in this interlayer insulating layer 110 and an upper conductor circuit 114 including a circuit pattern 113 connected to the conductor layer 111 is formed. Hereby, the connecting pad 107 on the interlayer insulating layer 104 is connected to the circuit pattern 113 via the conductor layer 111 of the via hole 112. A plating resist layer 115 required when the conductor layer 111 and the circuit pattern 113 are formed by electroless plating is formed around the conductor layer 111 of the via hole 112 and the circuit pattern 113.

As a method of manufacturing the multilayer printed wiring board 100 equivalent to the ninth embodiment is basically the same as the above method of manufacturing the multilayer printed wiring board equivalent to the first embodiment, the description is omitted.

In the multilayer printed wiring board 100 equivalent to the ninth embodiment constituted as described above, the connecting pad 107 formed in the intermediate conductor circuit 108 and connected to the upper conductor circuit 114 and the via hole land 106A connected to the connecting pad 102 for the lower conductor circuit 102A are both in the shape of a tear and as the connecting pad 107 and the through hole land 106A are connected in the narrower part thereof, the connection area of the bottom of the via hole 112 connected to the connecting pad 107 can be widened. Hereby, when a mask film is stuck on the interlayer insulating layer 110 on the base material 101 and the interlayer insulating layer is exposed with the light blocking pattern of a mask film opposite to a part in which the a via hole is to be formed to form the via hole 112, the range of allowable misregistration of the light blocking pattern of the mask film to a part in which the via hole is to be formed can be greatly widened and even if misregistration is caused in the directions shown by arrows in FIG. 25 between the connecting pad 107 and the mask film, the via hole 112 and the connecting pad 107 can be stably connected reliably. Stress is hardly applied to a connection for connecting the connecting pad 107 and the via hole land 106A collectively and hereby, the interlayer insulating layers 104 and 110 can be prevented from being cracked even in a heat cycle. It is noted that the base material 101 may be formed of a multilayer printed wiring board.

(Tenth Embodiment)

Next, a multilayer printed wiring board equivalent to a tenth embodiment will be described referring to FIG. 26. FIGS. 26 show connection structure in which a connecting pad on a base material and a pattern on an interlayer insulating layer are connected via a via hole in the multilayer printed wiring board equivalent to the tenth embodiment, FIGS. 26 (A), (C), (D) and (E) are plan views showing the multilayer printed wiring board and FIG. 26 (B) is a sectional view showing the multilayer printed wiring board.

As shown in FIGS. 26 (A), (B), (C), (D) and (E), a printed wiring board 120 is provided with a base material 121, a connecting pad 122 constituting a part of a lower conductor circuit 122A is formed on this base material 121 and a filled resin layer 123 is provided around the connecting pad 122. An interlayer insulating layer 124 is formed on the connecting pad 122 and the filled resin layer 123, and an upper conductor circuit 127 including a via hole 126 inside which a conductor layer 125 is formed in a position opposite to the connecting pad 122 in the interlayer insulating layer 124 and provided with a via hole land 126A in the shape of a tear or an ellipse around the via hole 126 and a circuit pattern 126B is connected to the narrower part of the via hole land 126A in the case of a tear shape is provided. In the case that the via hold land 126 is formed in the shape of an ellipse, alternatively, the upper conductor circuit 127 is provided with a circuit pattern 126B connected to an end of the elliptic via hole land 126A in its longer diameter. Hereby, the connecting pad 122 on the base material 121 is connected to the circuit pattern 126B via the conductor layer 125 of the via hole 126. The opening 129 of the via hole 126 is formed in the widened part of the via hole land 126A in the shape of a tear as shown in FIG. 26.

A plating resist layer 128 required when the via hole land 126A including the conductor layer 125 and the circuit pattern 126B are formed by electroless plating is formed around the via hole land 126A and the circuit pattern 126B.

In the multilayer printed wiring board 120 equivalent to the tenth embodiment constituted as described above, the via hole land 126A is formed in the shape of a tear or an ellipse, as the opening 129 of the via hole 126 is formed in the widened part of the shape of a tear or in the elliptic part of the shape of an ellipse, the range of allowable misregistration of the light blocking pattern of a mask film to a part in which a via hole is to be formed can be greatly widened when the interlayer insulating layer 124 on the base material 121 is exposed with the light blocking pattern of the mask film stuck on the interlayer insulating layer 124 opposite to a part in which the via hole is to be formed to form the via hole 126 and even if misregistration of a mask film is caused in the directions shown by arrows in FIG. 26, the opening 129 of the via hole 126 can be formed in the widened part of the land 126A in the shape of a tear or an ellipse. Stress is hardly applied to the connection of the via hole land 126A and the circuit pattern 126B of the upper conductor circuit 127 collectively and hereby, the interlayer insulating layer 124 can be securely prevented from being cracked even in a heat cycle. It is noted that the base material 121 may be formed of a multilayer printed wiring board.

Furthermore, as shown in FIGS. 26 (D) and (E), the lower conductor circuit to be connected with the via hole may be formed to have a pad in the shape of a tear or an ellipse. In this case, the range of allowable misregistration with respect to the via hole forming part can be widened. There is no location at which stress is converged in any of the tear-shaped and the ellipse-shaped via hole land 126A, so that the plating resist layer and the interlayer insulating layer, both of which are in connecting with the pad, can be also prevented from being cracked.

(Eleventh Embodiment)

Figure 27:
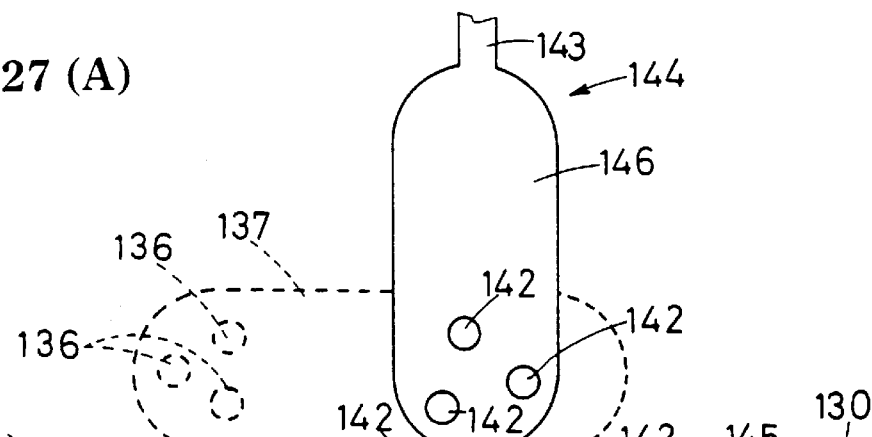
Figure 27:
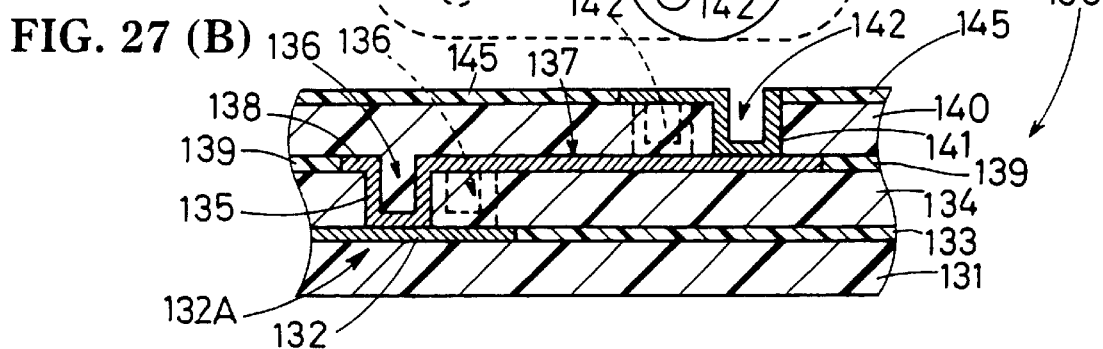
Figure 27:
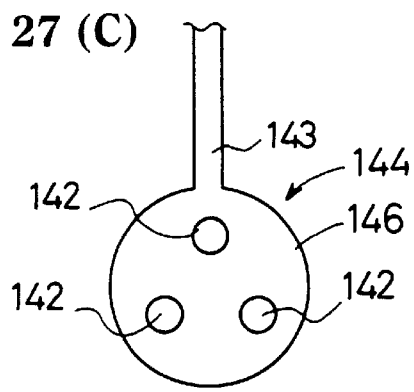
Figure 27:
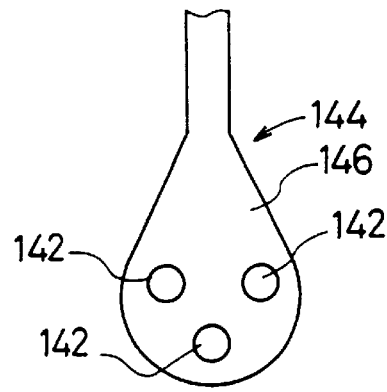
Figure 28:
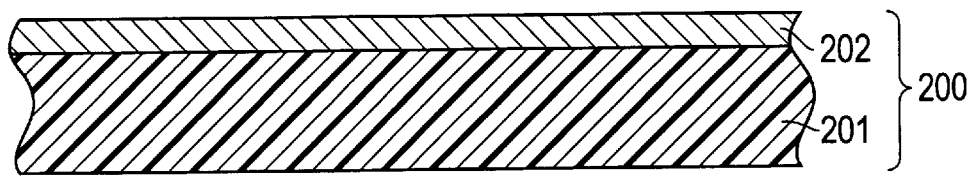
Figure 29:
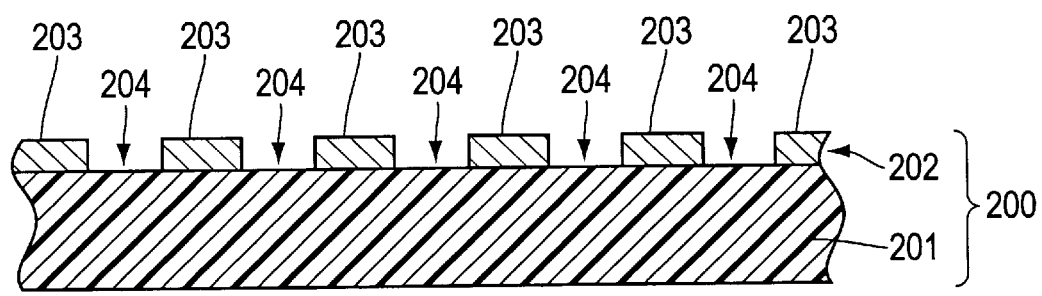
Figure 30:
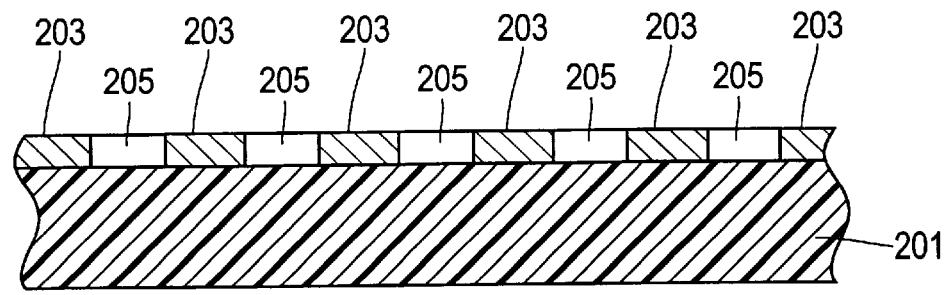
Figure 31:
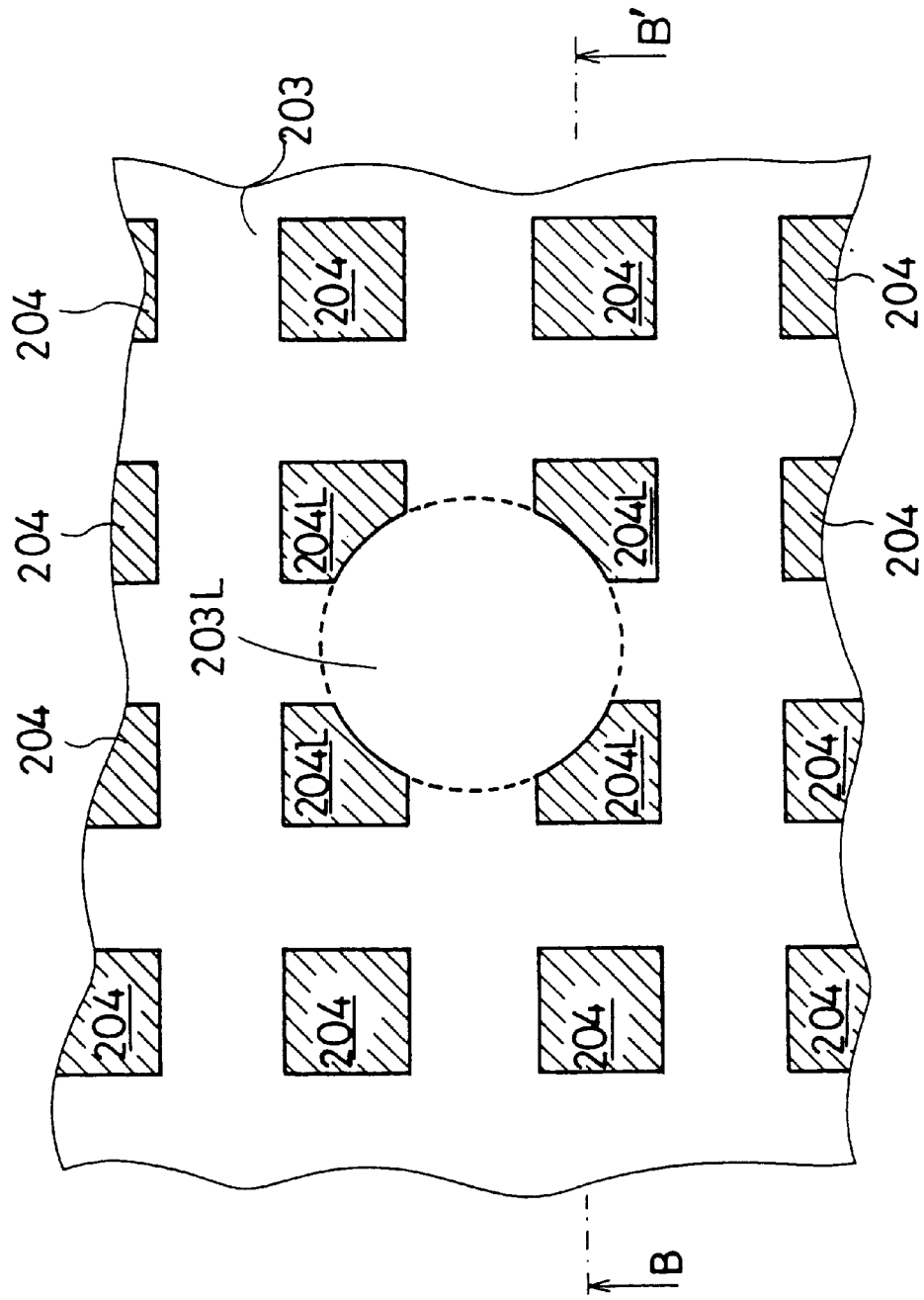
Figure 32:
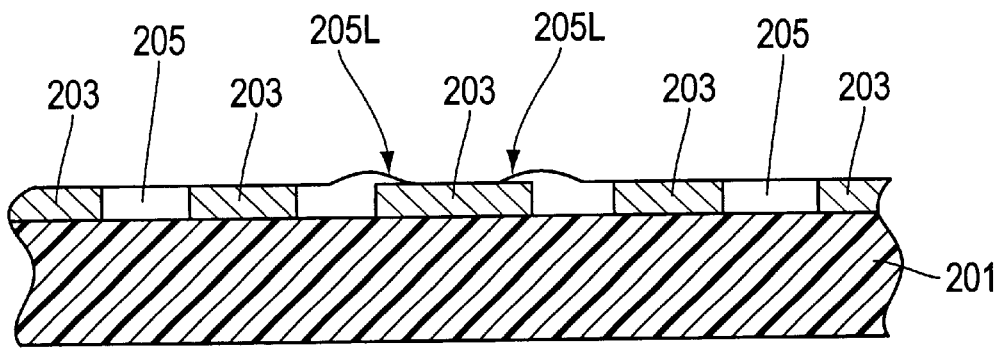
Figure 33:
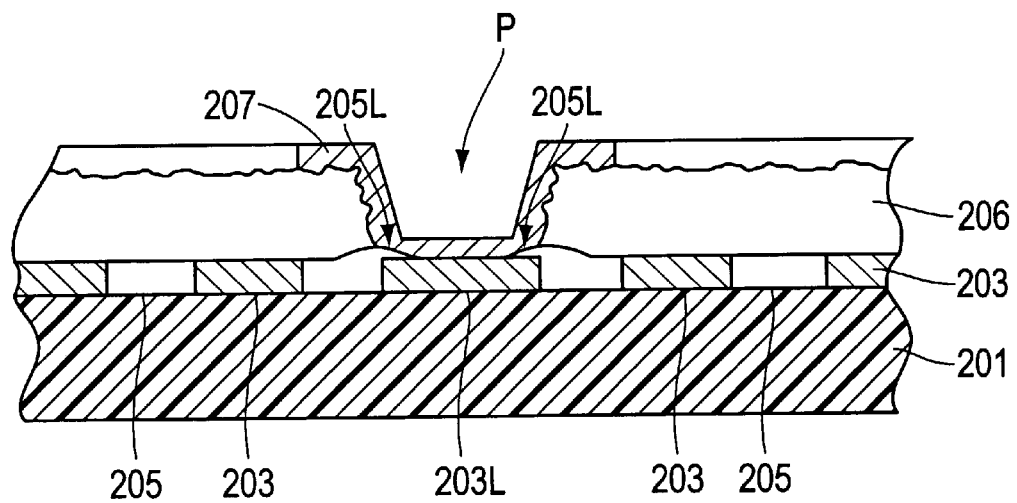
Figure 34:
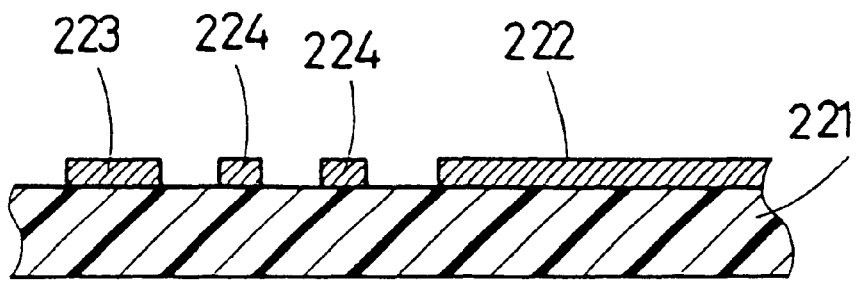
Figure 35:
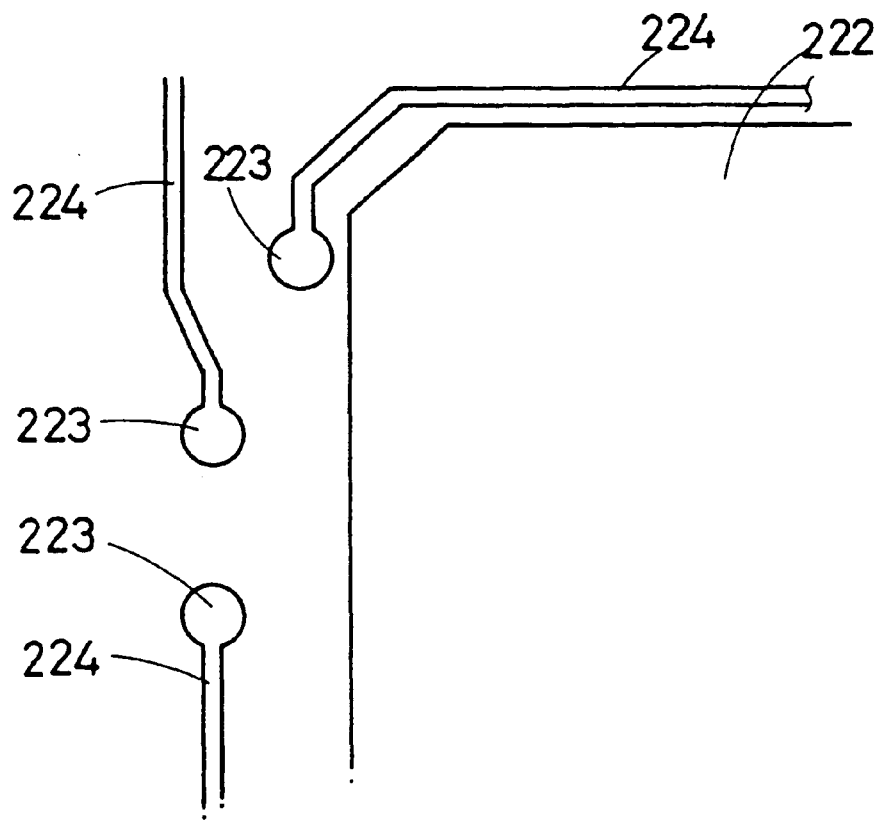
Figure 36:
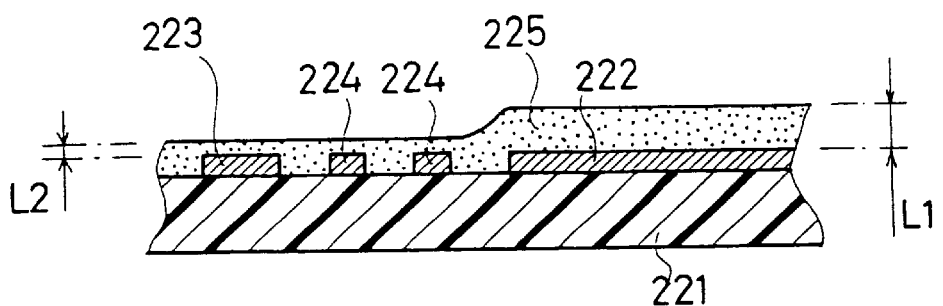
Figure 37:
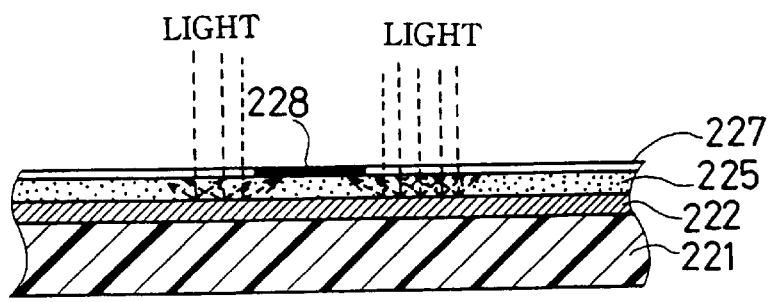
Figure 38:
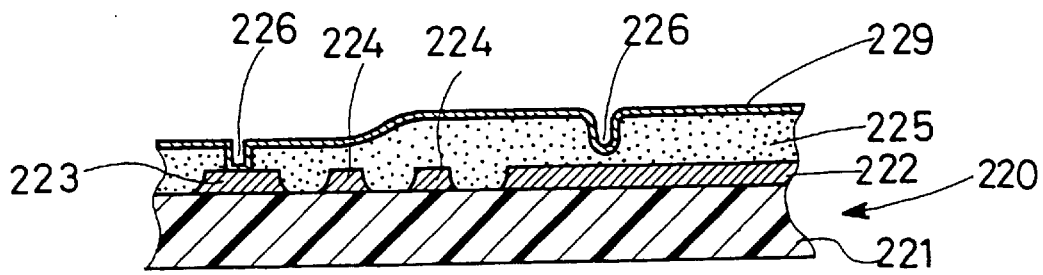

Next, a multilayer printed wiring board equivalent to an eleventh embodiment will be described referring to FIG. 27. The multilayer printed wiring board equivalent to the eleventh embodiment is basically provided with the same constitution as that of the multilayer printed wiring board 70 equivalent to the above fifth embodiment and is provided with connection structure in which a connecting pad formed on an interlayer insulating layer and a pattern on another interlayer insulating layer are connected via a via hole. FIGS. 27 show connection structure in which a connecting pad formed on an interlayer insulating layer and a pattern on another interlayer insulating layer are connected via a via hole in a multilayer printed wiring board equivalent to an eleventh embodiment, FIG. 27 (A) is a plan showing the multilayer printed wiring board and FIG. 27 (B) is a sectional view showing the multilayer printed wiring board.

As shown in FIGS. 27 (A) and (B), a printed wiring board 130 is provided with a base material 131, a connecting pad 132 constituting a part of a lower conductor circuit 132A is formed on this base material 131 and a filled resin layer 133 is provided around the connecting pad 132. An interlayer insulating layer 134 is formed on the connecting pad 132 and the filled resin layer 133 and a substantially elliptic connecting pad 137 including plural via holes 136 (three in FIG. 27) inside which a conductor layer 135 is formed in a position opposite to the connecting pad 132 in the interlayer insulating layer 134.

The elliptic connecting pad 137 constitutes a part of an intermediate conductor circuit, via holes 142 formed collectively and sharing plural lands (three in FIG. 27) constituting a part of an upper conductor circuit 144 formed on an interlayer insulating layer 140 described later are connected to one end of the ellipse in the direction of the longer axis and the other end of the ellipse in the direction of the longer axis constitutes a part of a via hole land 138 of the above via hole 136. Hereby, the connecting pad 132 on the base material 131 is connected to the connecting pad 137 via the conductor layers 135 of the plural via holes 136. The ellipse of the connecting pad 137 is formed in the shape which looks as if the opposite sides of a rectangle draw an arc outward as shown in FIG. 27 and further, it need scarcely be said that it may be formed in the shape which looks as if the opposite sides of an ellipse draw an arc outward.

A plating resist layer 139 required when each conductor layer 135 and the connecting pad 137 are formed by electroless plating is formed around the connecting pad 137 including the conductor layer 135 of each via hole 136.

Further the other interlayer insulating layer 140 is provided on the interlayer insulating layer 134, three via holes 142 inside each of which a conductor layer 141 is formed are provided in a position opposite to one end (the right end in FIGS. 27 (A) and (B)) of the connecting pad 137 in this interlayer insulating layer 140 and the upper conductor circuit 144 including a circuit pattern 143 connected to the conductor layer 141 is formed. Hereby, the connecting pad 137 on the interlayer insulating layer 134 is connected to the circuit pattern 143 via the conductor layer 141 of each via hole 142.

A plating resist layer 145 required when the conductor layer 141 and the circuit pattern 143 are formed by electroless plating is formed around the conductor layer 141 of each via hole 142 and the circuit pattern 143. The upper conductor circuit 144 is constituted by an elliptic connection 146 where the above each via hole 142 is formed and the circuit pattern 143 extending from the connection 146 as shown in FIG. 27.

As a method of manufacturing the multilayer printed wiring board 130 equivalent to the eleventh embodiment is basically the same as that of the multilayer printed wiring board 51 equivalent to the above first embodiment, the description is omitted.

In the multilayer printed wiring board 130 equivalent to the eleventh embodiment constituted as described above, in case the connecting pad 132 on the base material 131 which is formed of an insulating base material or a multilayer printed wiring board and the connecting pad 137 on the interlayer insulating layer 134 are connected and in case the connecting pad 137 and the connection 146 of the upper conductor circuit 144 on the interlayer insulating layer 140 are connected, connection is performed via the plural via holes 136 and 142 and as the plural via holes 136 and 142 share each land and are formed collectively as described above, secure connection is enabled via the residual via holes 136 and 142 even if some via holes 136 and 142 are disconnected. Hereby, the probability of the disconnection of the multilayer printed wiring board 130 can be greatly reduced. The shape of the connection 146 in the upper conductor circuit 144 may be circular or in the shape of a tear as shown in FIGS. 27 (C) and (D).

The present invention is not limited to each embodiment in the above third embodiment and it need scarcely be said that a variety of improvements and variations are allowed as long as the effect of the present invention is not deviated.

POSSIBILITY OF INDUSTRIAL UTILIZATION (1) As described above, according to a printed wiring board according to the present invention, an opening existing around a conductor pad is arranged so that it is not overlapped with the conductor pad and if a circuit pattern provided on an interlayer insulating layer formed on the printed wiring board and a conductor pad are connected, a reliable printed wiring board wherein no disconnection is caused and secure connection is enabled can be provided by substantially equalizing the quantity of resin filled in an opening around a conductor pad and that of resin filled in another opening.

(2) According to a printed wiring board and its manufacturing method according to the present invention, when a via hole is formed by exposing an interlayer insulating layer via a mask film, the thickness of an interlayer insulating layer formed on a circuit pattern including a metallic area which functions as a power plane or a ground plane can be uniformed, the resolution of exposure in an interlayer insulating layer on a connecting pad and others can be prevented from being dispersed, light scattered by the metallic area can be prevented from being incident to an interlayer insulating layer under the mask area of a mask film and a printed wiring board wherein a via hole can be formed exposing a connecting pad securely and its manufacturing method can be provided.

Filled resin 8 and a plating resist layer 8' are formed in a blank portion 6 around a conductor 7 which functions as a connecting pad for connecting a via hole in a metallic area and as they are compatible with an interlayer insulating layer, compared with metal, and interlayer insulating layer can be prevented from being delaminated.

(3) Further, according to a printed wiring board according to the present invention, a printed wiring board wherein even if misregistration is caused between a pad and a mask film when a photosensitive interlayer insulating layer on which the mask film is stuck is exposed and developed to form a via hole, the via hole and the pad can be stably connected reliably can be provided by devising the shape of a connecting pad formed on a base material or on an interlayer insulating layer.

What is claimed is:

1. A printed wiring board, comprising a conductor pattern which is formed in a mesh on one side or both sides of a base material and provided with plural openings where no conductor exists, a conductor pad provided among the openings of said conductor pattern and a filled resin layer formed by resin filled in each opening, wherein:

a surface of the filled resin layer and a surface of the conductor pad constitute a same plane, and the openings existing around the conductor pad are arranged so as not to be overlapped with said conductor pad.

2. A printed wiring board according to claim 1, wherein said conductor pad is utilized for a photovia land.

3. A printed wiring board, comprising a conductor pattern which is formed in a mesh on one side or both sides of a base material on which an adhesive layer for electroless plating is formed, the conductor pattern being provided with plural openings where no conductor exists, a conductor pad provided among the openings of said conductor pattern and a plating resist formed in each opening, wherein:

a surface of the plating resist and a surface of the conductor pad constitute a same plane, and the openings existing around the conductor pad are arranged so as not to be overlapped with said conductor pad.

4. A multilayer printed wiring board in which a photosensitive interlayer insulating layer is formed on a base material on which a metallic area which functions as a power plane or a ground plane is formed, a conductor circuit is formed on the interlayer insulating layer and the conductor circuit is connected to the metallic area via a via hole formed in the interlayer insulating layer, the multilayer printed circuit board further comprising:

a pad connected to the via hole, the pad being formed in said metallic area;

a blank portion provided around said pad to partially separate said pad from said metallic area, wherein:
said pad is electrically connected to at least one point in said metallic area.

5. A multilayer printed wiring board according to claim 4, wherein one of a filled resin layer and a plating resist layer is formed in said blank portion.

6. A method of manufacturing a multilayer printed wiring board including steps of:

forming a photosensitive interlayer insulating layer on a base material on which a metallic area which functions as a power plane or a ground plane is formed;

providing a mask film where a pattern for forming a via hole is formed on the photosensitive interlayer insulating layer;

forming the via hole in the photosensitive interlayer insulating layer by exposing through the mask film and developing;

forming a conductor circuit and a conductive layer in the via hole; and forming a pad connected to the conductive layer of the via hole in a metallic area and at least one blank portion around said pad to partially separate said pad from said metallic area, thereby
said pad is electrically connected to at least one point of said metallic area.

7. A method of manufacturing a multilayer printed wiring board according to claim 6, wherein:

the blank portion is formed by etching said metallic area around said pad, the method further comprising:
filling resin in said blank portions, and
polishing both a pad surface of the pad and a resin surface of the resin filled in the blank potion, thereby both the pad surface and the resin surface constitute a same plane.

8. A method of manufacturing a multilayer printed wiring board according to claim 6, wherein:

said metallic area and said pad are formed by electroless plating treatment after a plating resist layer is formed corresponding to the blank portion around the pad connecting to the via hole.

9. A multilayer printed wiring board in which a core material is provided with a through hole, an interlayer insulating layer is formed on the core material, a via hole with a conductive layer therein is formed in the interlayer insulating layer and the conductive layer of the via hole and the through hole are electrically connected, wherein:

the through hole and a land for said through hole are formed by a continuous conductor layer, the land for said through hole being formed in a substantially tear-like shape; and said conductive layer of the via hole is connected to the land through a narrow part of the land with the tear-like shape.

10. A multilayer printed wiring board according to claim 9, wherein:

a land for the via hole provided in said interlayer insulating layer is formed in a substantially tear-like shape; and an opening of said via hole is formed in a widened part of the land for the via hole with the tear-like shape.

11. A multilayer printed wiring board according to claim 9, wherein:

a land for the via hole provided in said interlayer insulating layer is formed in a substantially elliptic shape; and an opening of said via hole is formed at one end of the land for the via hole with the elliptic shape in a direction of a longer axis.

12. A multilayer printed wiring board according to claim 9, further comprising a pad formed on the interlayer insulating layer having a substantially tear-like shape, wherein:

a land for the via hole provided in said interlayer insulating layer is formed in a substantially tear-like shape;

an opening of said via hole is formed in a widened part of the land for the via hole with the tear-like shape; and the conductive layer of said via hole is electrically connected to the pad.

13. A multilayer printed wiring board according to claim 9, wherein a plurality of said via holes are collectively formed within a pad formed on the interlayer insulating layer.

14. A multilayer printed wiring board in which a first interlayer insulating layer is formed on a base material on which a lower conductor circuit is formed, an intermediate conductor circuit including a pad is formed on the first interlayer insulating layer, a second interlayer insulating layer is further formed on the intermediate conductor circuit, an upper conductor circuit is formed on the second interlayer insulating layer and the lower and upper conductor circuits are electrically connected to the pad through via holes provided in both the first interlayer insulating layer and the second interlayer insulating layer, wherein:

said pad is a substantially elliptic shape;

the via hole connected to the upper conductor circuit in the second interlayer insulating layer is connected to the pad at one end of the pad with the elliptic shape in a direction of a longer axis; and an opposite end of the pad constitutes a part of a land of the via hole in the first interlayer insulating layer to connect the pad to a lower conductor circuit.

15. A multilayer printed wiring board according to claim 14, wherein said elliptic shape of the pad is formed so that both sides opposite to each other in an ellipse or a rectangle draw an arc outward.

16. A multilayer printed wiring board according to claim 14, wherein:
- a land for the via hole in the second interlayer insulating layer to connect the pad to said upper conductor circuit is formed in a substantially tear-like shape; and
- an opening of said via hole in the second interlayer insulating layer is formed in a widened part of the land with the tear-like shape.

17. A multilayer printed wiring board according to claim 14, wherein:
- a land for the via hole in the second interlayer insulating layer to connect the pad to said upper conductor circuit is formed in a substantially elliptic shape; and
- an opening of said via hole in the second interlayer is formed at one end of the land with the elliptic shape in a direction of a longer axis.

18. A multilayer printed wiring board according to claim 14, wherein:
- a land for the via hole in the second interlayer insulating layer to connect the pad to said upper conductor circuit is formed in a substantially tear-like shape;
- an opening of said via hole in the second interlayer insulating layer is formed in a widened part of the land; and
- said via hole in the second interlayer insulating layer is electrically connected to the pad.

19. A multilayer printed wiring board in which a first interlayer insulating layer is formed on a base material on which a lower conductor circuit is formed, an intermediate conductor circuit is formed on the first interlayer insulating layer, a second interlayer insulating layer is further formed on the intermediate conductor circuit, an upper conductor circuit is formed on the second interlayer insulating layer, a land for a via hole connected to the lower conductor circuit and a pad connected to the upper conductor circuit are provided in the intermediate conductor circuit and the land and the pad are electrically connected, wherein:
- said pad and land are formed in a substantially tear-like shape; and
- both narrow parts in the pad and the land are mutually connected.

20. A multilayer printed wiring board in which an interlayer insulating layer is formed on a base material on which a lower conductor circuit is formed, an upper conductor circuit is formed on the interlayer insulating layer and the lower and upper conductor circuits are electrically connected through a via hole provided in the interlayer insulating layer, wherein:
- a land for said via hole is formed in a substantially tear-like shape; and
- an opening of said via hole is formed in a widened part of the land.

21. A multilayer printed wiring board in which a base material is provided with a through hole, an interlayer insulating layer is formed on the base material, a via hole is formed in the interlayer insulating layer and the via hole and the through hole are electrically connected, wherein:
- the through hole and a land for said through hole are formed by a continuous conductor layer, the land for said through hole being formed in a substantially elliptic shape.

22. A multilayer printed wiring board in which an interlayer insulating layer is formed on a base material on which a lower conductor circuit is formed, an upper conductor circuit is formed on the interlayer insulating layer and the lower and upper conductor circuits are electrically connected through a via hole provided in the interlayer insulating layer, wherein:
- said lower conductor circuit includes a pad to which the via hole is connected, and the pad is formed in a substantially tear-like shape.

23. A multilayer printed wiring board in which an interlayer insulating layer is formed on a base material on which a lower conductor circuit is formed, an upper conductor circuit is formed on the interlayer insulating layer and the lower and upper conductor circuits are electrically connected through a via hole provided in the interlayer insulating layer, wherein:
- said lower conductor circuit includes a pad to which the via hole is connected, and the pad is formed in a substantially elliptic shape.

24. A method of manufacturing a multilayer printed wiring board including steps of:
- forming a photosensitive interlayer insulating layer on a base material on which a metallic area which functions as a power plane or a ground plane is formed;
- providing a via hole in the photosensitive interlayer insulating layer by exposing through a mask film and developing;
- forming a conductor pad connected to a conductive layer of the via hole in a metallic area and at least one blank portion around said pad to partially separate said pad from said metallic area, thereby said pad is electrically connected to at least one point of said metallic area;
- filling resin in said blank portion; and
- polishing both a pad surface of the pad and a resin surface of resin filled in the blank portion, thereby both the pad surface and the resin surface constitute a same plane.

* * * * *